(12) United States Patent
Hasegawa et al.

(10) Patent No.: US 9,182,668 B2
(45) Date of Patent: Nov. 10, 2015

(54) PATTERNING PROCESS, RESIST COMPOSITION, POLYMER, AND MONOMER

(71) Applicant: SHIN-ETSU CHEMICAL CO., LTD., Tokyo (JP)

(72) Inventors: Koji Hasegawa, Joetsu (JP); Masayoshi Sagehashi, Joetsu (JP); Tomohiro Kobayashi, Joetsu (JP); Kazuhiro Katayama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/212,948

(22) Filed: Mar. 14, 2014

(65) Prior Publication Data

US 2014/0308614 A1    Oct. 16, 2014

(30) Foreign Application Priority Data

Apr. 10, 2013    (JP) .................................. 2013-081847

(51) Int. Cl.
| | | |
|---|---|---|
| *G03F 7/32* | (2006.01) | |
| *G03F 7/038* | (2006.01) | |
| *G03F 7/004* | (2006.01) | |
| *G03F 7/40* | (2006.01) | |
| *G03F 7/039* | (2006.01) | |
| *C08F 220/24* | (2006.01) | |

(52) U.S. Cl.
CPC .............. *G03F 7/038* (2013.01); *C08F 220/24* (2013.01); *G03F 7/0045* (2013.01); *G03F 7/0392* (2013.01); *G03F 7/40* (2013.01)

(58) Field of Classification Search
CPC ........... G03F 7/0045; G03F 7/40; G03F 7/18; G03F 7/0392; C03F 220/24; G03C 5/305
USPC ........ 430/270.1, 913, 322, 396, 435; 526/243
See application file for complete search history.

(56) References Cited

U.S. PATENT DOCUMENTS

| | | | |
|---|---|---|---|
| 6,136,500 A | 10/2000 | Kobayashi et al. | |
| 6,451,499 B1 * | 9/2002 | Jayaraman et al. | ........ 430/270.1 |
| 7,537,880 B2 | 5/2009 | Harada et al. | |
| 7,771,913 B2 | 8/2010 | Kaneko et al. | |
| 7,998,655 B2 | 8/2011 | Tsubaki | |
| 8,034,547 B2 | 10/2011 | Tsubaki et al. | |
| 8,071,272 B2 | 12/2011 | Tsubaki | |
| 8,088,557 B2 | 1/2012 | Tsubaki | |
| 8,114,571 B2 | 2/2012 | Ohashi et al. | |
| 8,173,354 B2 | 5/2012 | Ohsawa et al. | |
| 8,227,183 B2 | 7/2012 | Tsubaki et al. | |
| 8,241,840 B2 | 8/2012 | Tsubaki et al. | |
| 8,323,872 B2 | 12/2012 | Hatakeyama et al. | |
| 8,614,050 B2 * | 12/2013 | Bae et al. | ................... 430/270.1 |
| 8,765,354 B2 * | 7/2014 | Utsumi et al. | ............. 430/270.1 |
| 2003/0045731 A1 * | 3/2003 | Nakashima et al. | .......... 549/444 |
| 2008/0090172 A1 | 4/2008 | Hatakeyama et al. | |
| 2008/0153030 A1 | 6/2008 | Kobayashi et al. | |
| 2009/0269696 A1 * | 10/2009 | Ohsawa et al. | ............. 430/270.1 |
| 2010/0136339 A1 * | 6/2010 | Kooistra et al. | ............. 428/402 |
| 2010/0311795 A1 * | 12/2010 | Pingali et al. | ................. 514/336 |
| 2010/0331440 A1 * | 12/2010 | Maruyama et al. | ........... 522/108 |
| 2011/0177462 A1 | 7/2011 | Hatakeyama et al. | |
| 2011/0189607 A1 * | 8/2011 | Ohashi et al. | ............. 430/270.1 |
| 2011/0311914 A1 * | 12/2011 | Kamimura et al. | ........ 430/270.1 |
| 2012/0129103 A1 * | 5/2012 | Ohsawa et al. | ............. 430/285.1 |
| 2012/0148945 A1 | 6/2012 | Hasegawa et al. | |
| 2012/0270154 A1 * | 10/2012 | Masuyama et al. | ........ 430/285.1 |
| 2013/0101812 A1 * | 4/2013 | Kamimura et al. | ........ 428/195.1 |
| 2014/0093826 A1 * | 4/2014 | Minegishi et al. | ............ 430/325 |
| 2014/0113223 A1 * | 4/2014 | Kato et al. | ....................... 430/15 |
| 2014/0234761 A1 * | 8/2014 | Shirakawa et al. | ............ 430/15 |

FOREIGN PATENT DOCUMENTS

| | | | | |
|---|---|---|---|---|
| JP | 3790649 B2 | | 6/2006 | |
| JP | 2007-25634 A | | 2/2007 | |
| JP | 3991462 B2 | | 10/2007 | |
| JP | 2007-297590 A | | 11/2007 | |
| JP | 2007-316448 A | | 12/2007 | |
| JP | 2008-3569 A | | 1/2008 | |
| JP | 2008-111103 A | | 5/2008 | |
| JP | 2008-122932 A | | 5/2008 | |
| JP | 2008-158339 A | | 7/2008 | |
| JP | 2008257166 A | * | 10/2008 | |
| JP | 2008-281974 A | | 11/2008 | |
| JP | 2008-281975 A | | 11/2008 | |
| JP | 2008-281980 A | | 11/2008 | |
| JP | 2008-309878 A | | 12/2008 | |
| JP | 2008-309879 A | | 12/2008 | |
| JP | 2009019199 A | * | 1/2009 | |
| JP | 2009-269953 A | | 11/2009 | |
| JP | 4554665 B2 | | 9/2010 | |
| JP | 2010204187 A | * | 9/2010 | |

ORGANIC SOLVENT DEVELOPMENT

| JP | 2011-16746 A | 1/2011 |
| JP | 2011-170316 A | 9/2011 |
| JP | 2012-128067 A | 7/2012 |

OTHER PUBLICATIONS

Garcia et al, "Radical Polymerization of Isomeric Methacrylic Monomer: cis- and trans-(-2-Phenyl-1,3-dioxan-5-yl) Methacrylate", Macromoleculesvol. 35, No. 8, pp. 2926-2933(2002).*
Machine translation of JP 2008-257166 (no date).*
Nakamura et al., "Contact Hole Formulation by Multiple Exposure Technique in Ultra-low k1 Lithography", Proceedings of SPIE et al., 2004, pp. 255-263, SPIE vol. 5377.
Owe-Tang et al., "Double exposure for the contact layer of the 65-nm node", Proceedings of SPIE et al., 2005, pp. 171-180, SPIE vol. 5753.
Enders et al., "Preparation and Reactions of 2,2-Dimethyl-1,3-dioxan-5-one-SAMP-Hydrazone: A Versatile Chiral Dihydroxyacetone Equivalent", Synthesis 2002, No. 12, pp. 1775-1779.

* cited by examiner

*Primary Examiner* — Amanda C Walke
(74) *Attorney, Agent, or Firm* — Westerman, Hattori, Daniels & Adrian, LLP

(57) ABSTRACT

A negative pattern is formed by applying a resist composition onto a substrate, prebaking, exposing to high-energy radiation, PEB, and developing the exposed resist film in an organic solvent developer to dissolve the unexposed region of resist film. The resist composition is based on a polymer comprising recurring units (a1) of formula (1) wherein $R^1$ is H or $CH_3$, $R^2$ and $R^3$ are H, F or a monovalent hydrocarbon group, $R^4$ is H or a monovalent hydrocarbon group, $R^5$ and $R^6$ are a monovalent hydrocarbon group, $X^1$ is a divalent hydrocarbon group, and $k^1=0$ or 1. A fine hole or trench pattern can be formed therefrom.

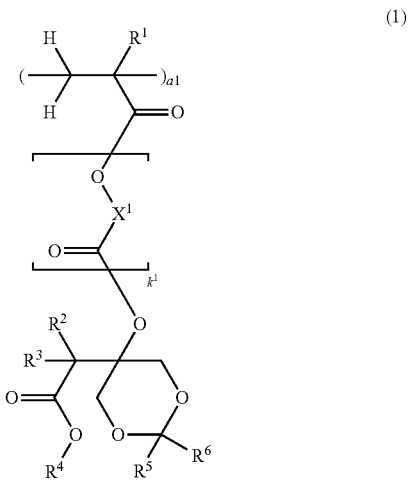

13 Claims, 1 Drawing Sheet

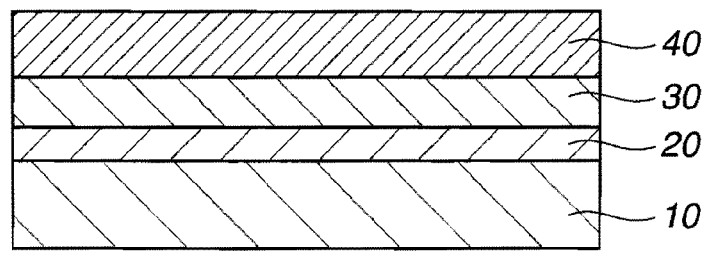
FIG.1A PHOTORESIST COATING
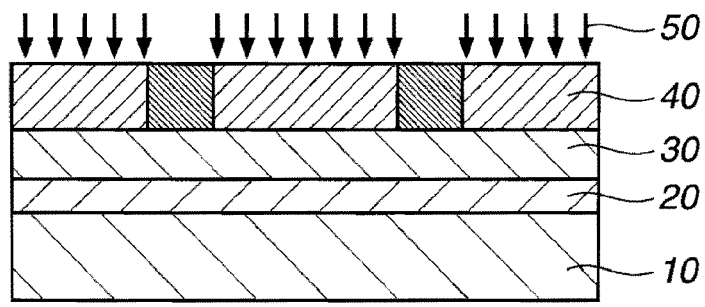
FIG.1B PHOTORESIST EXPOSURE
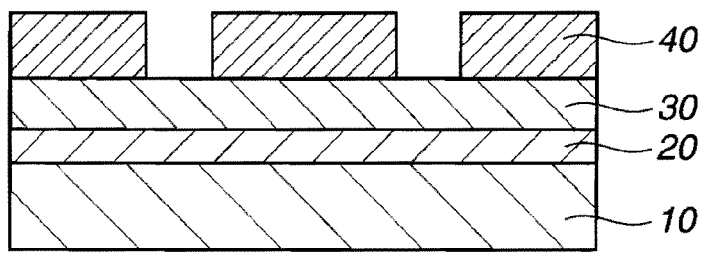
FIG.1C ORGANIC SOLVENT DEVELOPMENT

PATTERNING PROCESS, RESIST COMPOSITION, POLYMER, AND MONOMER

CROSS-REFERENCE TO RELATED APPLICATION

This non-provisional application claims priority under 35 U.S.C. §119(a) on Patent Application No. 2013-081847 filed in Japan on Apr. 10, 2013, the entire contents of which are hereby incorporated by reference.

TECHNICAL FIELD

This invention relates to a radiation-sensitive chemically amplified resist composition which is advantageously used in the micropatterning lithography using a variety of radiations including deep-UV, typically KrF and ArF excimer lasers, extreme ultraviolet (EUV), x-ray, typically synchrotron radiation, and charged particle beam, typically electron beam, and a pattern forming process using the same. More particularly, it relates to a pattern forming process involving exposure of resist film, modification of base resin by chemical reaction with the aid of acid and heat, and development in an organic solvent to form a negative tone pattern in which the unexposed region is dissolved and the exposed region is not dissolved; a resist composition for use in the process; a polymer; and a monomer.

BACKGROUND ART

In the lithography technology, a highlight is recently put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkaline development and organic solvent development is under study.

As the ArF resist composition for negative tone development with organic solvent, positive ArF resist compositions of the prior art design may be used. Such pattern forming processes are described in Patent Documents 1 to 3. These patent documents disclose resist compositions for organic solvent development comprising a copolymer of hydroxyadamantane methacrylate, a copolymer of norbornane lactone methacrylate, and a copolymer of methacrylate having acidic groups including carboxyl, sulfo, phenol and thiol groups substituted with two or more acid labile groups, and pattern forming processes using the same.

Further, Patent Document 4 discloses a process for forming a pattern through organic solvent development in which a protective film is applied onto a resist film. Patent Document 5 discloses a topcoatless process for forming a pattern through organic solvent development in which an additive is added to a resist composition so that the additive may segregate at the resist film surface after spin coating to provide the surface with improved water repellency.

Citation List
Patent Document 1: JP-A 2008-281974
Patent Document 2: JP-A 2008-281975
Patent Document 3: JP 4554665
Patent Document 4: JP-A 2008-309878
Patent Document 5: JP-A 2008-309879

DISCLOSURE OF INVENTION

As compared with the positive resist system which becomes dissolvable in alkaline developer as a result of acidic carboxyl or analogous groups generating through deprotection reaction, the organic solvent development provides a low dissolution contrast. The alkaline developer provides an alkaline dissolution rate that differs by a factor of 1,000 or more between the unexposed and exposed regions whereas the organic solvent development provides a dissolution rate difference of only about 10 times. While Patent Documents 1 to 5 describe conventional photoresist compositions of the alkaline aqueous solution development type, there is a demand for a novel material which can offer a significant dissolution contrast upon organic solvent development. That is, a strong demand exists for a material capable of providing the unexposed region of promoted dissolution and the exposed region of retarded dissolution in an organic solvent developer.

An object of the invention is to provide a pattern forming process involving organic solvent development for forming a negative tone pattern having a significant dissolution contrast between the unexposed region of promoted dissolution and the exposed region of retarded dissolution. Another object is to provide a resist composition for use in the process; a polymer; and a monomer.

The inventors have found that the dissolution contrast during organic solvent development is improved using a polymer adapted to form a lactone ring under the action of an acid so that the polymer may reduce its solubility in an organic solvent.

In one aspect, the invention provides a pattern forming process comprising the steps of applying a resist composition comprising a polymer adapted to form a lactone ring under the action of an acid so that the polymer may reduce its solubility in an organic solvent, and an optional acid generator onto a substrate, prebaking the composition to form a resist film, exposing the resist film to high-energy radiation, baking, and developing the exposed film in an organic solvent-based developer to form a negative pattern wherein the unexposed region of resist film is dissolved away and the exposed region of resist film is not dissolved. The polymer comprises recurring units (a1) of the general formula (1).

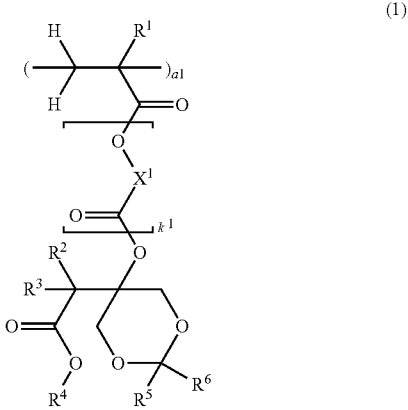

Herein $R^1$ is hydrogen or methyl, $R^2$ and $R^3$ are each independently hydrogen, fluorine or a straight, branched or cyclic monovalent hydrocarbon group of 1 to 8 carbon atoms, $R^4$ is hydrogen or a straight, branched or cyclic monovalent hydrocarbon group of 1 to 20 carbon atoms in which a constituent —$CH_2$— may be substituted by —O— or —C(=O)—, $R^5$ and $R^6$ are each independently hydrogen or a straight, branched or cyclic monovalent hydrocarbon group of 1 to 8 carbon atoms, $R^5$ and $R^6$ may bond together to form a non-aromatic ring of 3 to 17 carbon atoms with the carbon atom to which they are attached, $X^1$ is a straight, branched or cyclic divalent hydrocarbon group of 1 to 20 carbon atoms in which a constituent —CH$_2$— may be substituted by —O— or —C(=O)—, and $k^1$ is 0 or 1.

In a preferred embodiment, the polymer further comprises recurring units (a2) of the general formula (2) and recurring units of at least one type selected from recurring units (b1) to (b4) represented by the general formula (3).

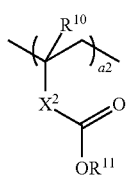

(2)

Herein $R^{10}$ is hydrogen or methyl, $R^{11}$ is an acid labile group, $X^2$ is a single bond, phenylene, naphthylene, or —C(=O)—O—$R^{12}$—, $R^{12}$ is a straight, branched or cyclic $C_1$-$C_{10}$ alkylene group which may have an ether moiety, ester moiety, lactone ring or hydroxyl moiety, or phenylene or naphthylene group, and $0 \leq a2 < 1.0$.

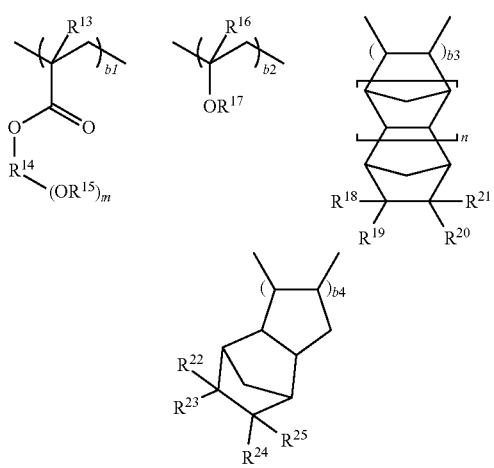

(3)

Herein $R^{13}$ and $R^{16}$ each are hydrogen or methyl, $R^{14}$ is a straight, branched or cyclic, di- to pentavalent aliphatic hydrocarbon group of 1 to 16 carbon atoms which may have an ether or ester moiety, $R^{15}$ and $R^{17}$ each are an acid labile group, $R^{18}$ to $R^{21}$ and $R^{22}$ to $R^{25}$ are each independently hydrogen, cyano, a straight, branched or cyclic $C_1$-$C_6$ alkyl group, alkoxycarbonyl, or a group having an ether moiety or lactone ring, at least one of $R^{18}$ to $R^{21}$ and $R^{22}$ to $R^{25}$ has a hydroxyl group substituted with an acid labile group, m is an integer of 1 to 4, n is 0 or 1, b1, b2, b3 and b4 are numbers in the range: $0 \leq b1 < 1.0$, $0 \leq b2 < 1.0$, $0 \leq b3 < 1.0$, $0 \leq b4 < 1.0$, $0 \leq b1+b2+b3+b4 < 1.0$, and $0 < a2+b1+b2+b3+b4 < 1.0$.

In a preferred embodiment, the polymer further comprises recurring units (c) derived from a monomer having an adhesive group selected from the group consisting of hydroxyl other than formulae (1) and (3), cyano, carbonyl, ester, ether, lactone ring, carboxyl, carboxylic anhydride, sulfonic acid ester, disulfone, and carbonate.

In a preferred embodiment, the polymer further comprises recurring units (d1), (d2) or (d3) represented by the following general formula.

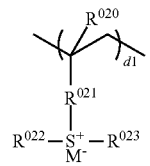

(d1)

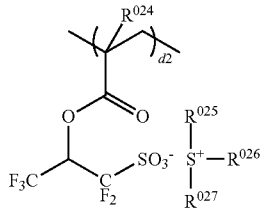

(d2)

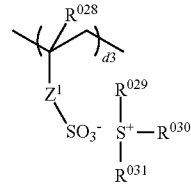

(d3)

Herein $R^{020}$, $R^{024}$, and $R^{028}$ each are hydrogen or methyl; $R^{021}$ is a single bond, phenylene, —O—$R^{033}$—, or —C(=O)—Y—$R^{033}$—, wherein Y is oxygen or NH and $R^{033}$ is a straight, branched or cyclic $C_1$-$C_6$ alkylene group, alkenylene group or phenylene group, which may contain a carbonyl (—CO—), ester (—COO—), ether (—O—), or hydroxyl moiety; $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group; $Z^1$ is a single bond, methylene, ethylene, phenylene, fluorinated phenylene, —O—$R^{032}$—, or —C(=O)—$Z^2$—$R^{032}$—, wherein $Z^2$ is oxygen or NH and $R^{032}$ is a straight, branched or cyclic $C_1$-$C_6$ alkylene group, alkenylene group or phenylene group, which may contain a carbonyl, ester, ether or hydroxyl moiety; $M^-$ is a non-nucleophilic counter ion; $0 \leq d1 \leq 0.3$, $0 \leq d2 \leq 0.3$, $0 \leq d3 \leq 0.3$, $0 < d1+d2+d3 \leq 0.3$.

In a preferred embodiment, the developer comprises at least one organic solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

In a preferred embodiment, the step of exposing the resist film to high-energy radiation includes KrF excimer laser lithography of 248 nm wavelength, ArF excimer laser lithography of 193 nm wavelength, EUV lithography of 13.5 nm wavelength or EB lithography.

In a further preferred embodiment, the process is modified as comprising the steps of applying a resist composition comprising a polymer comprising recurring units of formula (1), an optional acid generator, and an organic solvent onto a substrate, prebaking the composition to form a resist film, forming a protective film thereon, exposing the resist film to high-energy radiation, baking, and developing the exposed film in an organic solvent-based developer to form a negative pattern wherein the unexposed region of resist film and the protective film are dissolved away and the exposed region of resist film is not dissolved.

In a second aspect, the invention provides a negative pattern-forming resist composition comprising a polymer, an optional acid generator, and an organic solvent, the polymer comprising recurring units (a1) of the general formula (1) and being dissolvable in a developer selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate. In a preferred embodiment, the polymer further comprises recurring units (a2) of the general formula (2) and recurring units of at least one type selected from recurring units (b1) to (b4) represented by the general formula (3).

In a preferred embodiment, the polymer further comprises recurring units (c) derived from a monomer having an adhesive group selected from the group consisting of hydroxyl other than formulae (1) and (3), cyano, carbonyl, ester, ether, lactone ring, carboxyl, carboxylic anhydride, sulfonic acid ester, disulfone, and carbonate.

In a preferred embodiment, the polymer further comprises recurring units (d1), (d2) or (d3) as defined above.

In a third aspect, the invention provides a polymer comprising recurring units (a1) of the general formula (1) and having a weight average molecular weight of 1,000 to 100,000.

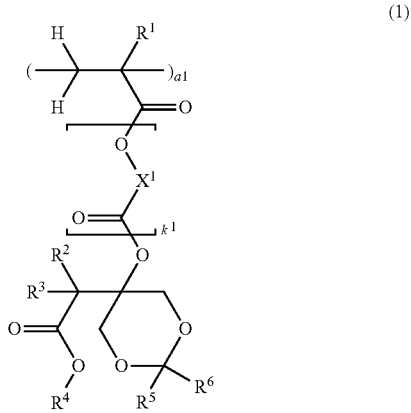

(1)

Herein $R^1$ is hydrogen or methyl, $R^2$ and $R^3$ are each independently hydrogen, fluorine or a straight, branched or cyclic monovalent hydrocarbon group of 1 to 8 carbon atoms, $R^4$ is hydrogen or a straight, branched or cyclic monovalent hydrocarbon group of 1 to 20 carbon atoms in which a constituent —$CH_2$— may be substituted by —O— or —C(=O)—, $R^5$ and $R^6$ are each independently hydrogen or a straight, branched or cyclic monovalent hydrocarbon group of 1 to 8 carbon atoms, $R^5$ and $R^6$ may bond together to form a non-aromatic ring of 3 to 17 carbon atoms with the carbon atom to which they are attached, $X^1$ is a straight, branched or cyclic divalent hydrocarbon group of 1 to 20 carbon atoms in which a constituent —$CH_2$— may be substituted by —O— or —C(=O)—, and $k^1$ is 0 or 1.

In a fourth aspect, the invention provides a monomer having the general formula (1a).

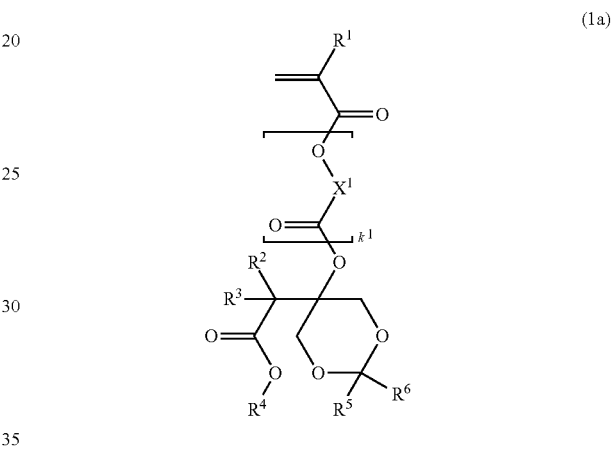

(1a)

Herein $R^1$ to $R^6$, $X^1$, and $k^1$ are as defined above.

Advantageous Effects of Invention

In a lithography process involving exposure, PEB and organic solvent development, a resist composition comprising a polymer adapted to form a lactone ring under the action of an acid displays a high dissolution contrast. A fine hole or trench pattern can be formed at a high degree of size control and a high sensitivity.

BRIEF DESCRIPTION OF DRAWINGS

FIGS. 1A to 1C are cross-sectional views of a patterning process according one embodiment of the invention; FIG. 1A shows a photoresist film disposed on a substrate, FIG. 1B shows the resist film being exposed, and FIG. 1C shows the resist film being developed in an organic solvent.

DESCRIPTION OF EMBODIMENTS

The terms "a" and "an" herein do not denote a limitation of quantity, but rather denote the presence of at least one of the referenced item. As used herein, the notation ($C_n$-$C_m$) means a group containing from n to m carbon atoms per group. As used herein, the term "film" is used interchangeably with "coating" or "layer." In chemical formulae, the broken line denotes a valence bond.

The abbreviations and acronyms have the following meaning.

Mw: weight average molecular weight
Mn: number average molecular weight

Mw/Mn: molecular weight distribution or dispersity
GPC: gel permeation chromatography
PEB: post-exposure bake
PAG: photoacid generator
Me: methyl Briefly stated, the invention pertains to a pattern forming process comprising the steps of applying a resist composition comprising a polymer adapted to form a lactone ring under the action of an acid so that the polymer may reduce its solubility in an organic solvent, an optional acid generator and an organic solvent onto a substrate, prebaking to form a resist film, exposing to high-energy radiation for letting the acid generator (or acid-generating recurring unit) generate an acid and the polymer form a lactone ring, for thereby reducing the solubility of the exposed region in an organic solvent-based developer, PEB, and developing in an organic solvent-based developer to form a negative pattern. The invention also pertains to a resist composition, a polymer, and a monomer.

It is generally known that lactone ring-containing polymers are less soluble in organic solvents. The polymer used in the pattern forming process of the invention is designed such that, under the action of the generated acid, it may form a lactone ring selectively in the exposed region and thus reduce its solubility in organic solvents. This ensures that the film remains as a pattern. A change of lactone content before and after exposure brings about a substantial difference in dissolution rate, achieving a high dissolution contrast upon organic solvent development.

Great efforts are currently made to apply organic solvent development to ArF resist compositions. In these ArF resist compositions, lactone units are incorporated into the base resin in as large a proportion as 30 to 60 mol % in order to ensure the adhesion of pattern to substrate. This restricts the solubility of the base resin itself in organic solvents and makes it essentially difficult to provide the unexposed region with the desired high dissolution rate. By contrast, the polymer used in the pattern forming process of the invention is characterized in that a lactone ring is newly formed in the exposed region where the film is to be left as pattern and contributes to substrate adhesion. This enables to reduce the amount of lactone initially introduced into the base resin and is effective in enhancing the dissolution rate of the base resin in the unexposed region.

The recurring unit adapted to form a lactone ring under the action of an acid so that its solubility in an organic solvent may lower is a recurring unit (a1) having the general formula (1).

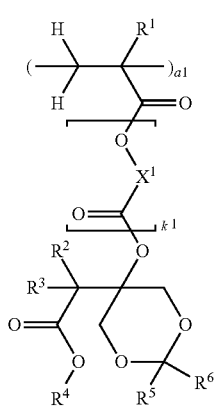

(1)

Herein $R^1$ is hydrogen or methyl. $R^2$ and $R^3$ are each independently hydrogen, fluorine or a straight, branched or cyclic monovalent hydrocarbon group of 1 to 8 carbon atoms. $R^4$ is hydrogen or a straight, branched or cyclic monovalent hydrocarbon group of 1 to 20 carbon atoms in which a constituent —$CH_2$— may be substituted by —O— or —C(=O)—. $R^5$ and $R^6$ are each independently hydrogen or a straight, branched or cyclic monovalent hydrocarbon group of 1 to 8 carbon atoms, $R^5$ and $R^6$ may bond together to form a non-aromatic ring of 3 to 17 carbon atoms with the carbon atom to which they are attached. $X^1$ is a straight, branched or cyclic divalent hydrocarbon group of 1 to 20 carbon atoms in which a constituent —$CH_2$— may be substituted by —O— or —C(=O)—, and $k^1$ is 0 or 1.

It is presumed that the recurring unit (a1) having formula (1) forms a lactone ring under the action of an acid according to the following scheme wherein $R^1$ to $R^6$, $X^1$, and $k^1$ are as defined above.

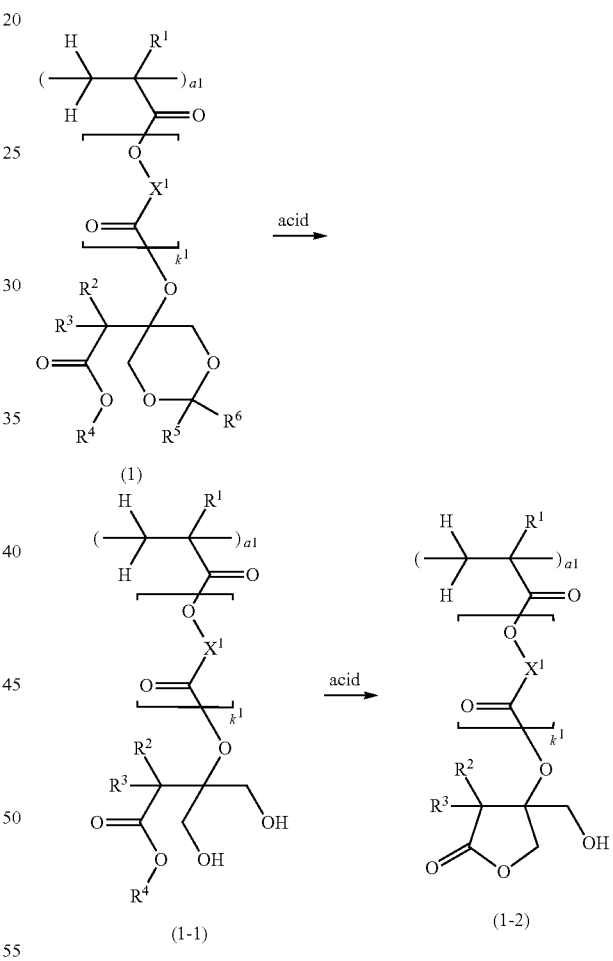

In formula (1), exemplary monovalent hydrocarbon groups represented by $R^2$, $R^3$, $R^5$ and $R^6$ include methyl, ethyl, propyl, isopropyl, n-butyl, sec-butyl, tert-butyl, cyclopentyl, cyclohexyl, 2-ethylhexyl, n-octyl, and norbornyl.

In formula (1), $R^5$ and $R^6$ may bond together to form a non-aromatic ring of 3 to 17 carbon atoms with the carbon atom to which they are attached. Exemplary rings include cyclopropane, cyclobutane, cyclopentane, cyclohexane, cycloheptane, cyclooctane, methylcyclohexane, dimethylcyclohexane, trimethylcyclohexane, norbornane, tricyclodecane, and adamantane.

In formula (1), suitable monovalent hydrocarbon groups represented by $R^4$ include those exemplified for the monovalent hydrocarbon groups represented by $R^2$, $R^3$, $R^5$ and $R^6$ as well as groups of the general formulae (R1-1) and (R1-2), tertiary alkyl groups of 4 to 15 carbon atoms, trialkylsilyl groups in which each alkyl moiety has 1 to 5 carbon atoms, oxoalkyl groups of 4 to 15 carbon atoms, and acyl groups of 1 to 10 carbon atoms.

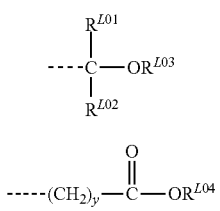

(R1-1)

(R1-2)

In these formulae, the broken line denotes a valence bond. In formula (R1-1), $R^{L01}$ and $R^{L02}$ each are hydrogen or a straight, branched or cyclic alkyl group of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Suitable straight, branched or cyclic alkyl groups are as exemplified for $R^{L01}$ and $R^{L02}$, and suitable substituted alkyl groups are shown below.

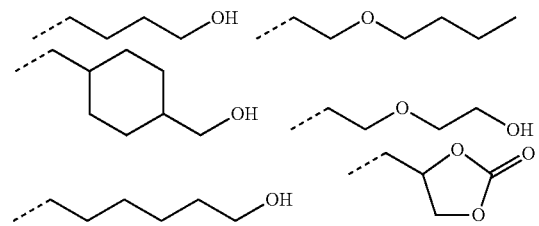

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (R1-2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (R1-1).

Exemplary tertiary alkyl groups represented by $R^{L04}$ are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Exemplary acyl groups include formyl, acetyl, ethylcarbonyl, pivaloyl, methoxycarbonyl, ethoxycarbonyl, tert-butoxycarbonyl, trifluoroacetyl, and trichloroacetyl. Letter y is an integer of 0 to 6.

Of the protective groups having formula (R1-1), the straight or branched groups are exemplified by the following.

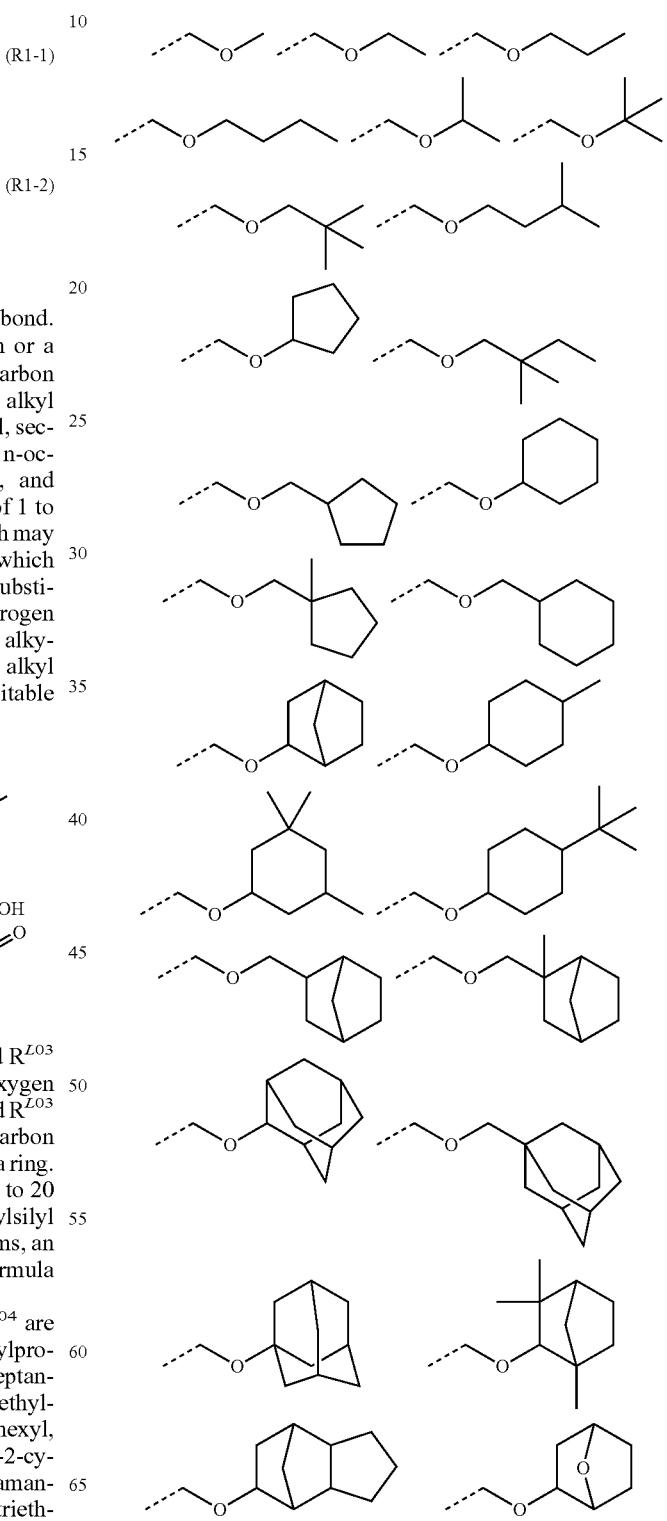

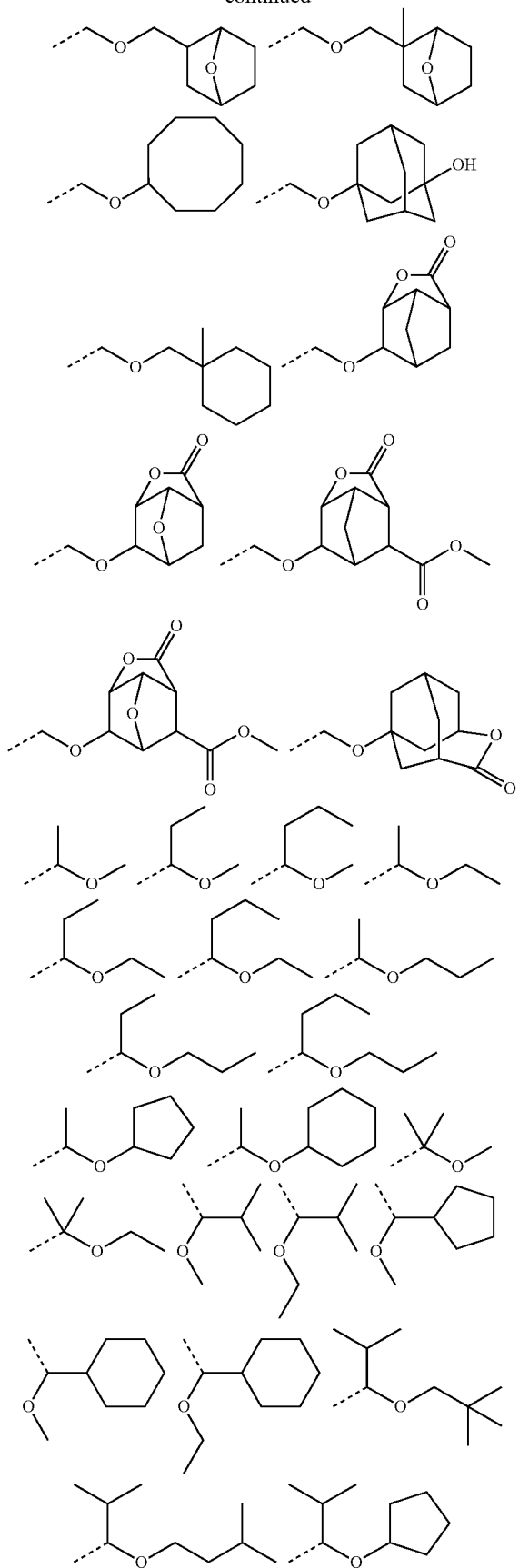
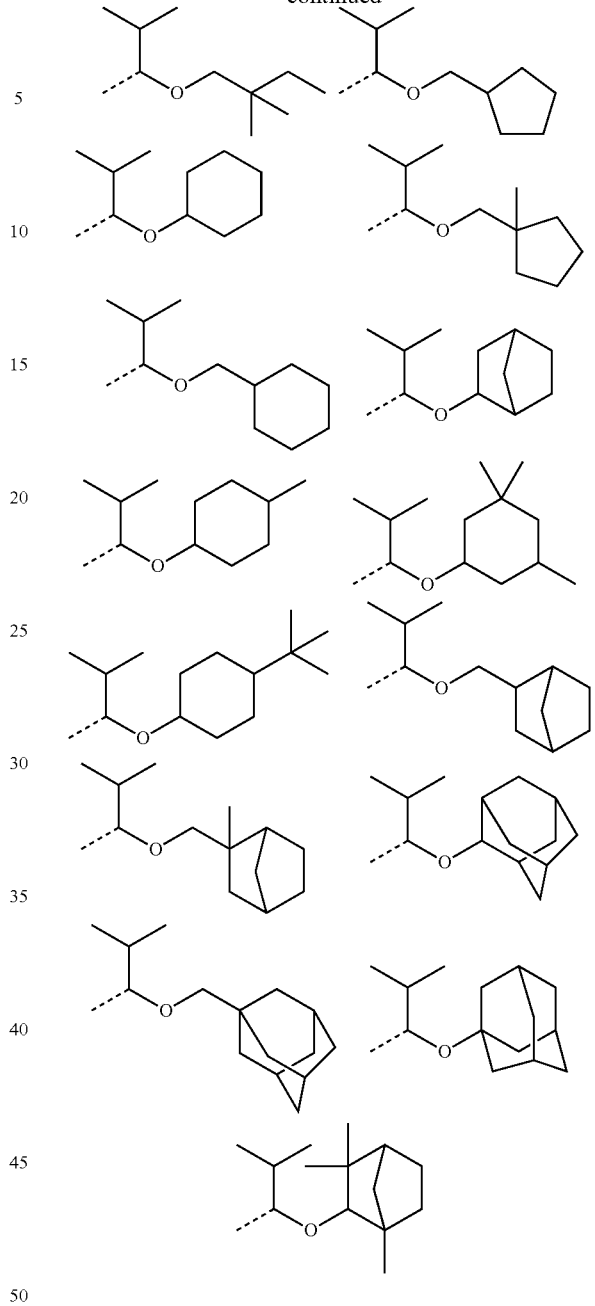

Of the protective groups of formula (R1-1), the cyclic ones are, for example, tetrahydrofuran-2-yl, 2-methyltetrahydrofuran-2-yl, tetrahydropyran-2-yl, and 2-methyltetrahydropyran-2-yl.

Examples of the protective groups of formula (R1-2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethyl cyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the divalent hydrocarbon group $X^1$ in formula (1) are given below.

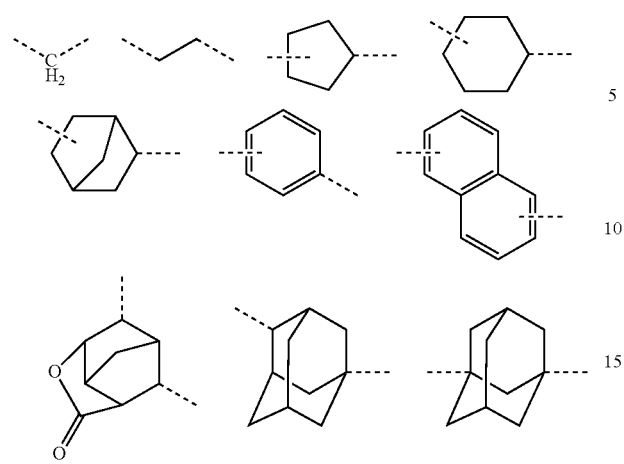
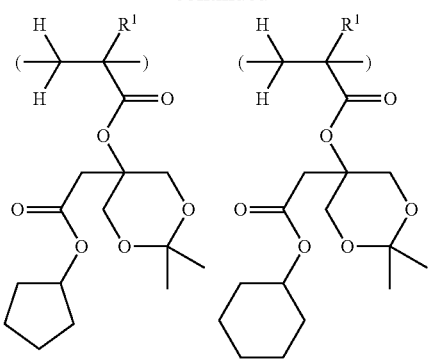
Examples of the recurring unit having formula (1) are shown below wherein $R^1$ is H or $CH_3$.
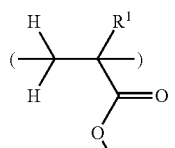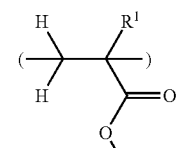
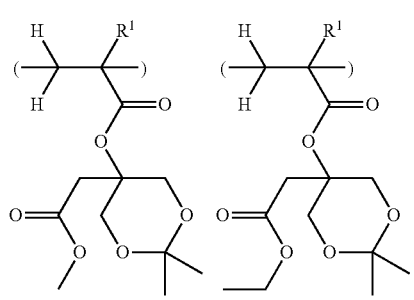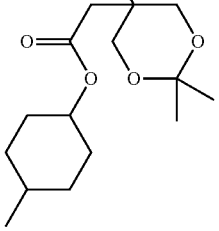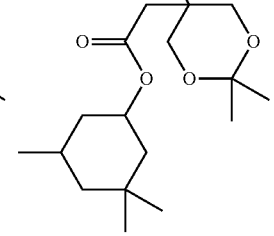
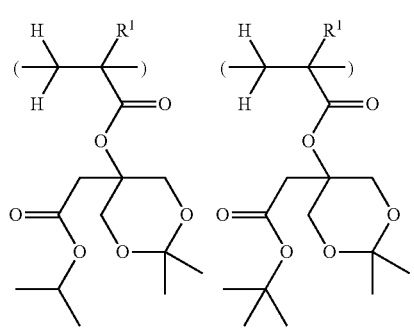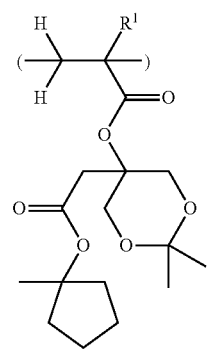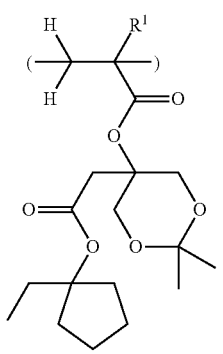
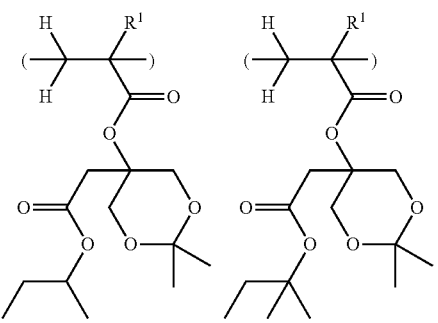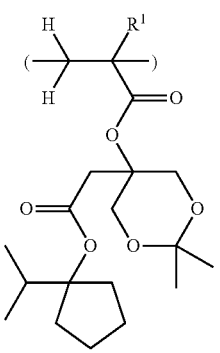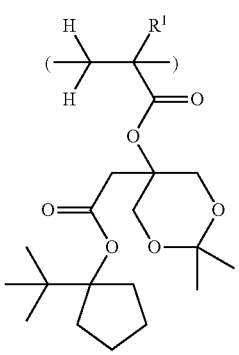

-continued
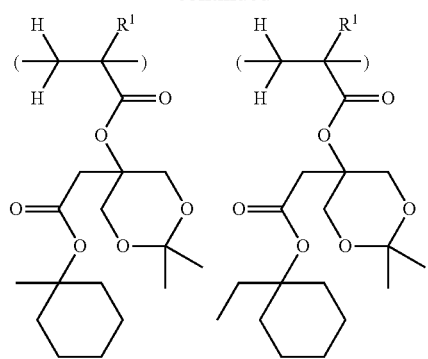
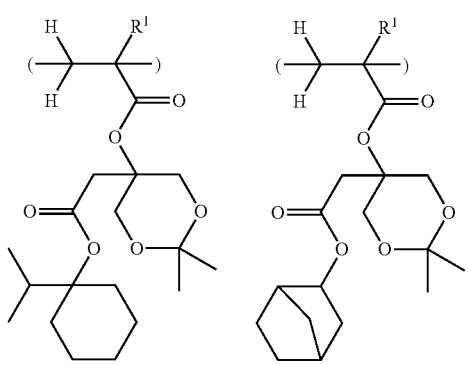
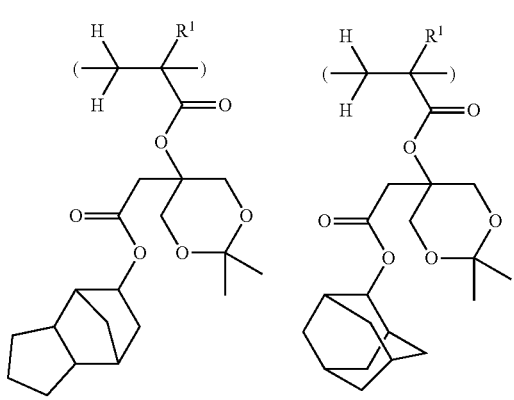
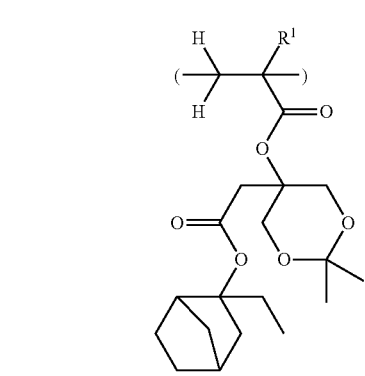
-continued
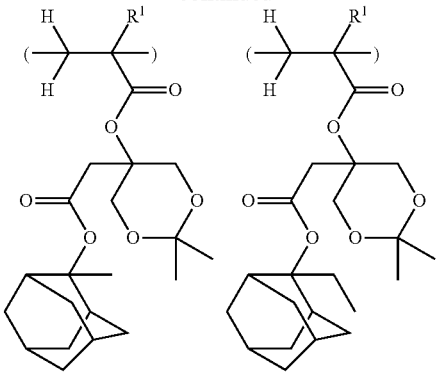
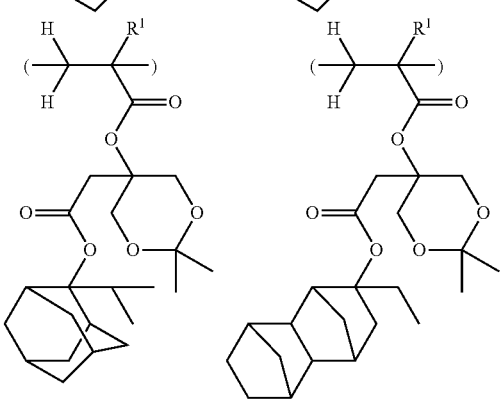
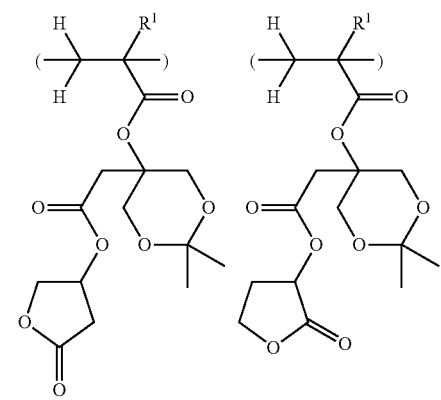
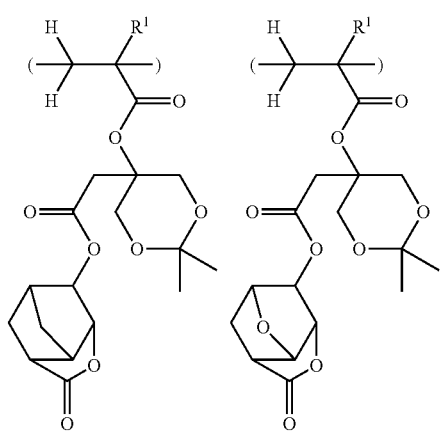

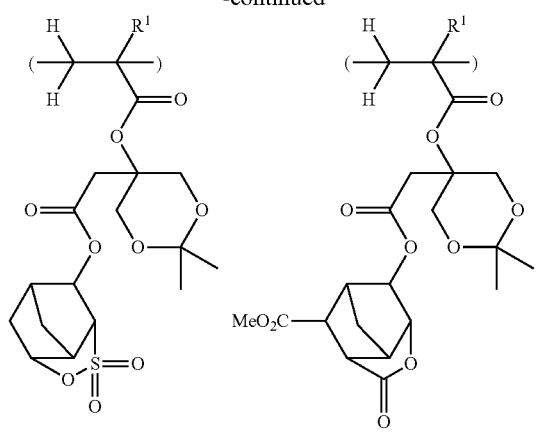
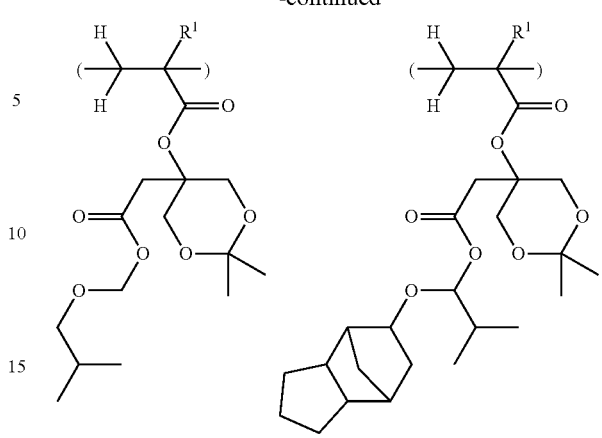
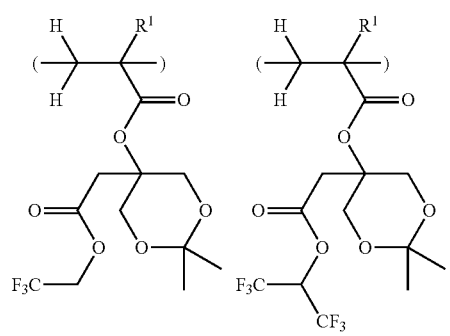
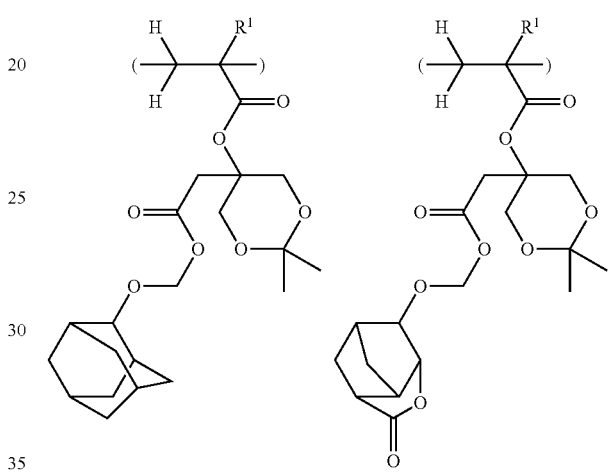
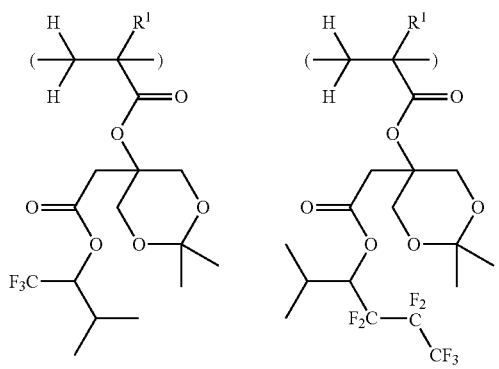
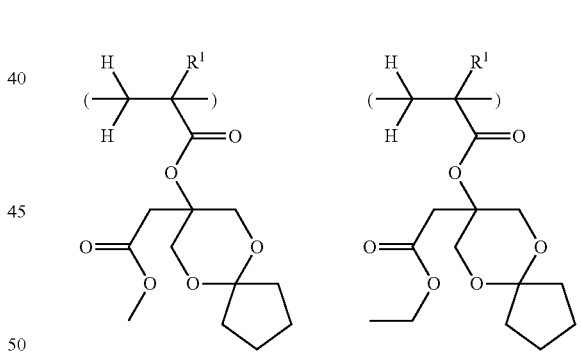
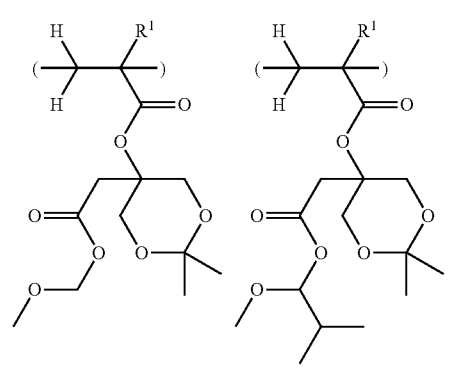
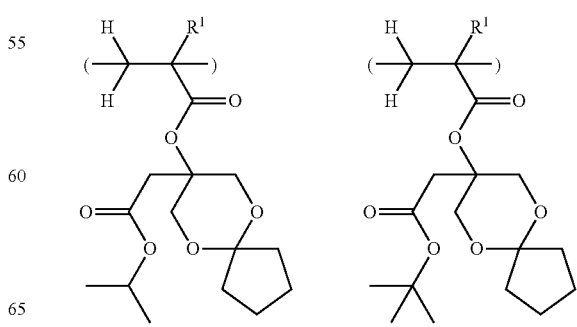

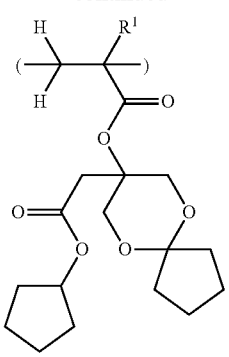
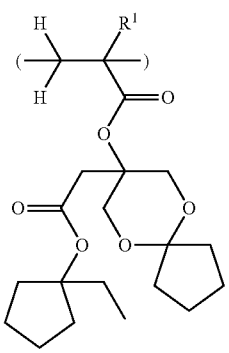
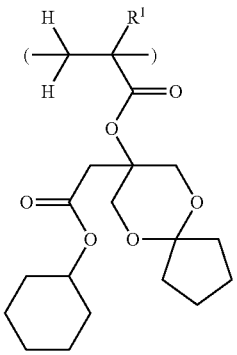
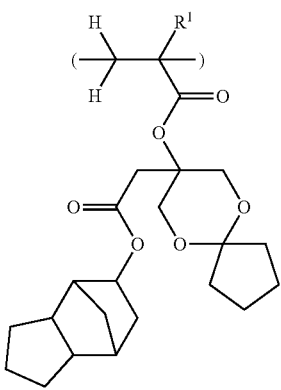
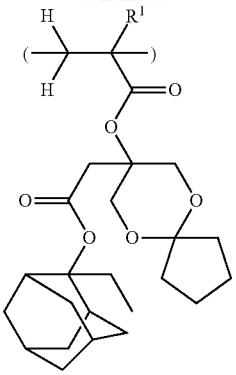
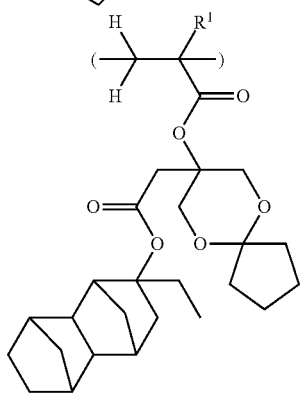
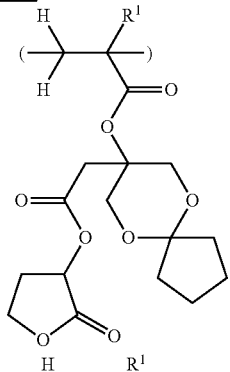
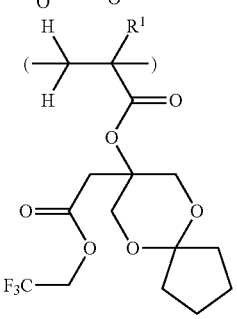

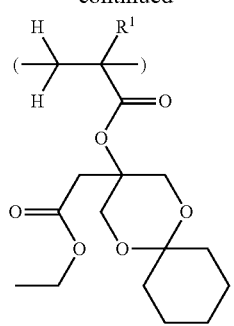
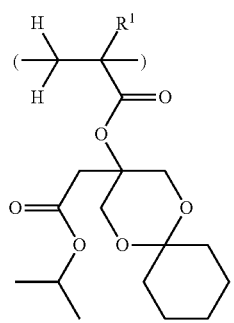
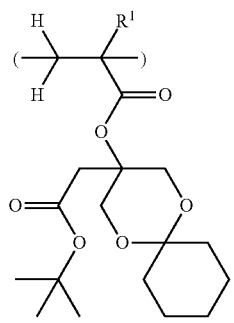
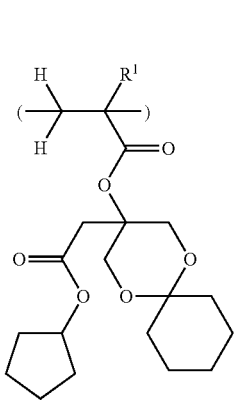
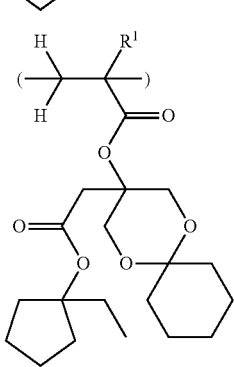
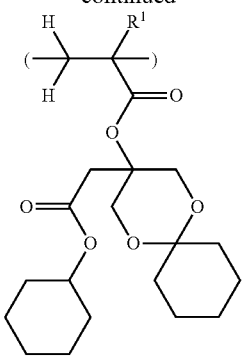
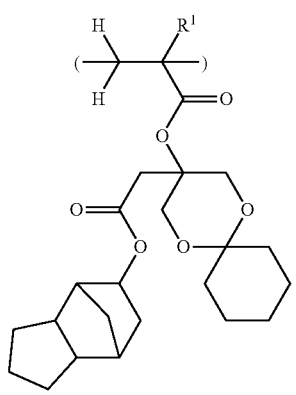
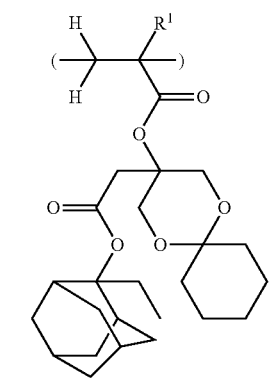
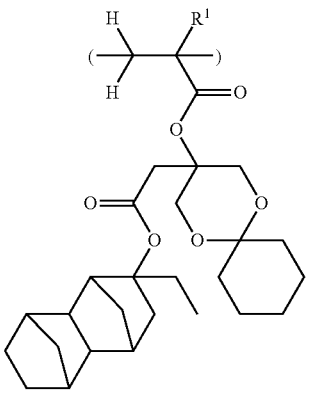

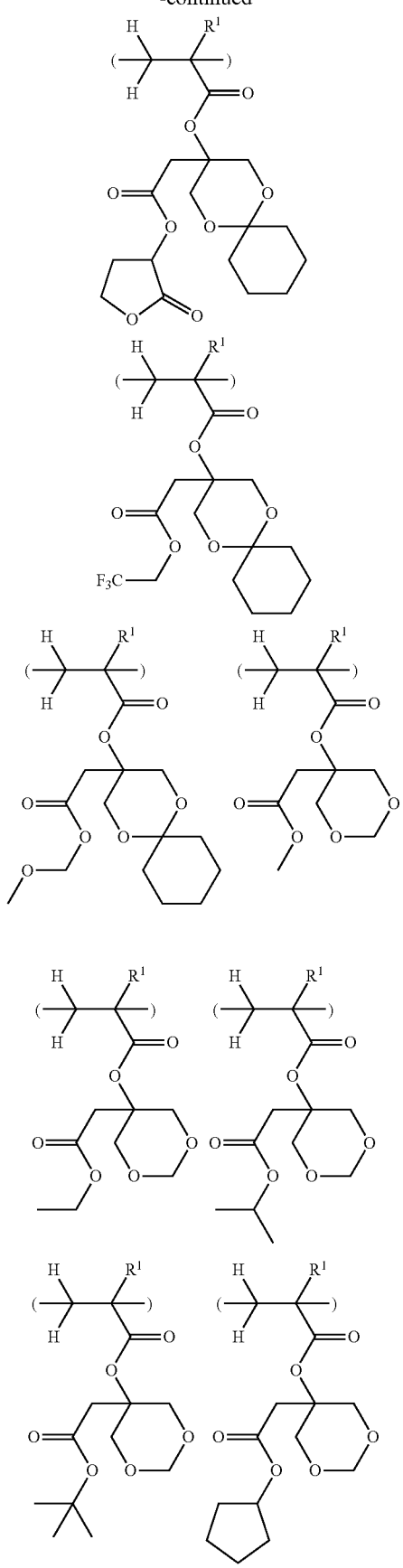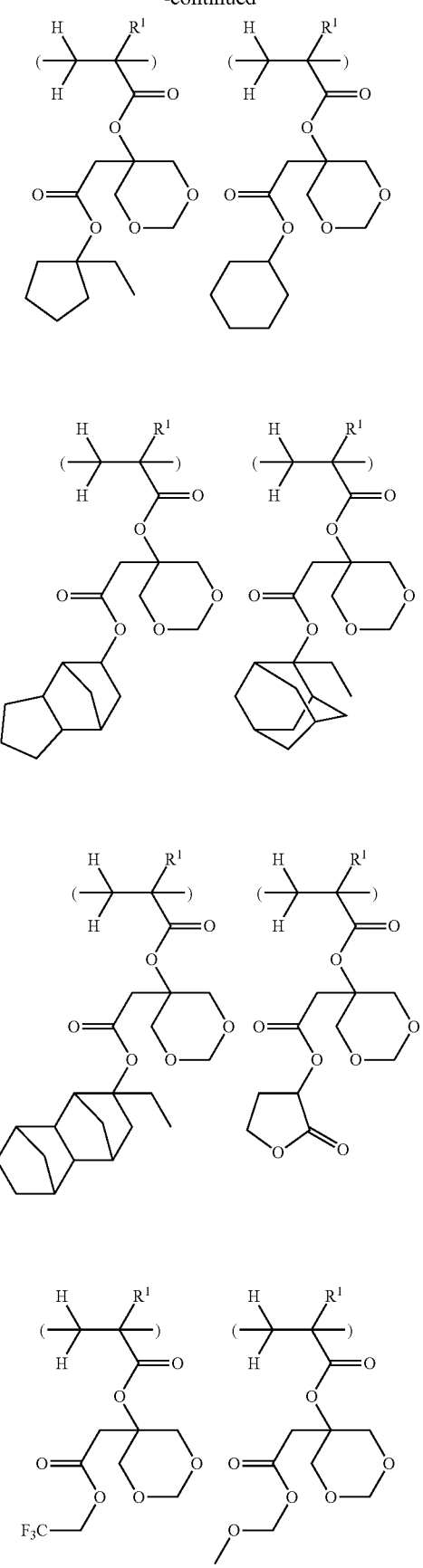

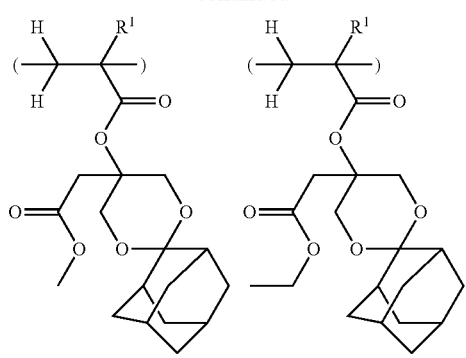
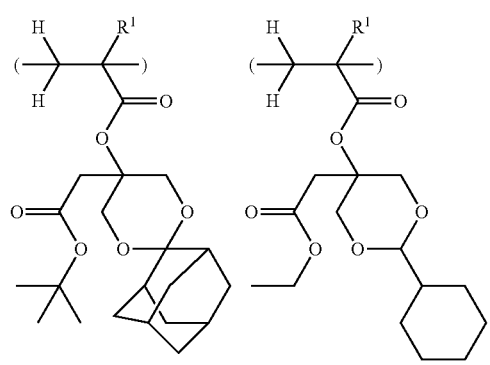
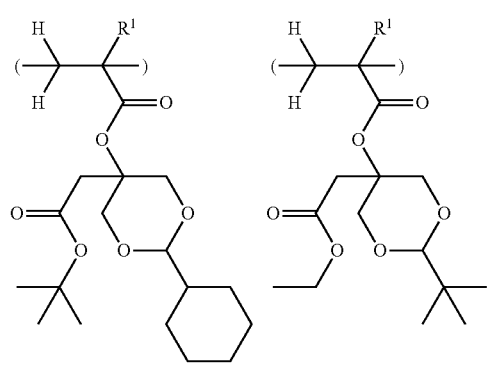
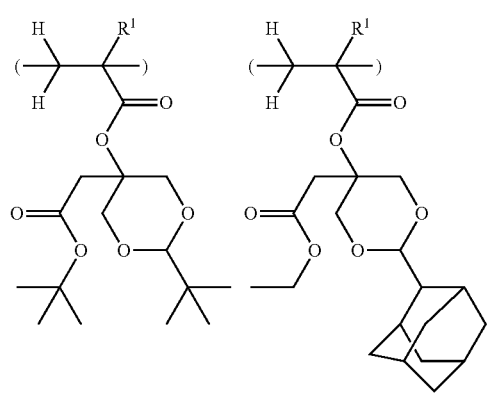
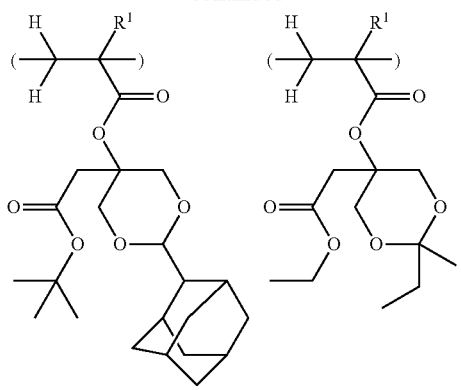
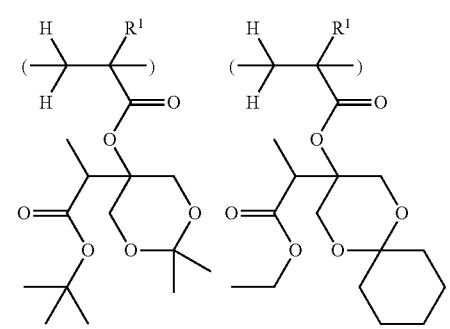
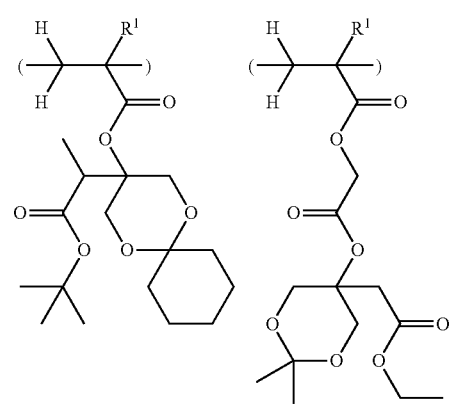
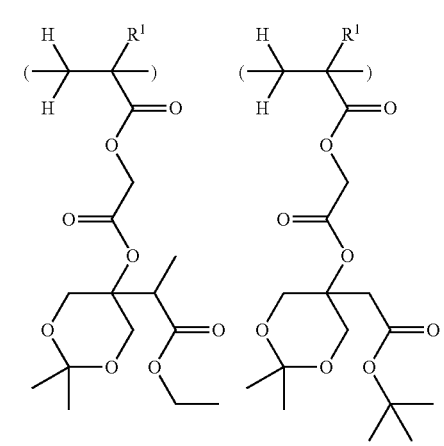

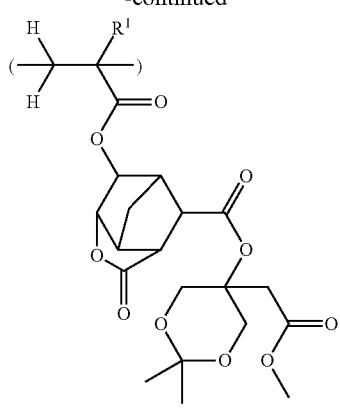
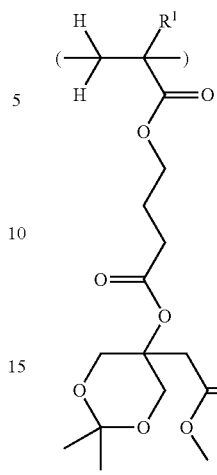
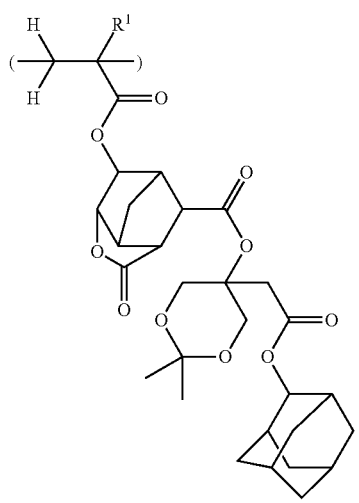
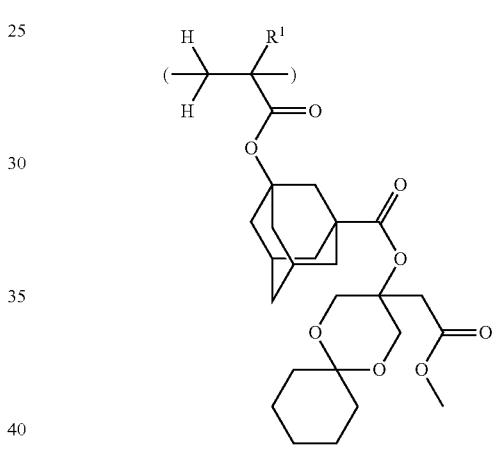
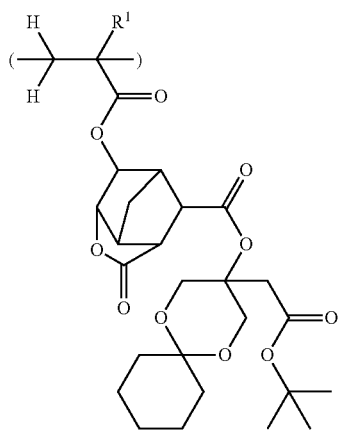
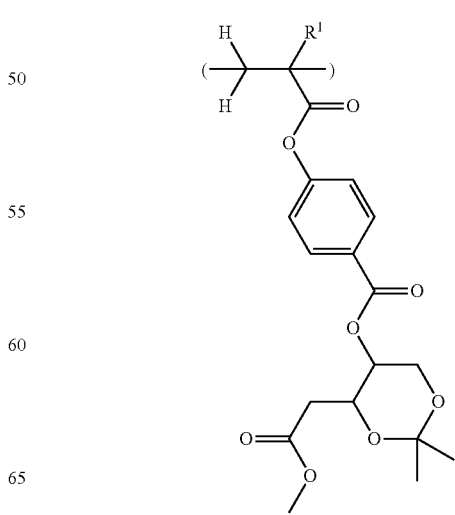

-continued

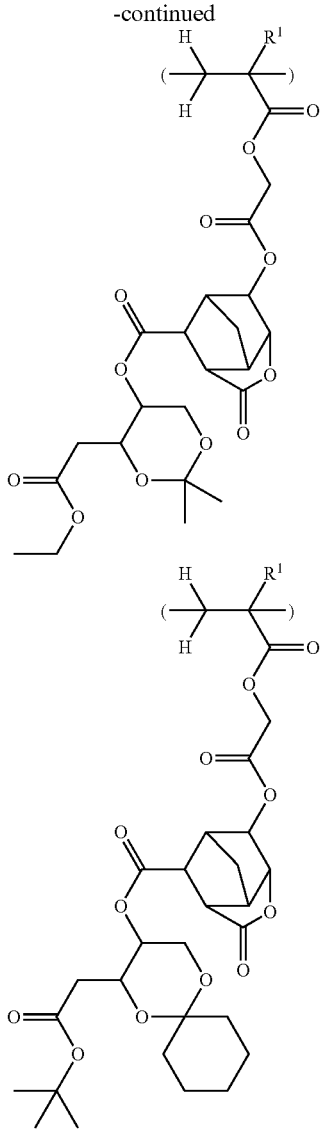

In addition to the recurring units (a1) mentioned above, the polymer serving as base resin in the resist composition may have further copolymerized therein recurring units (a2) having the general formula (2).

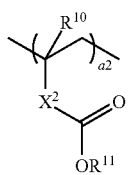

(2)

Herein $R^{10}$ is hydrogen or methyl. $R^{11}$ is an acid labile group. $X^2$ is a single bond, phenylene, naphthylene, or —C(=O)—O—$R^{12}$—, wherein $R^{12}$ is a straight, branched or cyclic $C_1$-$C_{10}$ alkylene group which may have an ether moiety, ester moiety, lactone ring or hydroxyl moiety, or a phenylene or naphthylene group, and a2 is a number in the range: $0 \leq a2 < 1.0$.

$R^{12}$ stands for a $C_1$-$C_{10}$ alkylene group which may have an ether, ester, lactone ring or hydroxyl moiety, or a phenylene or naphthylene group, examples of which are shown below.

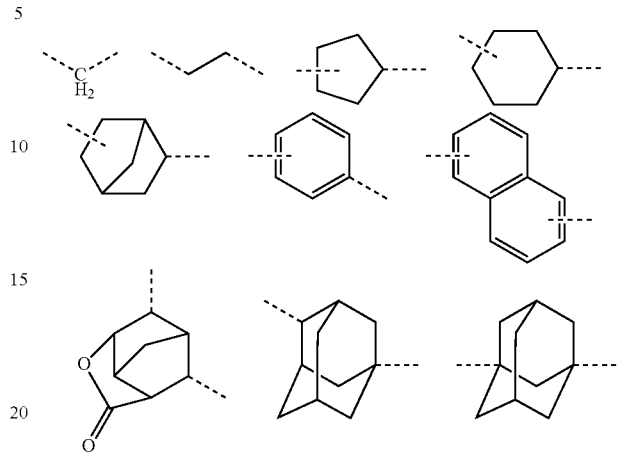

The acid labile group represented by $R^{11}$ in formula (2) will be described later.

In addition to the recurring units (a1) of formula (1) and the recurring units (a2) of formula (2), the polymer may have further copolymerized therein recurring units having a hydroxyl group substituted with an acid labile group. Suitable recurring units having a hydroxyl group substituted with an acid labile group include units (b1) to (b4) represented by the general formula (3).

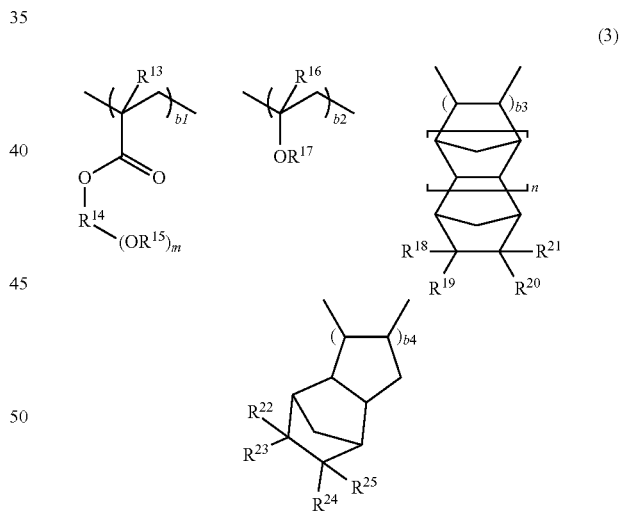

(3)

Herein $R^{13}$ and $R^{16}$ each are hydrogen or methyl. $R^{14}$ is a straight, branched or cyclic, di- to pentavalent aliphatic hydrocarbon group of 1 to 16 carbon atoms which may have an ether or ester moiety. $R^{15}$ and $R^{17}$ each are an acid labile group. $R^{18}$ to $R^{21}$ and $R^{22}$ to $R^{25}$ are each independently hydrogen, cyano, a straight, branched or cyclic $C_1$-$C_6$ alkyl group, alkoxycarbonyl, or a group having an ether moiety or lactone ring, at least one of $R^{18}$ to $R^{21}$ and $R^{22}$ to $R^{25}$ has a hydroxyl group substituted with an acid labile group. The subscript m is an integer of 1 to 4, n is 0 or 1, b1, b2, b3 and b4 are numbers in the range: $0 \leq b1 < 1.0$, $0 \leq b2 < 1.0$, $0 \leq b3 < 1.0$, $0 \leq b4 < 1.0$, and $0 \leq b1 + b2 + b3 + b4 < 1.0$.

Examples of the monomers from which recurring units (b1) and (b2) in formula (3) are derived are given below. Herein $R^{13}$, $R^{15}$, $R^{16}$ and $R^{17}$ are as defined above.
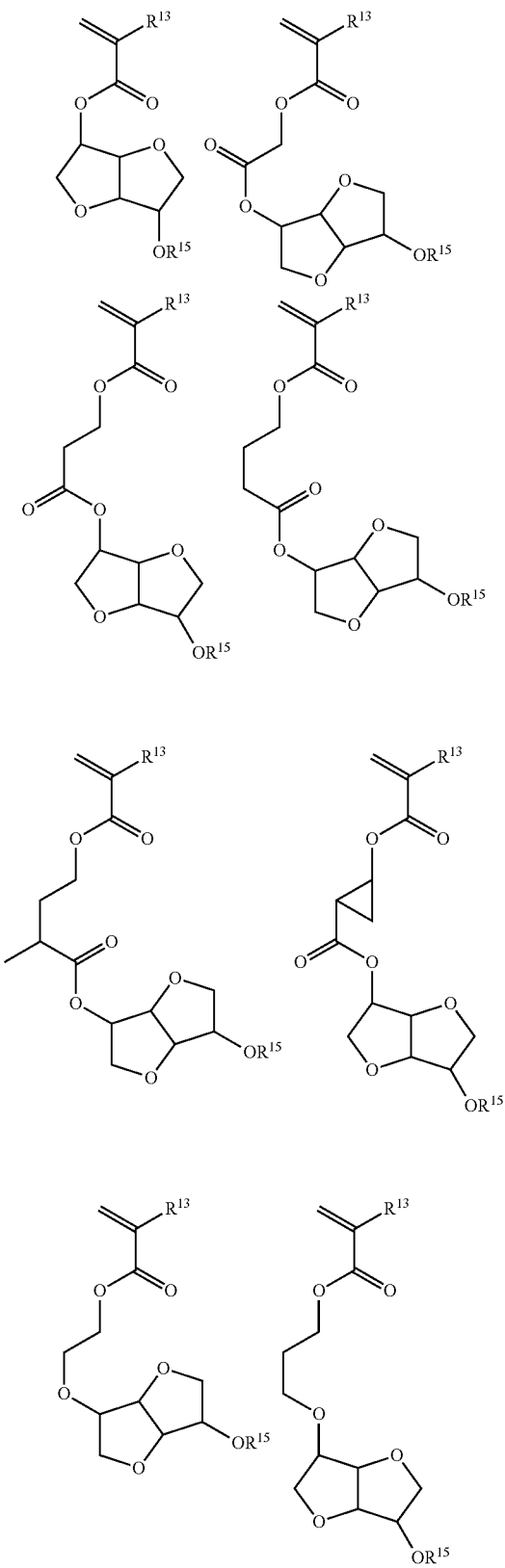
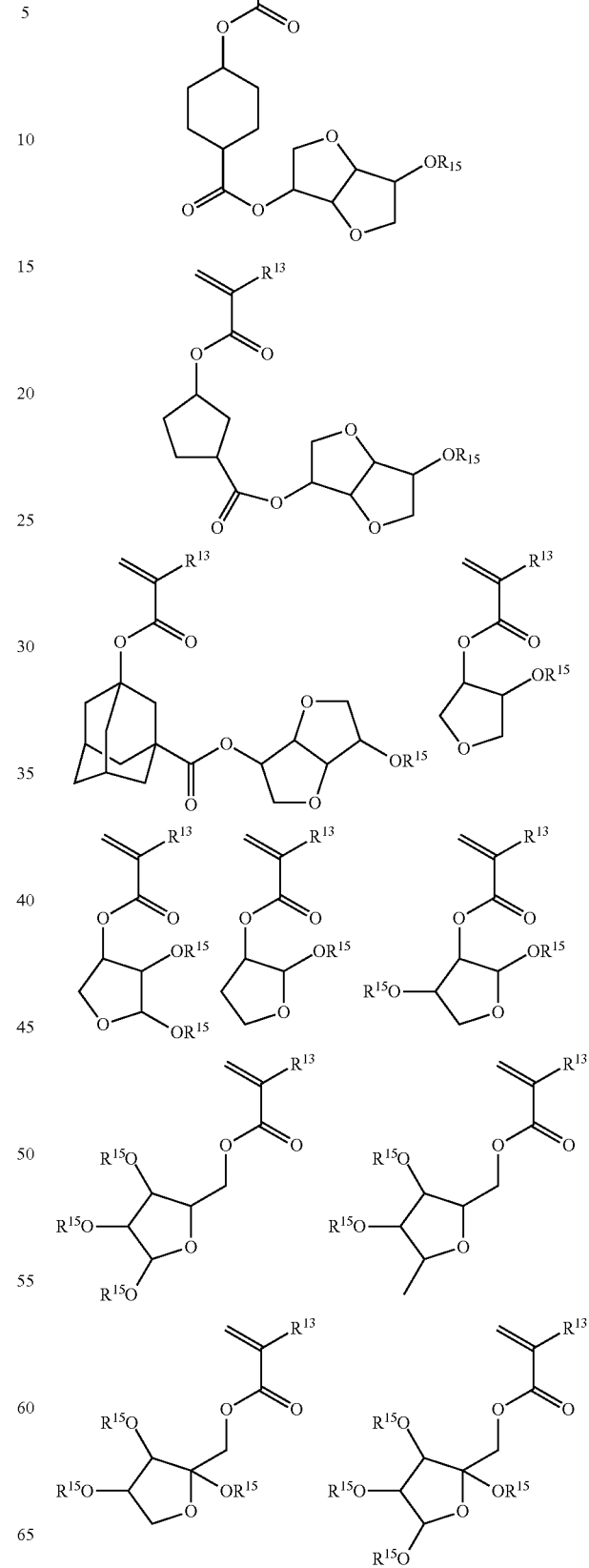

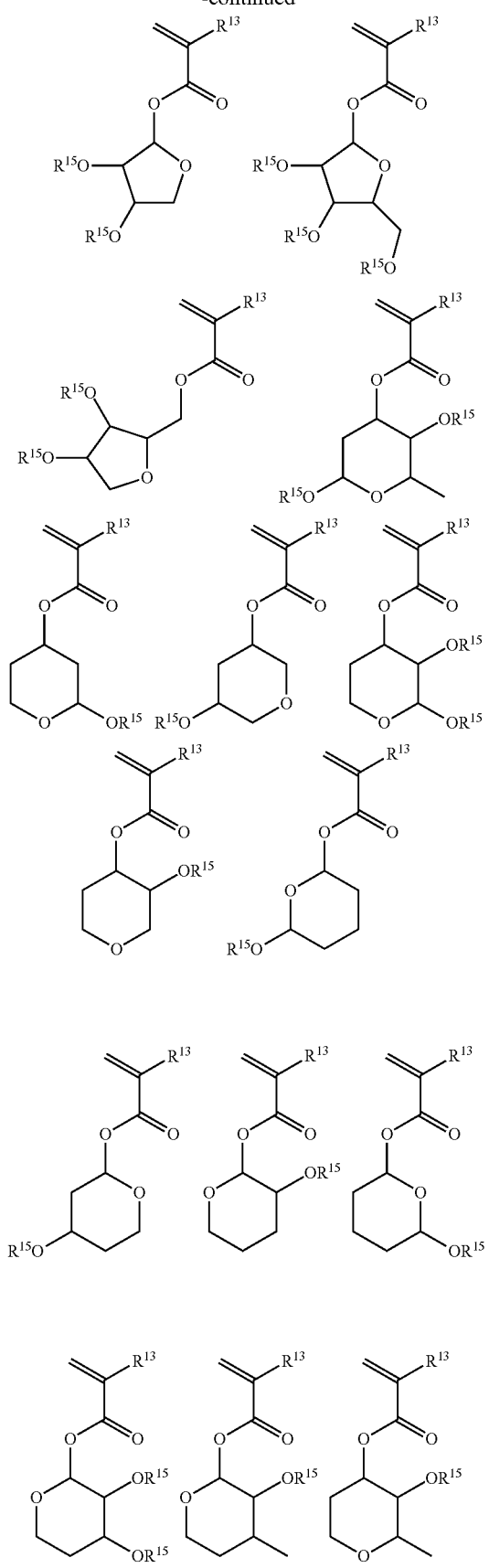
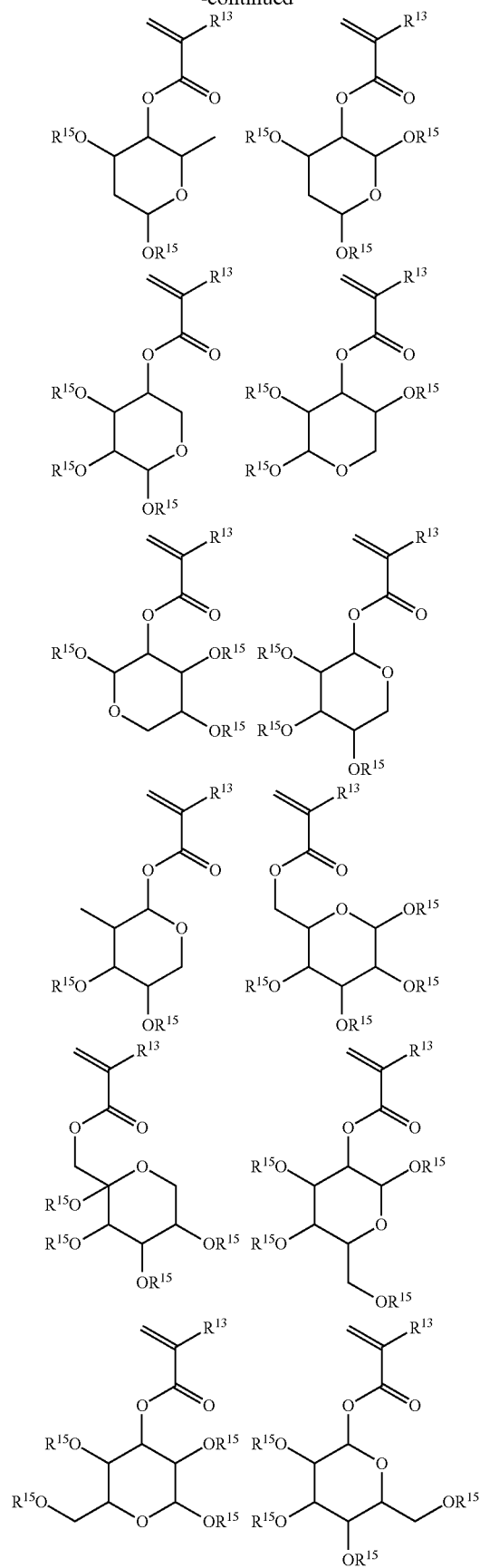

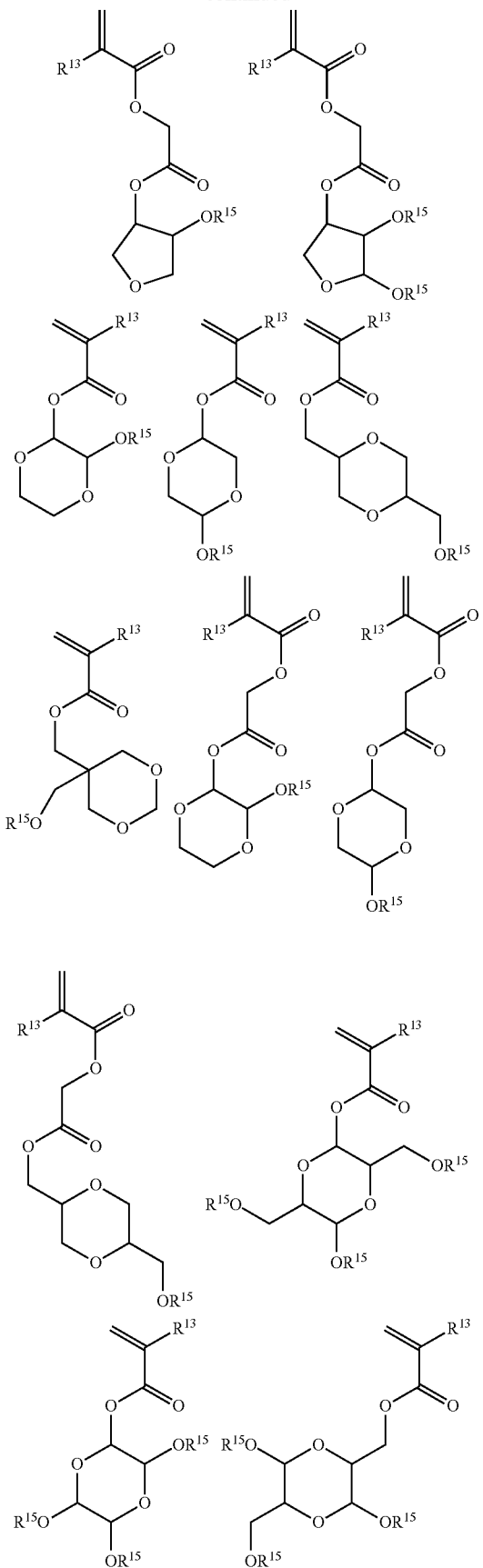
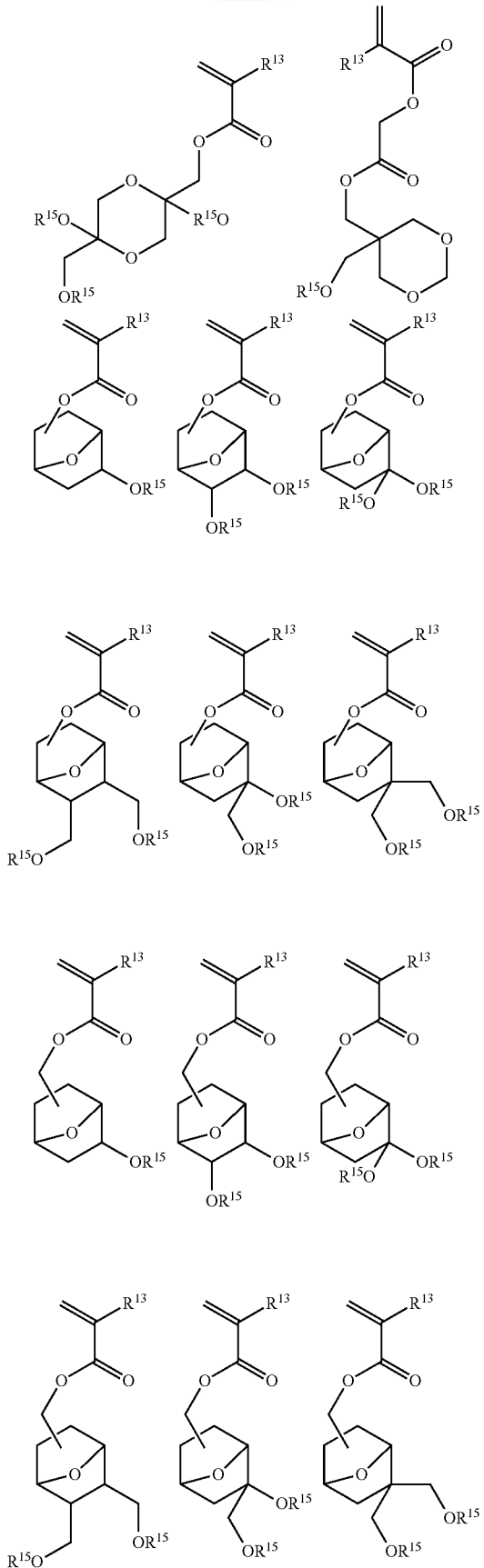

37
-continued
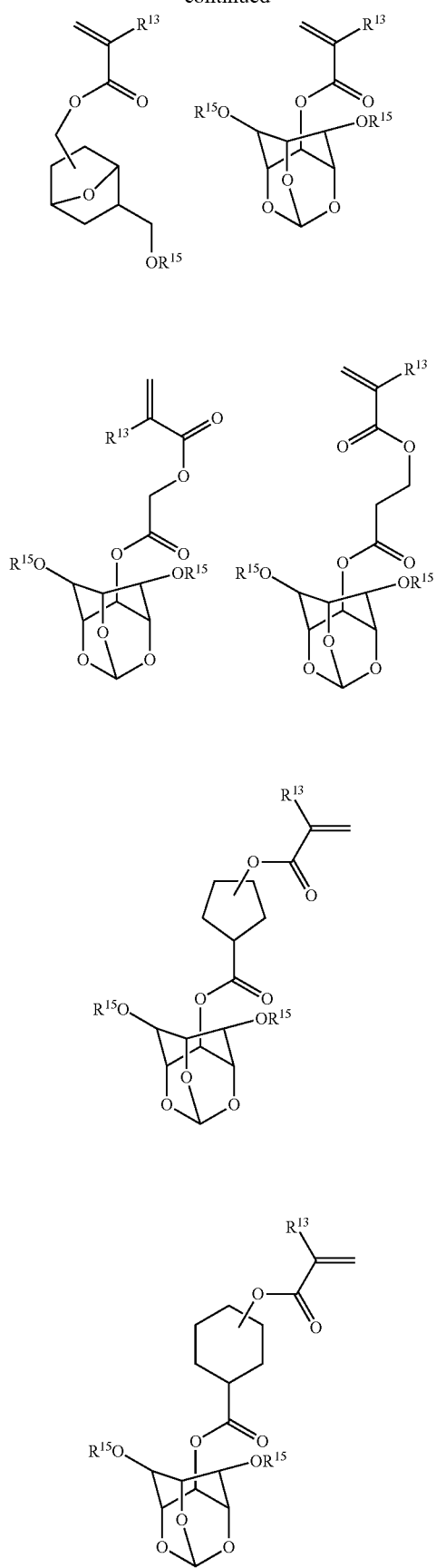
38
-continued
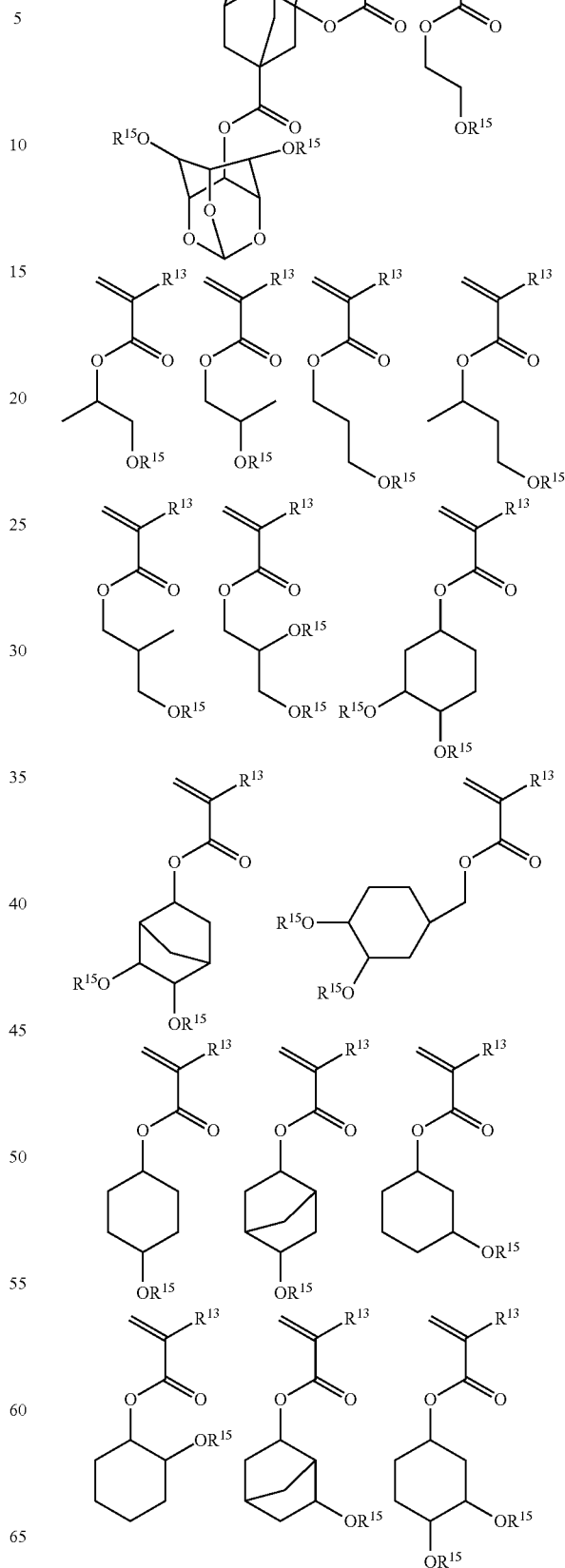

-continued
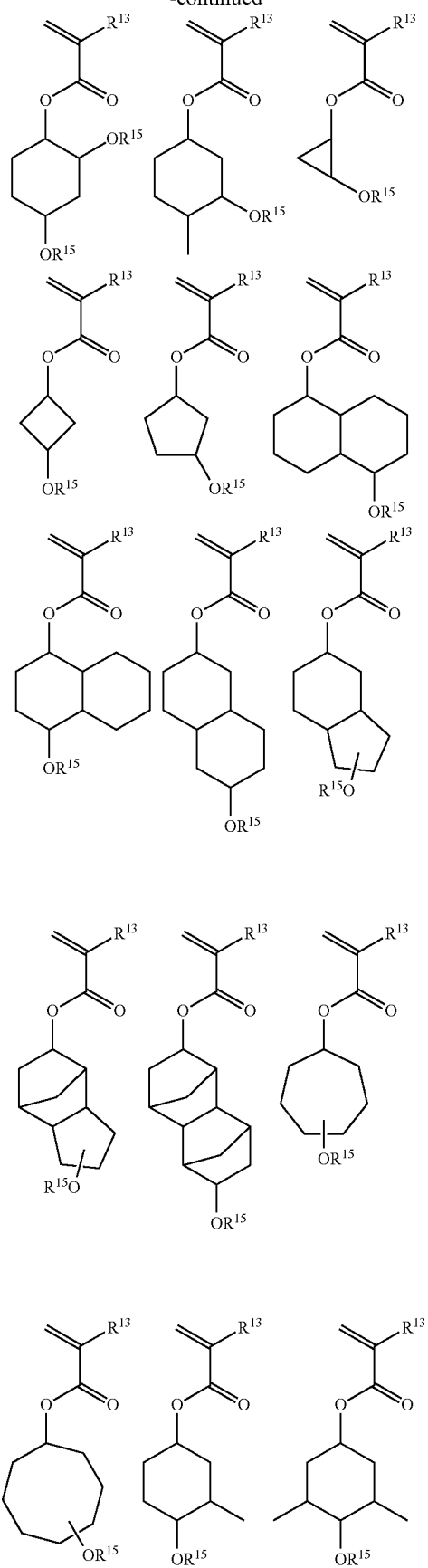
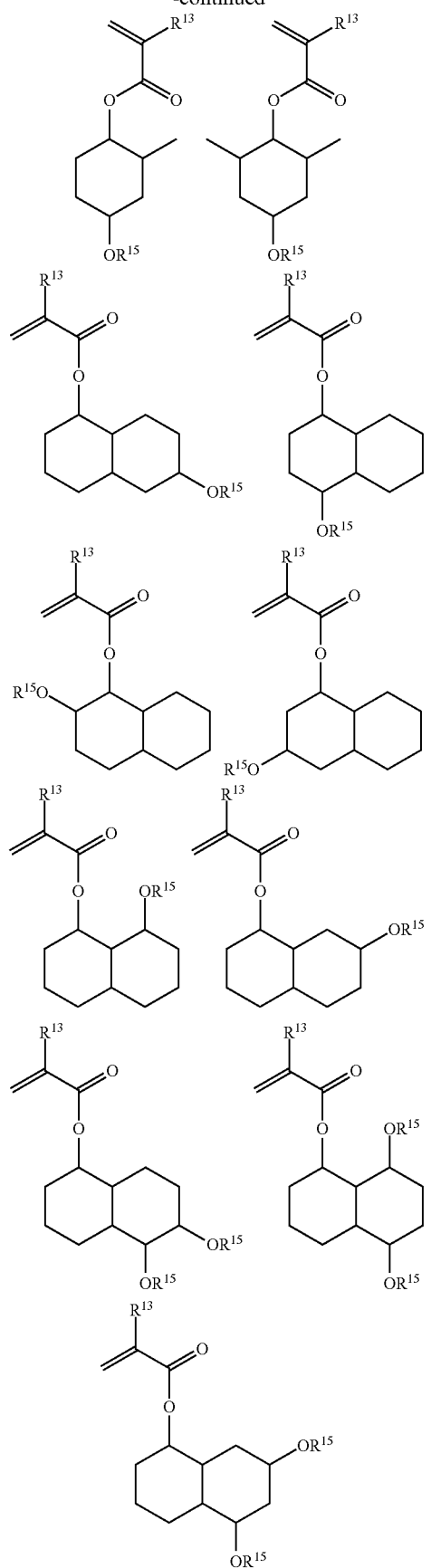

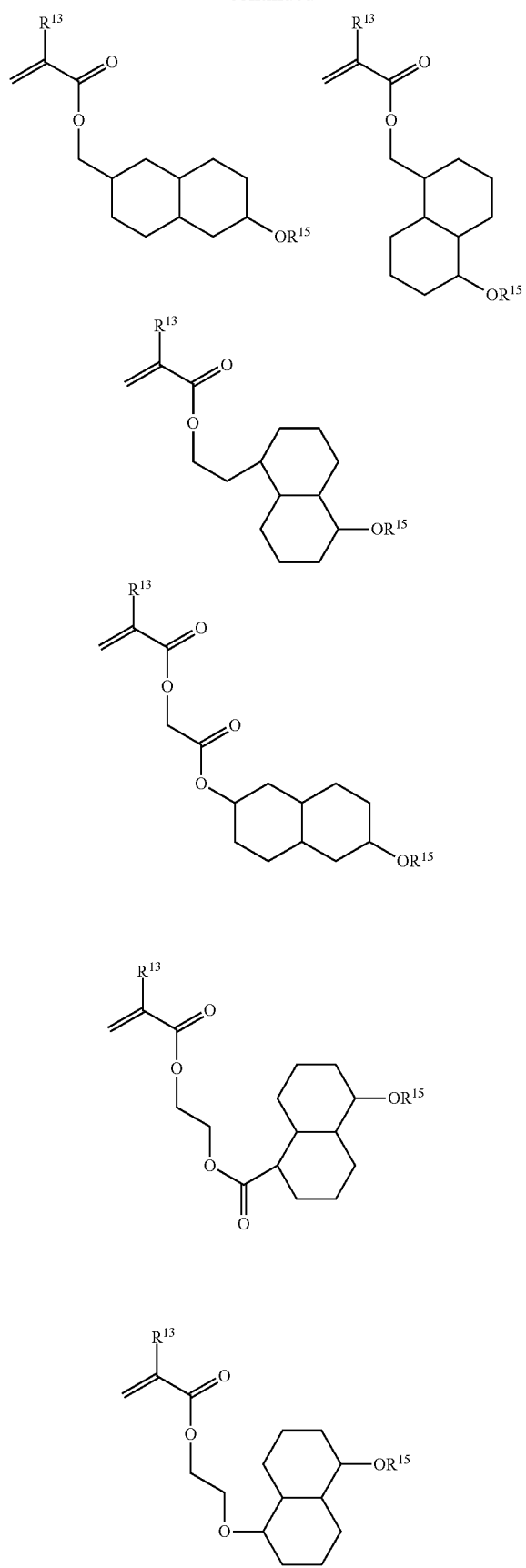
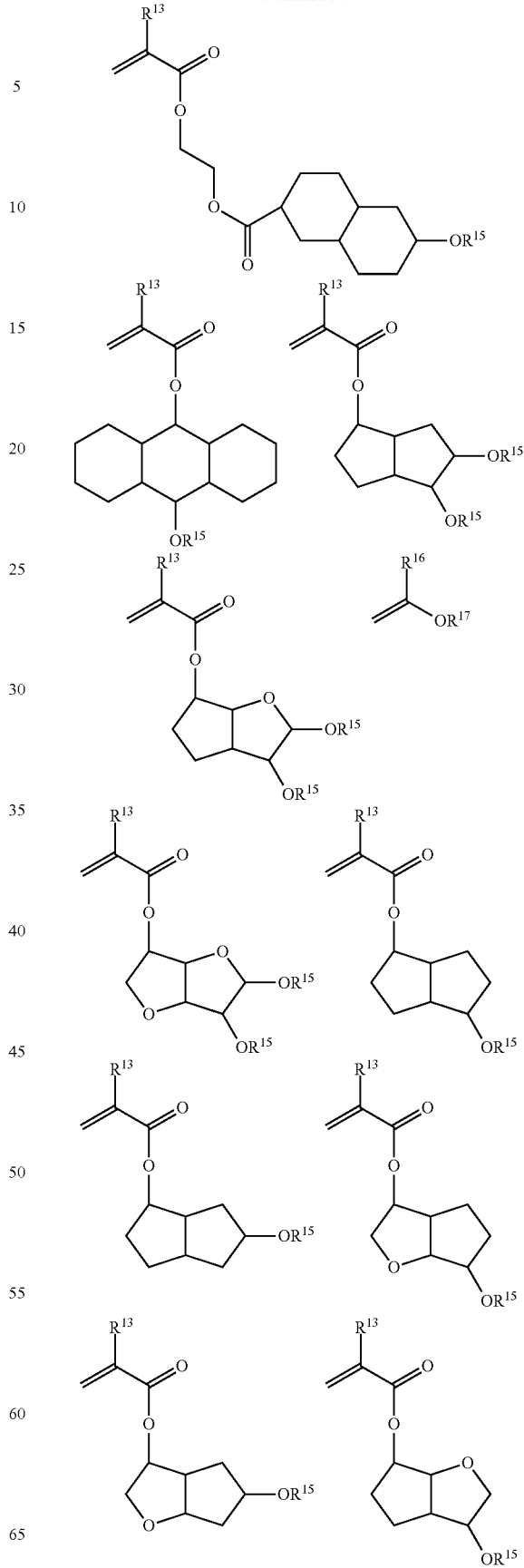

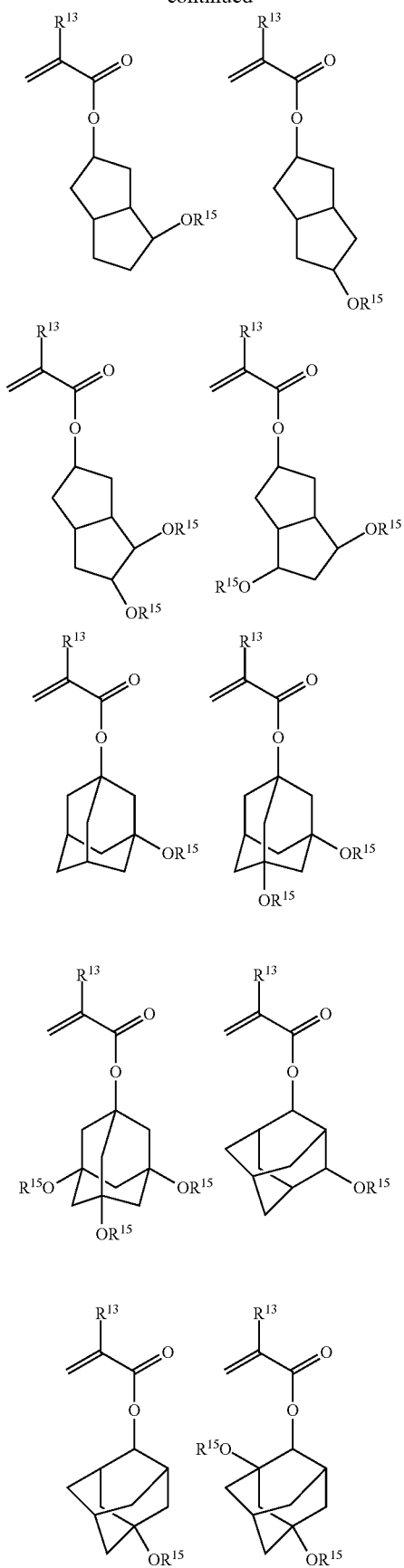
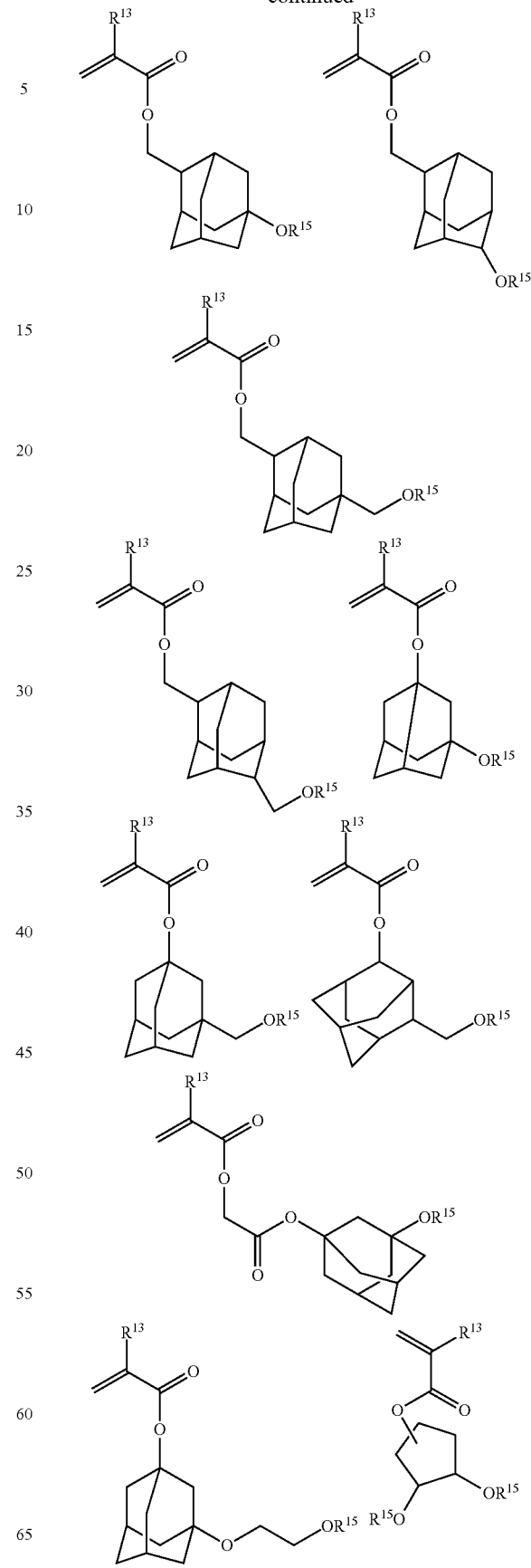

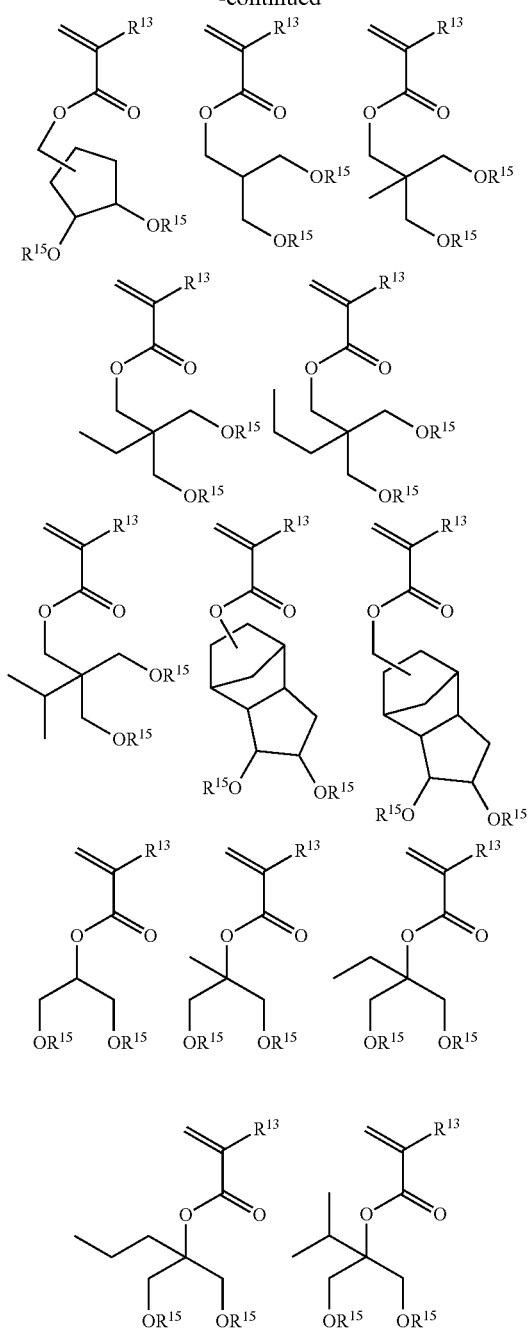
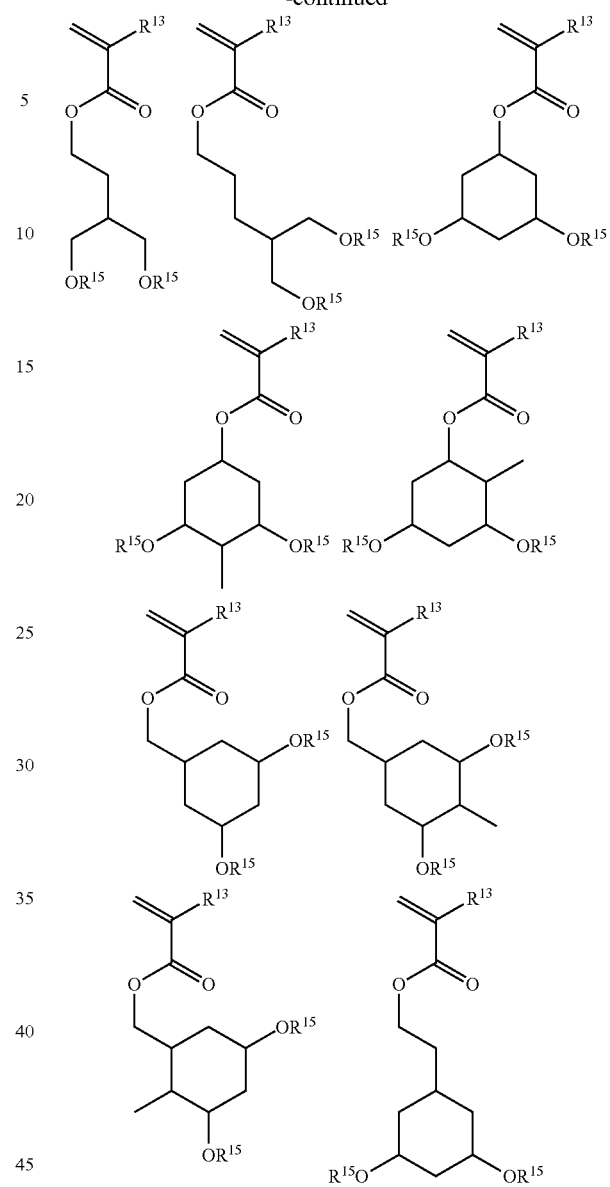
Examples of the monomers from which recurring units (b3) and (b4) are derived are given below. Herein R is an acid labile group.
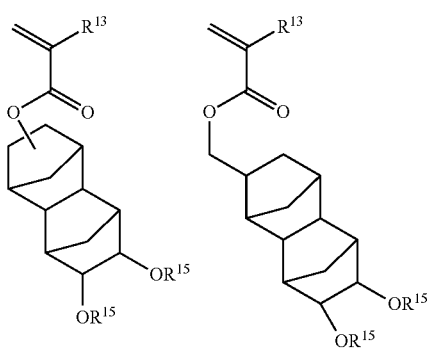
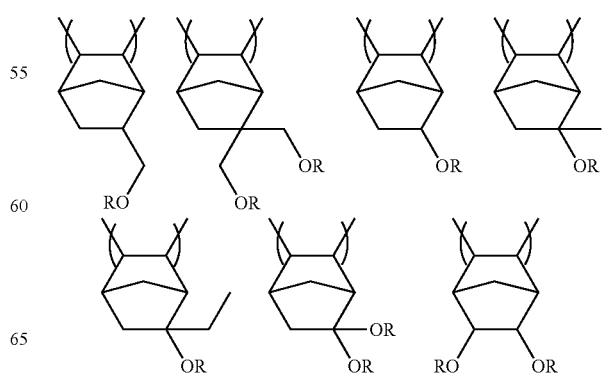

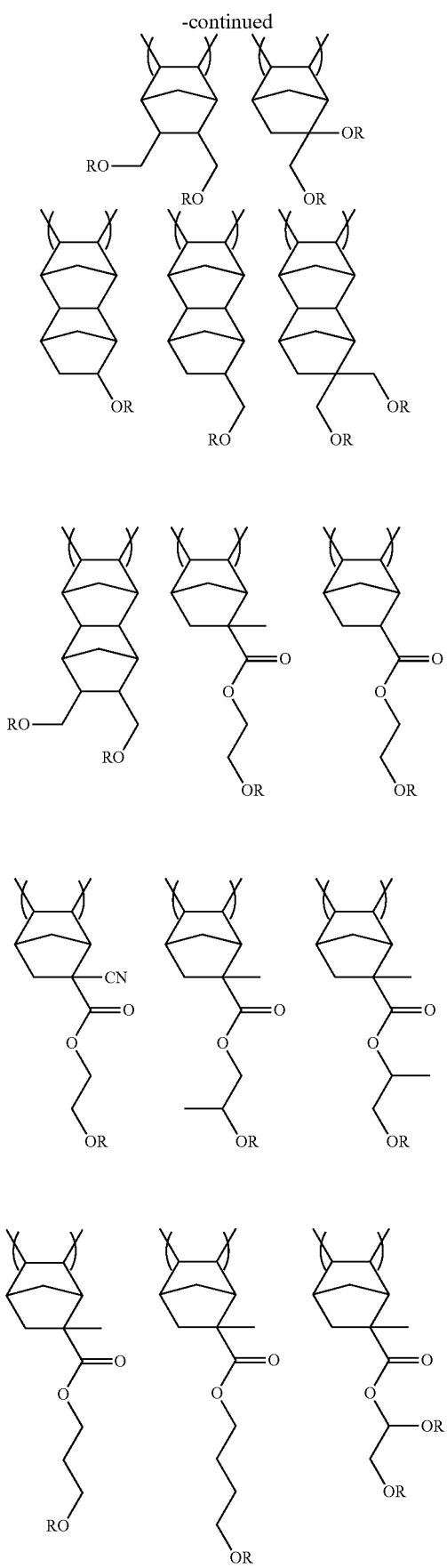
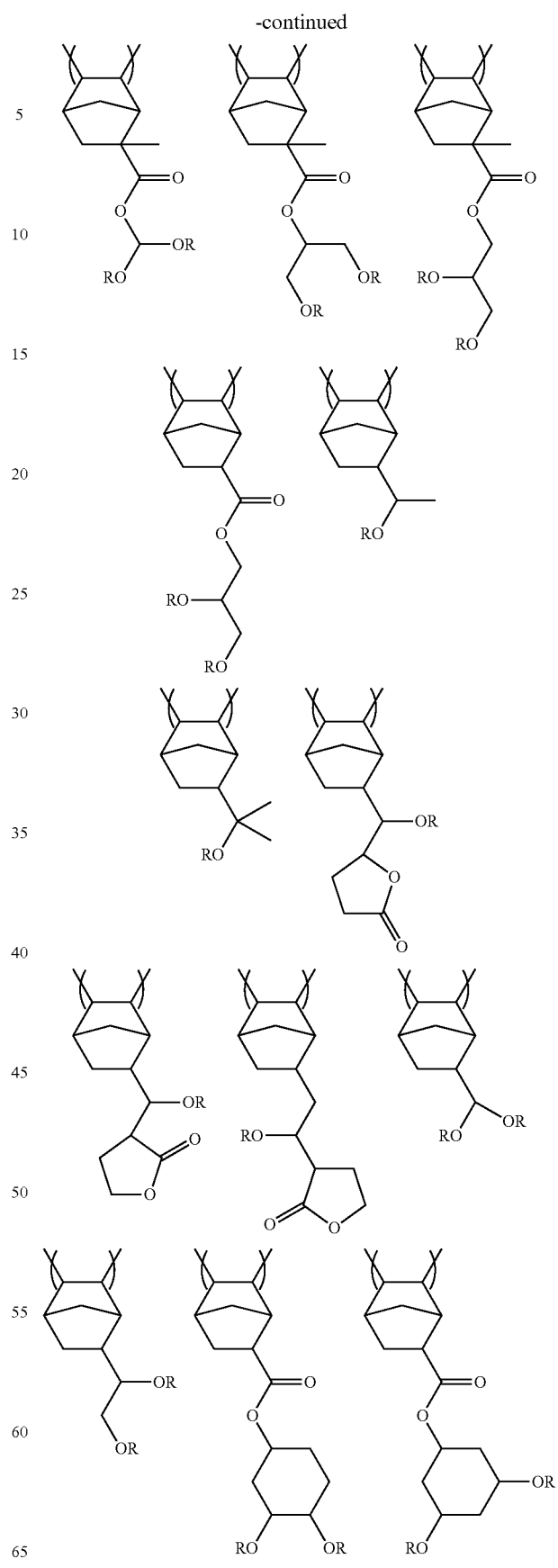

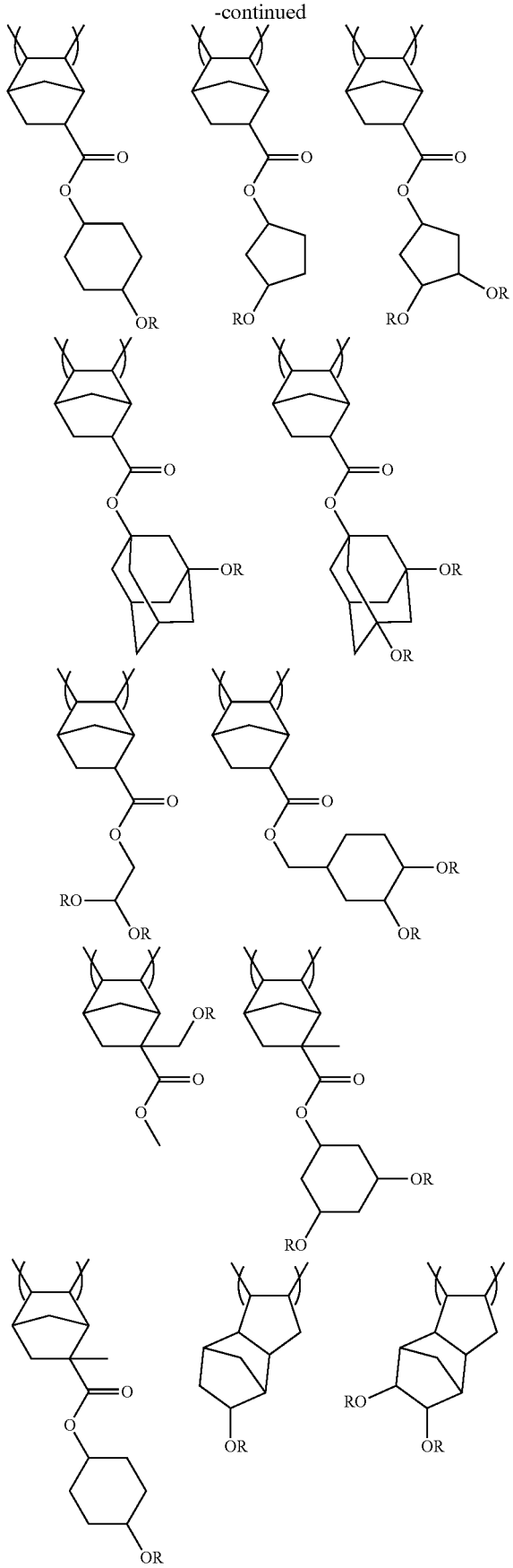

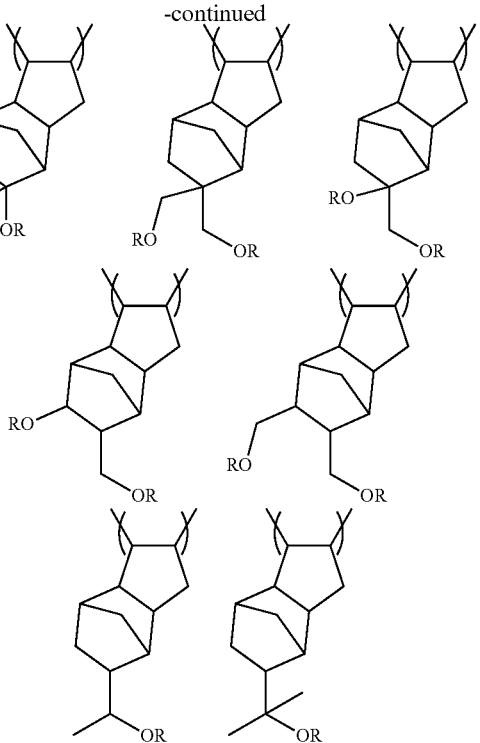

The acid labile group represented by $R^{11}$ in formula (2) and the acid labile groups (substituting on hydroxyl) represented by $R^{15}$, $R^{17}$, any one of $R^{18}$ to $R^{21}$, and any one of $R^{22}$ to $R^{25}$ in formula (3) may be the same or different and selected from a variety of such groups. Suitable acid labile groups include groups of the following formula (AL-10), acetal groups of the following formula (AL-11), tertiary alkyl groups of the following formula (AL-12), and oxoalkyl groups of 4 to 20 carbon atoms, but are not limited thereto.

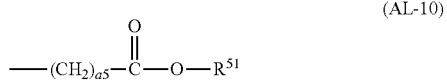

(AL-10)

(AL-11)

(AL-12)

In formulae (AL-10) and (AL-11), $R^{51}$ and $R^{54}$ each are a monovalent hydrocarbon group, typically straight, branched or cyclic alkyl group, of 1 to 40 carbon atoms, more specifically 1 to 20 carbon atoms, which may contain a heteroatom such as oxygen, sulfur, nitrogen or fluorine. $R^{52}$ and $R^{53}$ each are hydrogen or a monovalent hydrocarbon group, typically straight, branched or cyclic $C_1$-$C_{20}$ alkyl group, which may contain a heteroatom such as oxygen, sulfur, nitrogen or fluorine. The subscript "a5" is an integer of 0 to 10, and especially 1 to 5. Alternatively, a pair of $R^{52}$ and $R^{53}$, $R^{52}$ and $R^{54}$, or $R^{53}$ and $R^{54}$ may bond together to form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$ may bond together to form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

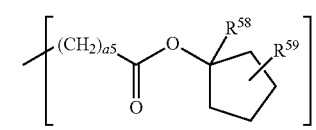
(AL-10)-1

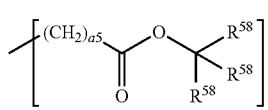
(AL-10)-2

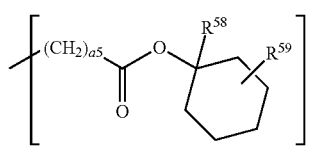
(AL-10)-3

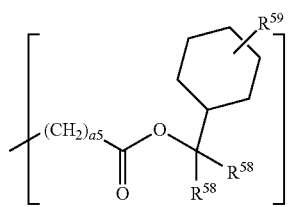
(AL-10)-4

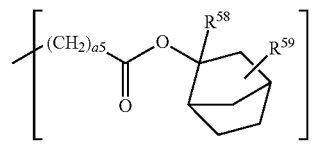
(AL-10)-5

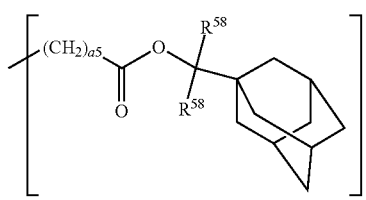
(AL-10)-6

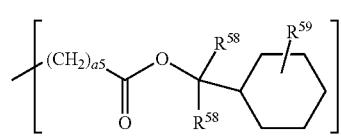
(AL-10)-7

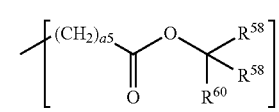
(AL-10)-8

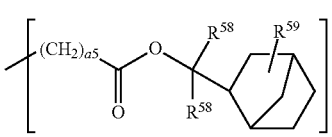
(AL-10)-9

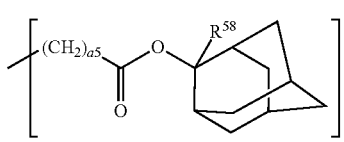
(AL-10)-10

In formulae (AL-10)-1 to (AL-10)-10, $R^{58}$ is each independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^H$ is a $C_6$-$C_{20}$ aryl group or $C_7$-$C_{20}$ aralkyl group; and "a5" is as defined above.

Illustrative examples of the acetal group of formula (AL-11) include those of the following formulae (AL-11)-1 to (AL-11)-112.

$$-CH_2-O-CH_3 \quad (AL\text{-}11)\text{-}1$$

$$-CH_2-O-CH_2-CH_3 \quad (AL\text{-}11)\text{-}2$$

$$-CH_2-O-(CH_2)_2-CH_3 \quad (AL\text{-}11)\text{-}3$$

$$-CH_2-O-(CH_2)_3-CH_3 \quad (AL\text{-}11)\text{-}4$$

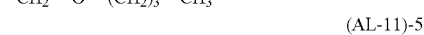
(AL-11)-5

(AL-11)-6

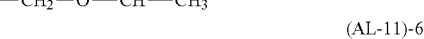
(AL-11)-7

(AL-11)-8

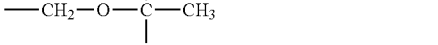
(AL-11)-9

(AL-11)-10

(AL-11)-11

| | | |
|---|---|---|
| 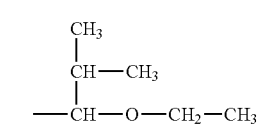 | (AL-11)-12 | 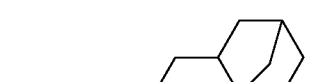 (AL-11)-26 |
| 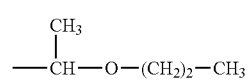 | (AL-11)-13 | 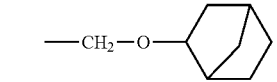 (AL-11)-27 |
| 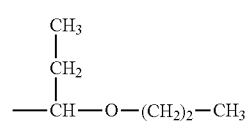 | (AL-11)-14 | 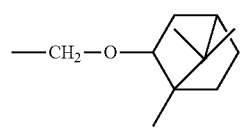 (AL-11)-28 |
| 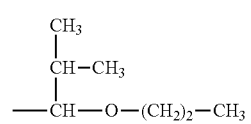 | (AL-11)-15 | 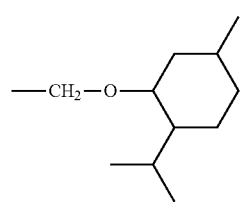 (AL-11)-29 |
| 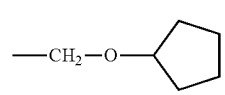 | (AL-11)-16 | 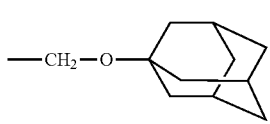 (AL-11)-30 |
| 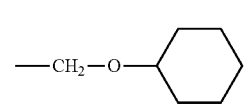 | (AL-11)-17 | 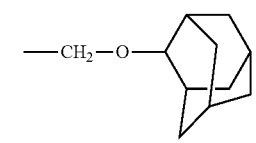 (AL-11)-31 |
| 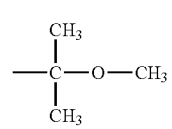 | (AL-11)-18 | 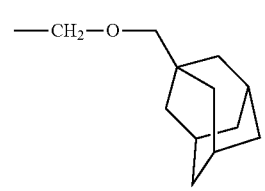 (AL-11)-32 |
| 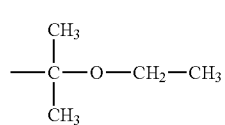 | (AL-11)-19 | 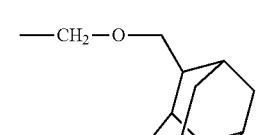 (AL-11)-33 |
| 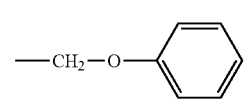 | (AL-11)-20 | 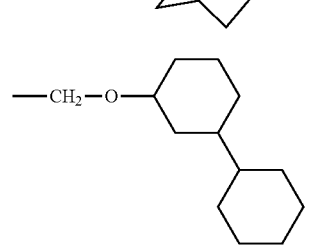 (AL-11)-34 |
|  | (AL-11)-21 | 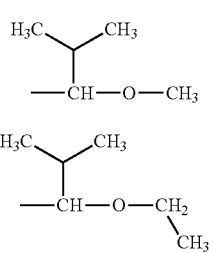 (AL-11)-35 |
| 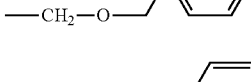 | (AL-11)-22 | (AL-11)-36 |
| 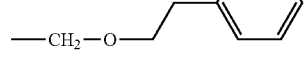 | (AL-11)-23 | |
| 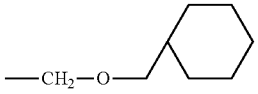 | (AL-11)-24 | |
| 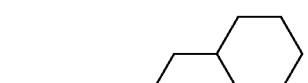 | (AL-11)-25 | |
| 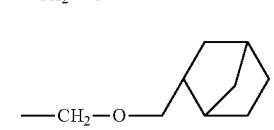 | | |

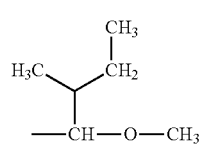 (AL-11)-37
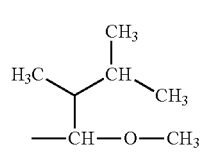 (AL-11)-38
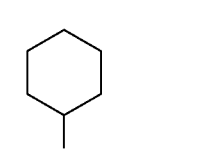 (AL-11)-39
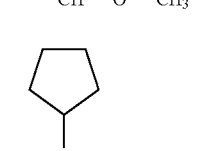 (AL-11)-40
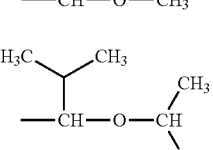 (AL-11)-41
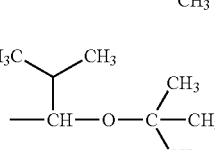 (AL-11)-42
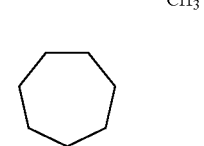 (AL-11)-43
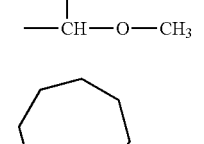 (AL-11)-44
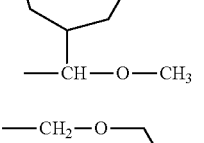 (AL-11)-45
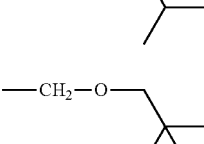 (AL-11)-46
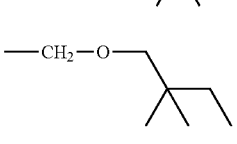 (AL-11)-47
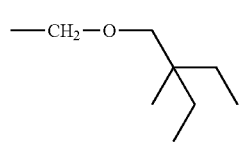 (AL-11)-48
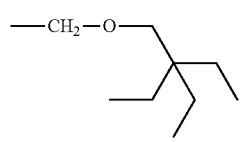 (AL-11)-49
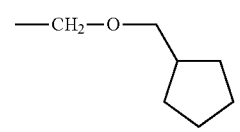 (AL-11)-50
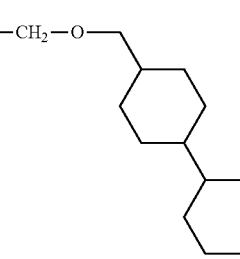 (AL-11)-51
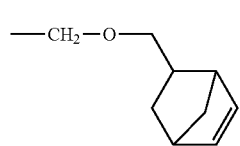 (AL-11)-52
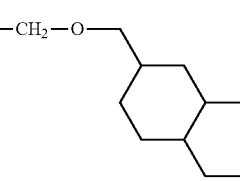 (AL-11)-53
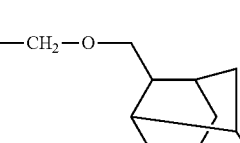 (AL-11)-54
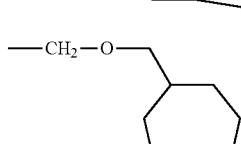 (AL-11)-55
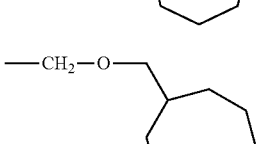 (AL-11)-56
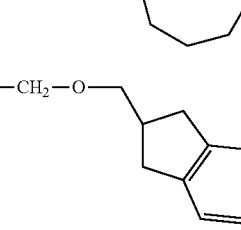 (AL-11)-57

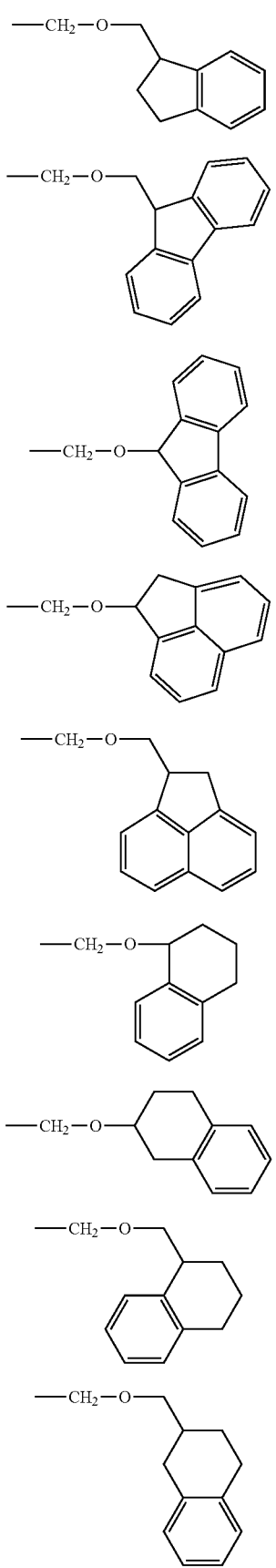
(AL-11)-58
(AL-11)-59
(AL-11)-60
(AL-11)-61
(AL-11)-62
(AL-11)-63
(AL-11)-64
(AL-11)-65
(AL-11)-66
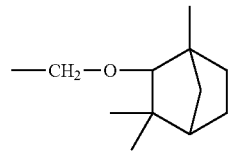
(AL-11)-67
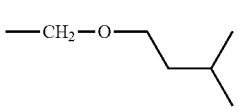
(AL-11)-68
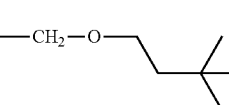
(AL-11)-69
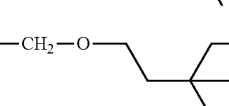
(AL-11)-70
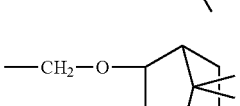
(AL-11)-71
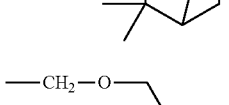
(AL-11)-72
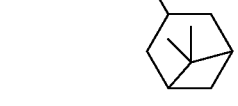
(AL-11)-73
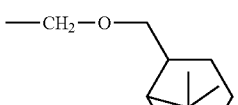
(AL-11)-74
(AL-11)-75
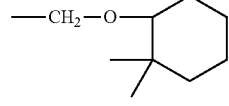
(AL-11)-76
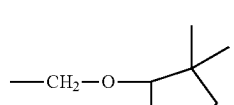
(AL-11)-77
(AL-11)-78

(AL-11)-79 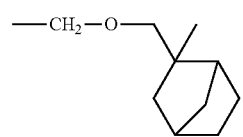
(AL-11)-80 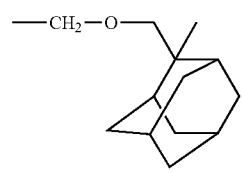
(AL-11)-81 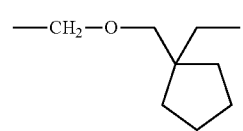
(AL-11)-82 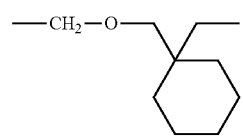
(AL-11)-83 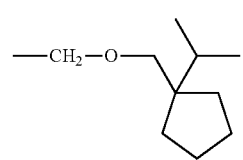
(AL-11)-84 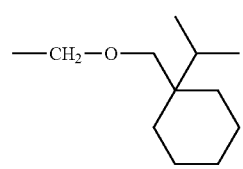
(AL-11)-85 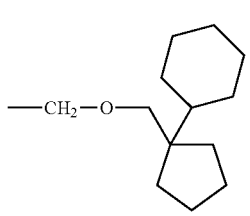
(AL-11)-86 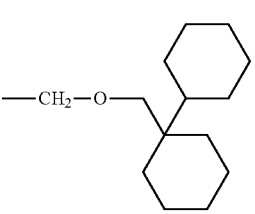
(AL-11)-87 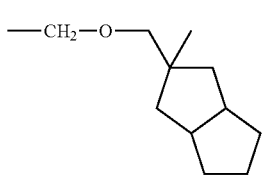
(AL-11)-88 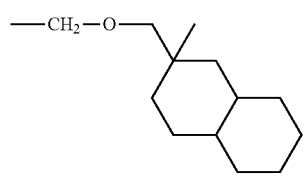
(AL-11)-89 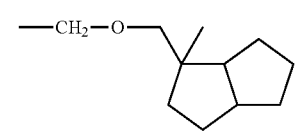
(AL-11)-90 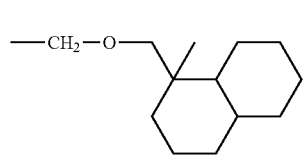
(AL-11)-91 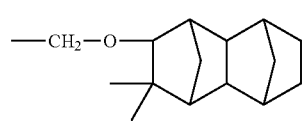
(AL-11)-92 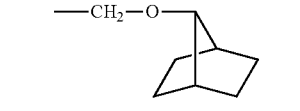
(AL-11)-93 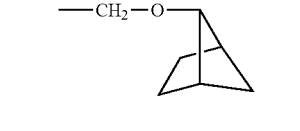
(AL-11)-94 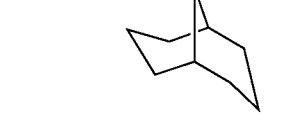
(AL-11)-95 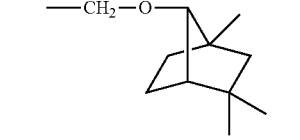
(AL-11)-96 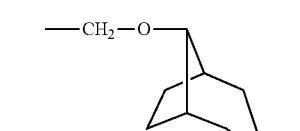
(AL-11)-97 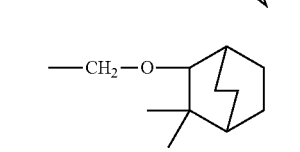
(AL-11)-98 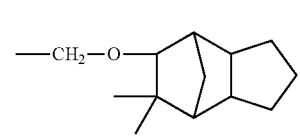

(AL-11)-99
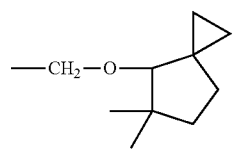
(AL-11)-100
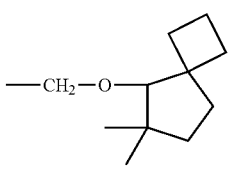
(AL-11)-101
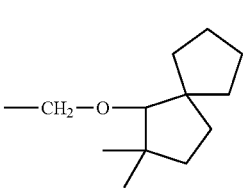
(AL-11)-102
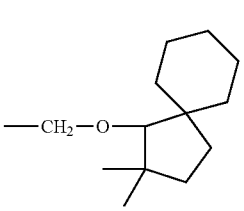
(AL-11)-103
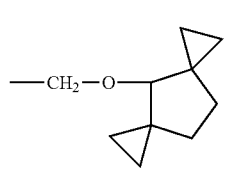
(AL-11)-104
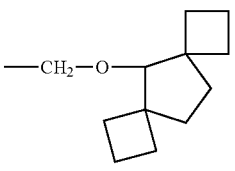
(AL-11)-105
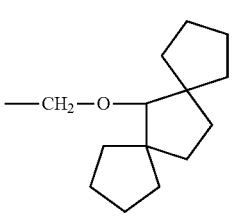
(AL-11)-106
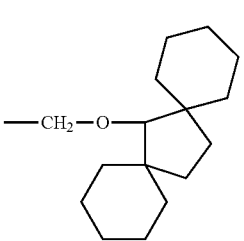
(AL-11)-107
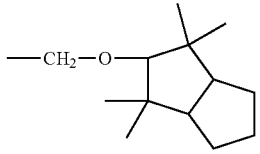
(AL-11)-108
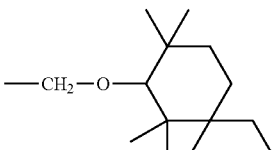
(AL-11)-109
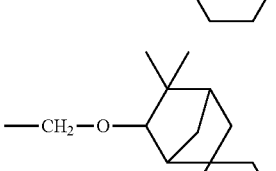
(AL-11)-110
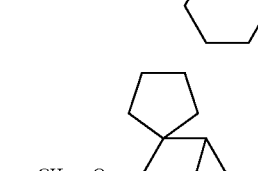
(AL-11)-111
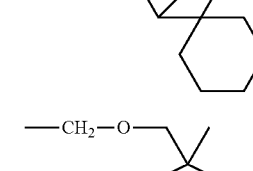
(AL-11)-112
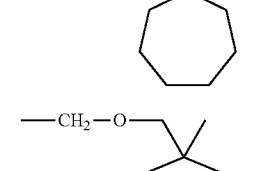
Other examples of acid labile groups include those of the following formula (AL-11a) or (AL-11b) while the polymer may be crosslinked within the molecule or between molecules with these acid labile groups.
(AL-11a)
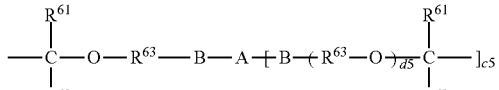
(AL-11b)

Herein $R^{61}$ and $R^{62}$ each are hydrogen or a straight, branched or cyclic $C_1$-$C_8$ alkyl group, or $R^{61}$ and $R^{62}$ may bond together to form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some hydrogen atoms attached to carbon atoms may be substituted by hydroxyl, carboxyl, carbonyl radicals or fluorine atoms. "B" is —CO—O—, —NHCO—O— or —NH-CONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some hydrogen atoms attached to carbon atoms may be substituted by hydroxyl, carboxyl, acyl radicals or halogen atoms. The subscript c5 is preferably an integer of 1 to 3.

The crosslinking acetal groups of formulae (AL-11a) and (AL-11b) are exemplified by the following formulae (AL-11)-113 through (AL-11)-120.

Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.

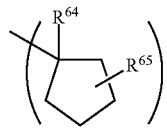
(AL-12)-1

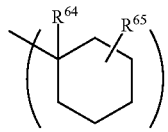
(AL-12)-2

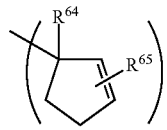
(AL-12)-3

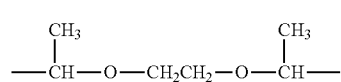
(AL-11)-113

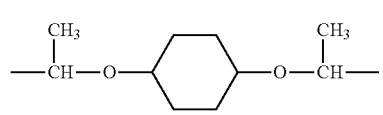
(AL-11)-114

(AL-11)-115

(AL-11)-116

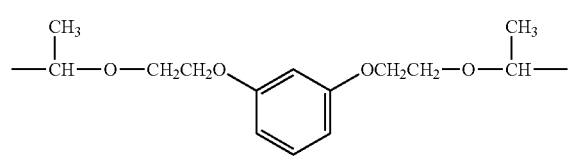
(AL-11)-117

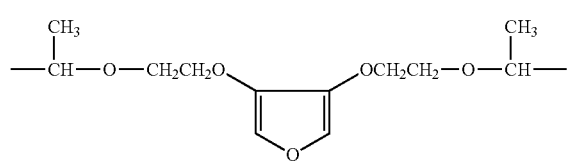
(AL-11)-118

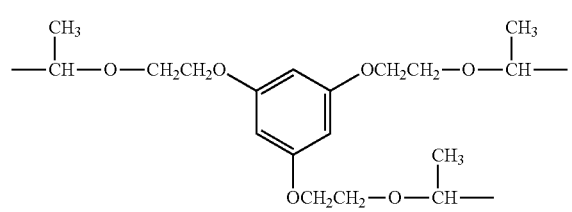
(AL-11)-119

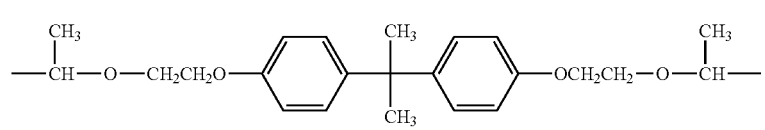
(AL-11)-120

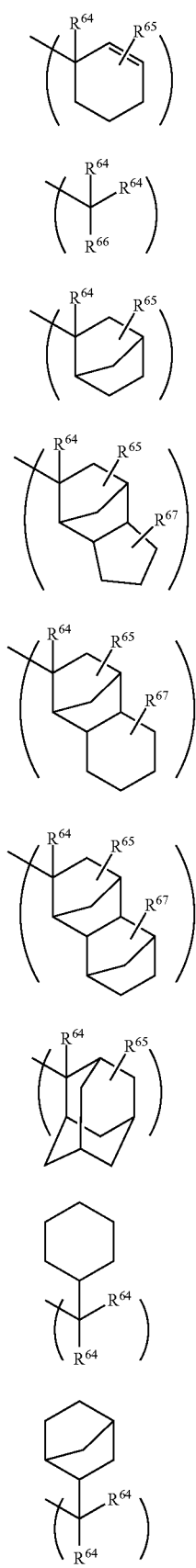
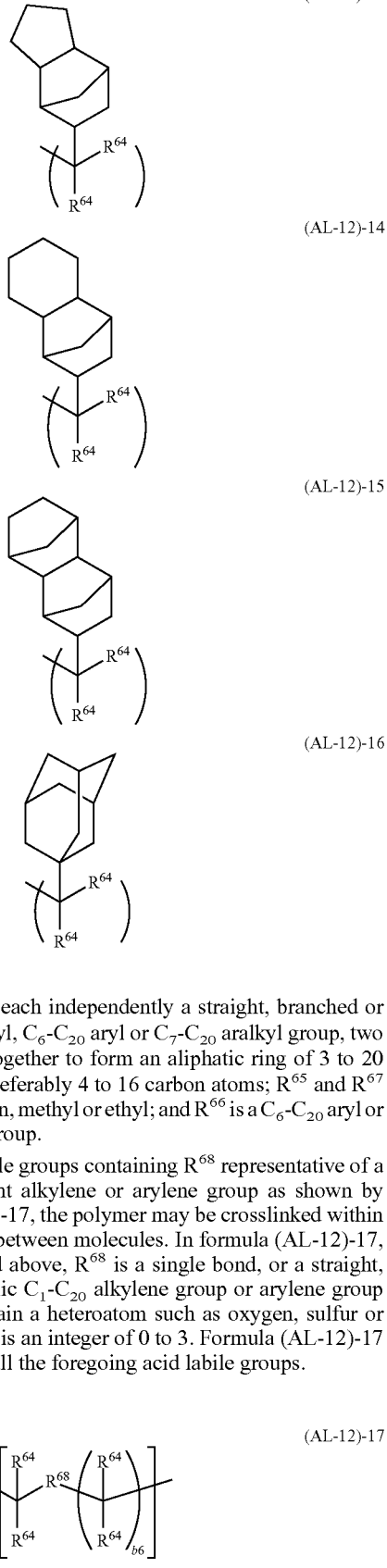

Herein $R^{64}$ is each independently a straight, branched or cyclic $C_1$-$C_8$ alkyl, $C_6$-$C_{20}$ aryl or $C_7$-$C_{20}$ aralkyl group, two $R^{64}$ may bond together to form an aliphatic ring of 3 to 20 carbon atoms, preferably 4 to 16 carbon atoms; $R^{65}$ and $R^{67}$ each are hydrogen, methyl or ethyl; and $R^{66}$ is a $C_6$-$C_{20}$ aryl or $C_7$-$C_{20}$ aralkyl group.

With acid labile groups containing $R^{68}$ representative of a di- or poly-valent alkylene or arylene group as shown by formula (AL-12)-17, the polymer may be crosslinked within the molecule or between molecules. In formula (AL-12)-17, $R^{64}$ is as defined above, $R^{68}$ is a single bond, or a straight, branched or cyclic $C_1$-$C_{20}$ alkylene group or arylene group which may contain a heteroatom such as oxygen, sulfur or nitrogen, and b6 is an integer of 0 to 3. Formula (AL-12)-17 is applicable to all the foregoing acid labile groups.

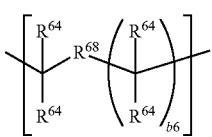

The groups represented by $R^{64}$, $R^{65}$, $R^{66}$ and $R^{67}$ may contain a heteroatom such as oxygen, nitrogen or sulfur. Such groups are exemplified by the following formulae (AL-13)-1 to (AL-13)-7.

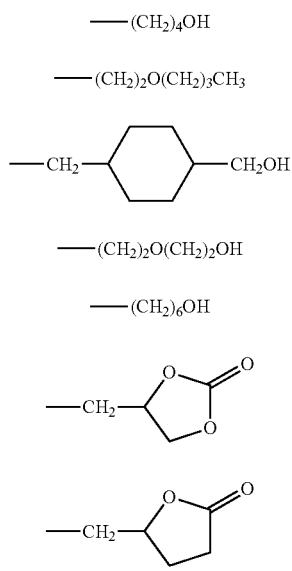

While the polymer used herein preferably includes recurring units (a1) of formula (1), and optionally recurring units (a2) of formula (2) and acid labile group-containing recurring units (b1) to (b4) of formula (3), it may have further copolymerized therein recurring units (c) derived from a monomer having an adhesive group such as hydroxyl, cyano, carbonyl, ester, ether, lactone ring, carboxyl, carboxylic anhydride, sulfonic acid ester, disulfone, and carbonate group. Inter alia, monomers having a lactone ring as the adhesive group are most preferred.

Examples of monomers from which recurring units (c) are derived are given below.

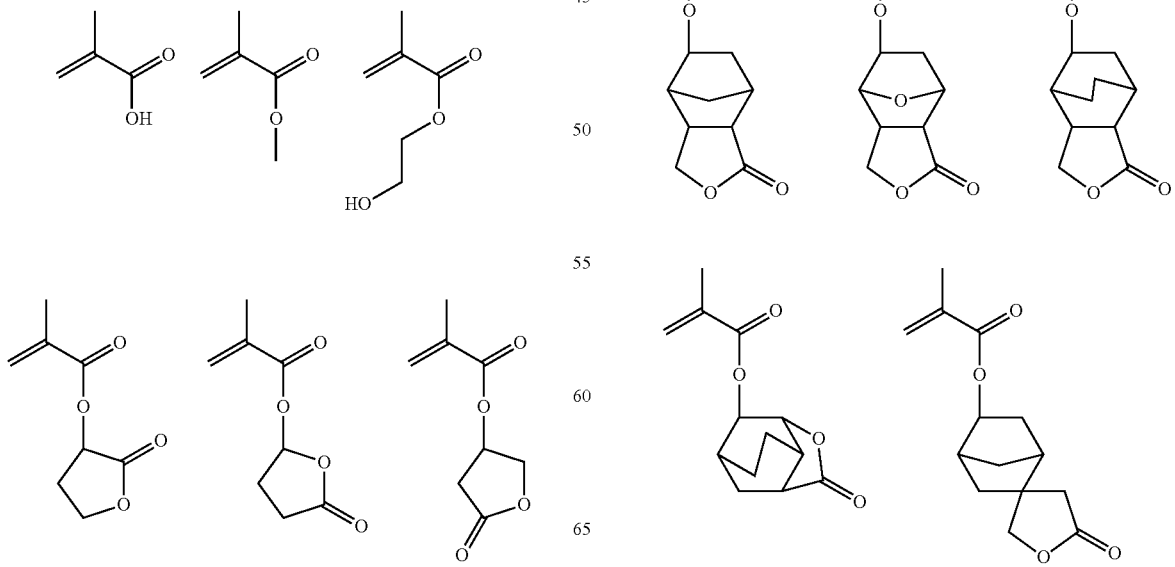

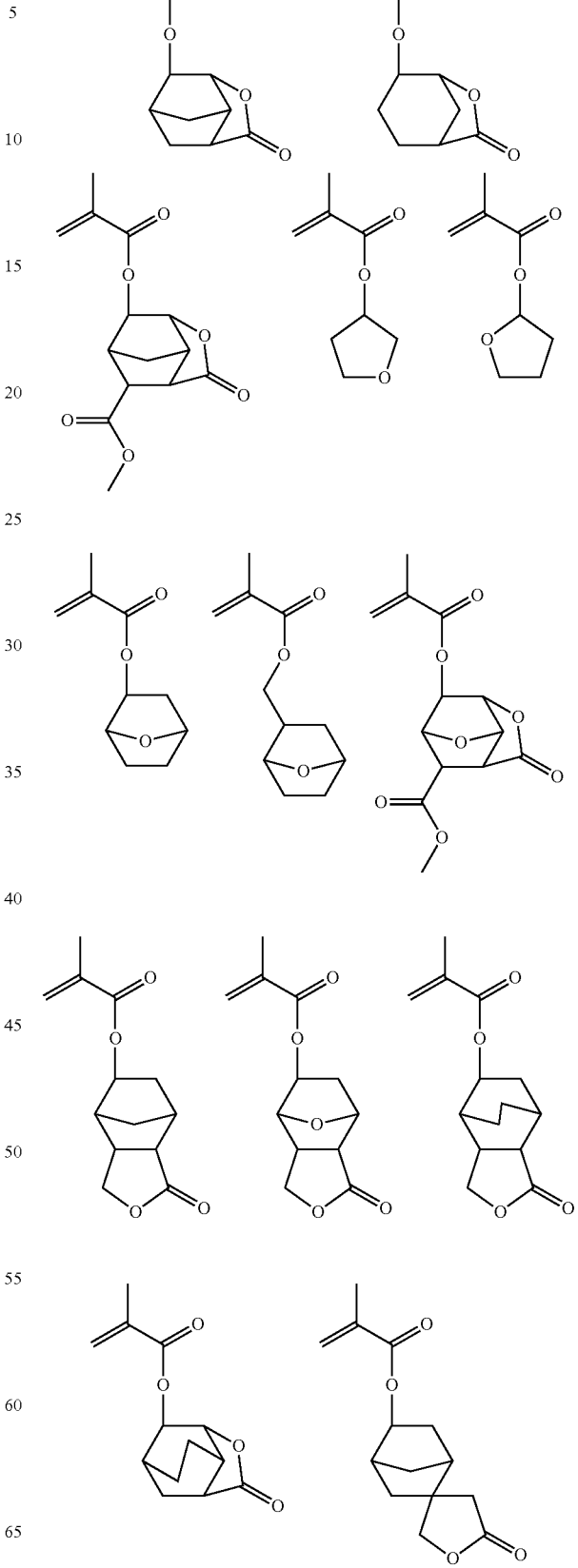

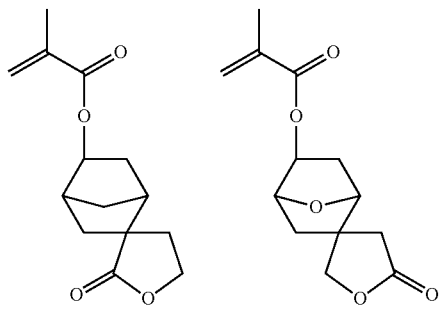
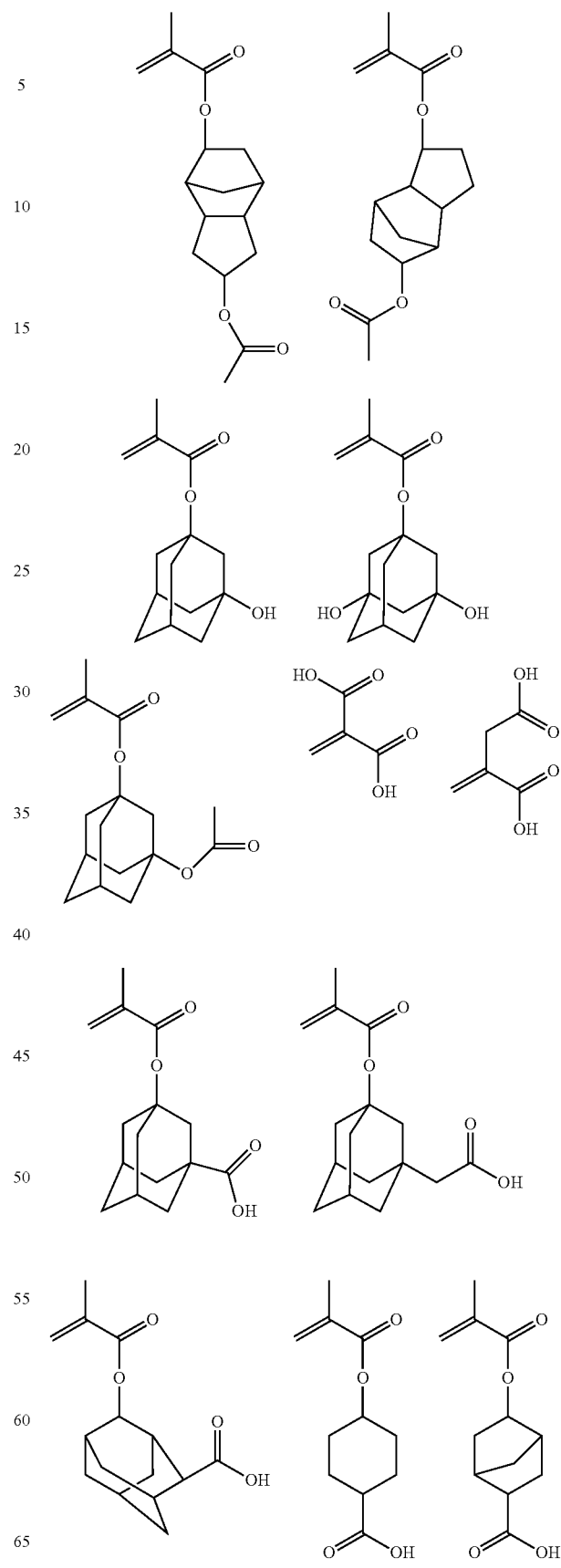

71
-continued
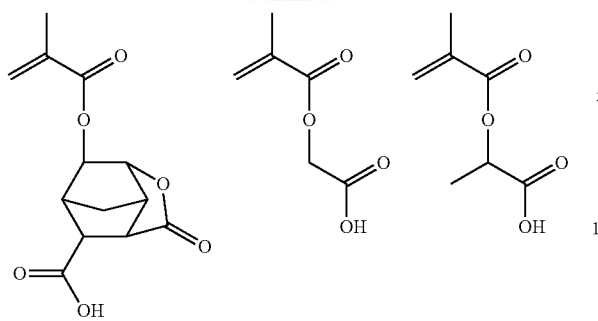
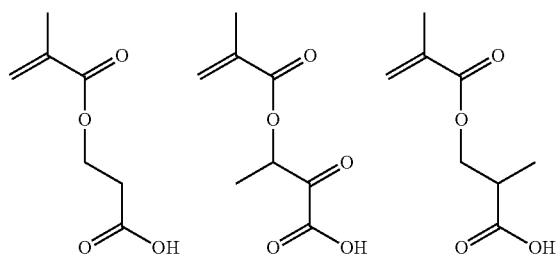
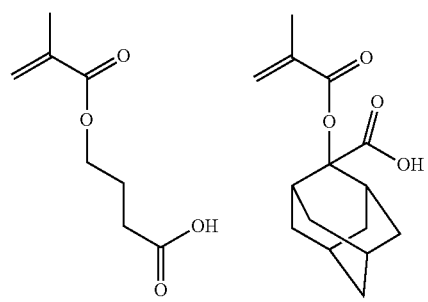
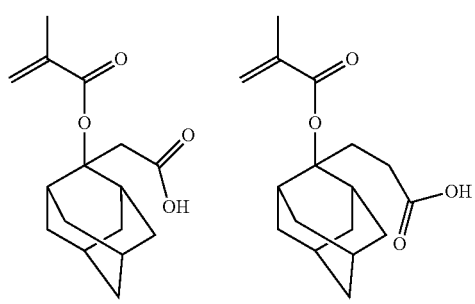
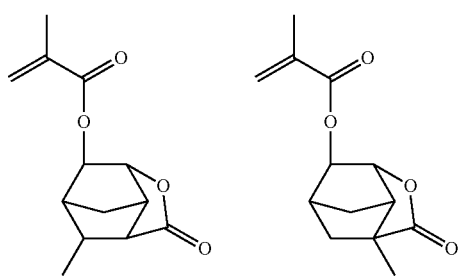
72
-continued
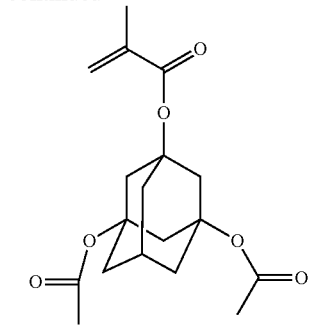
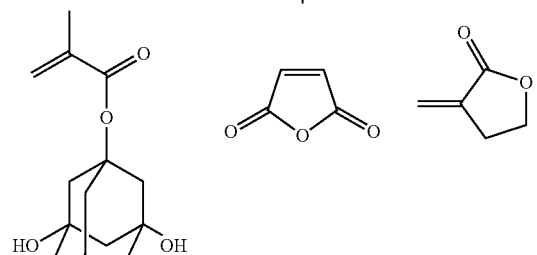
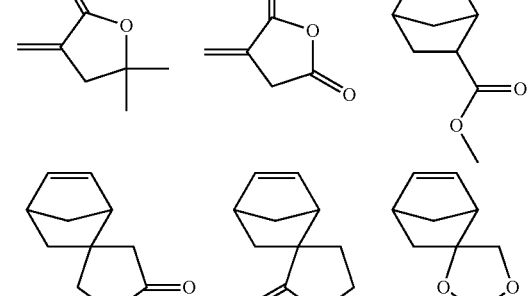
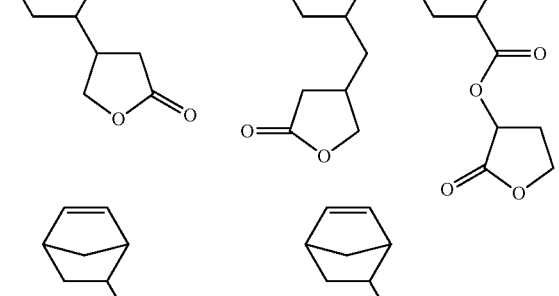
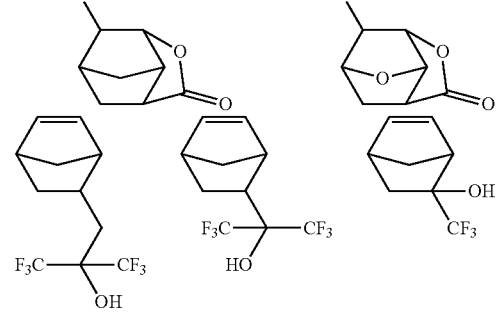

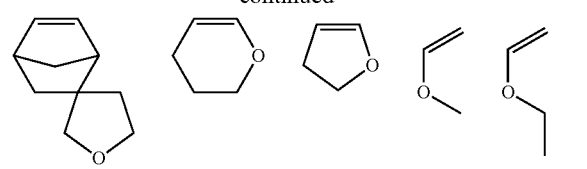
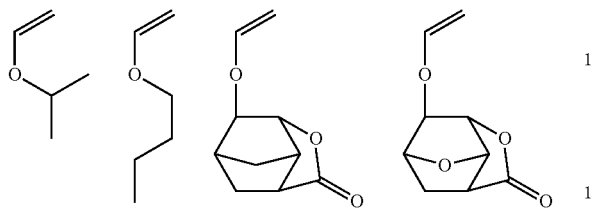
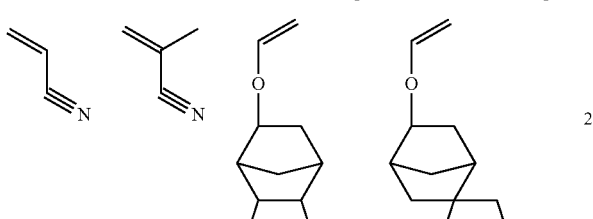
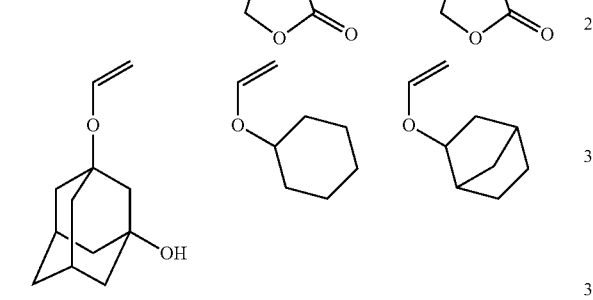
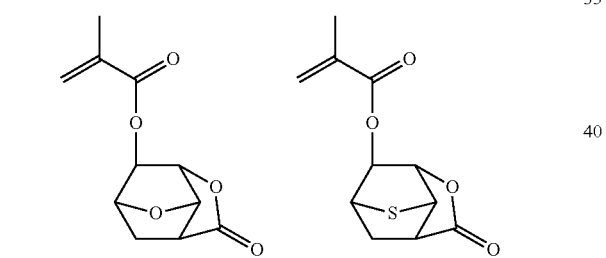
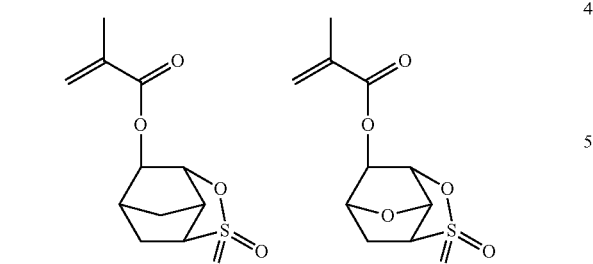
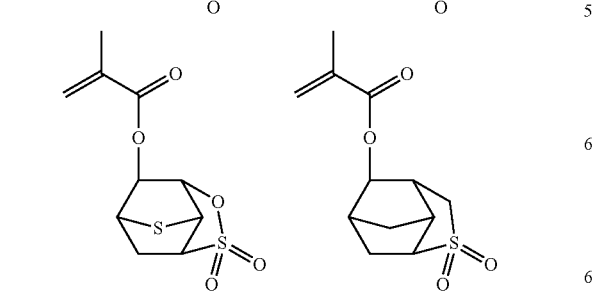
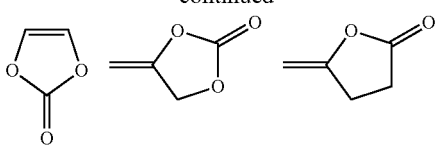
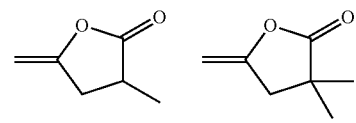
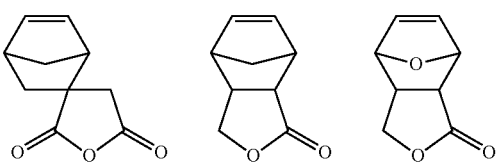
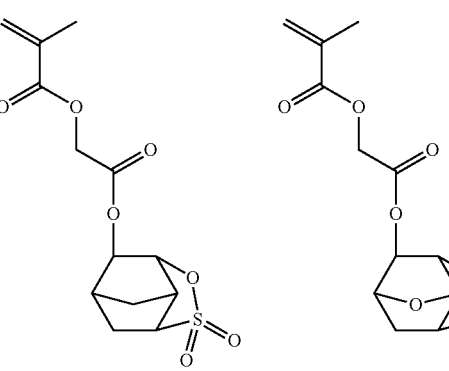
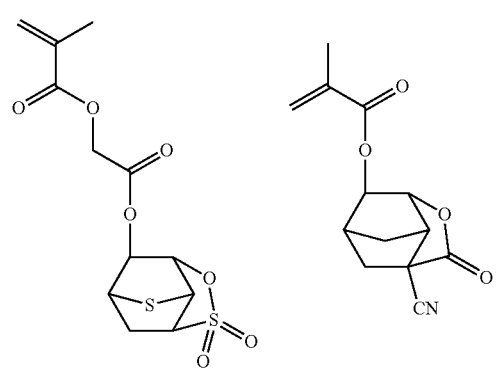
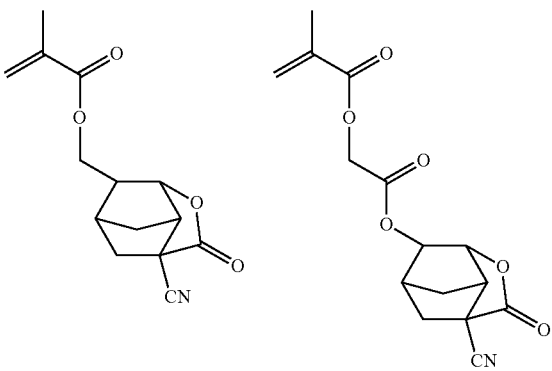

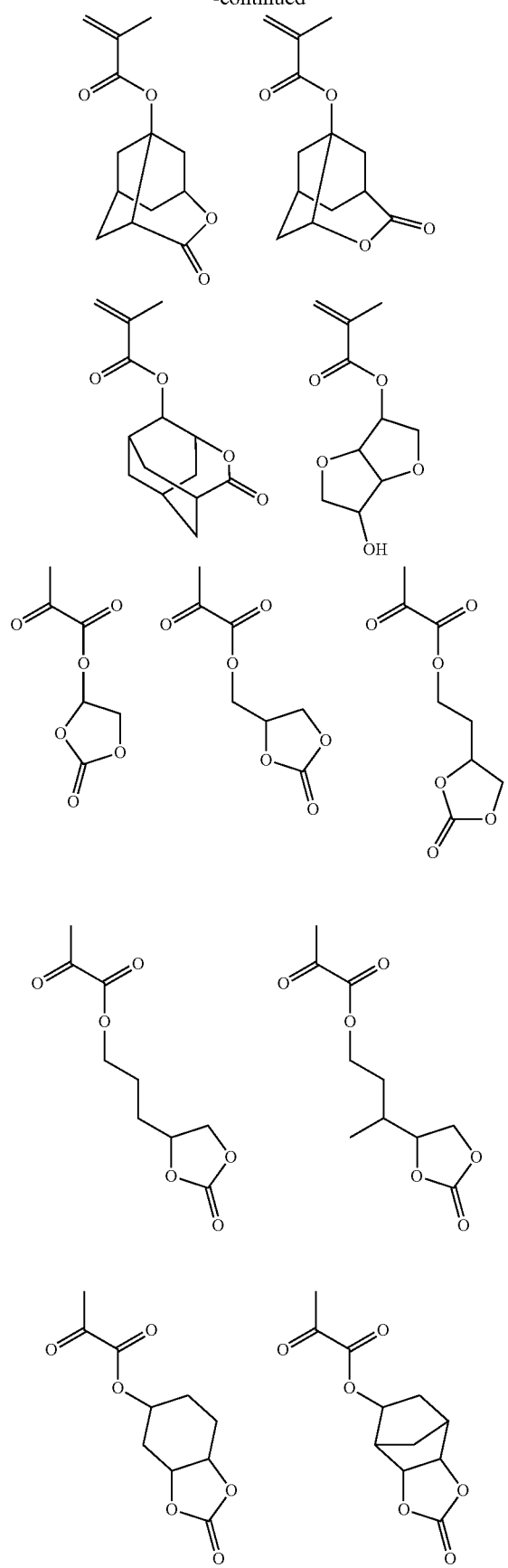
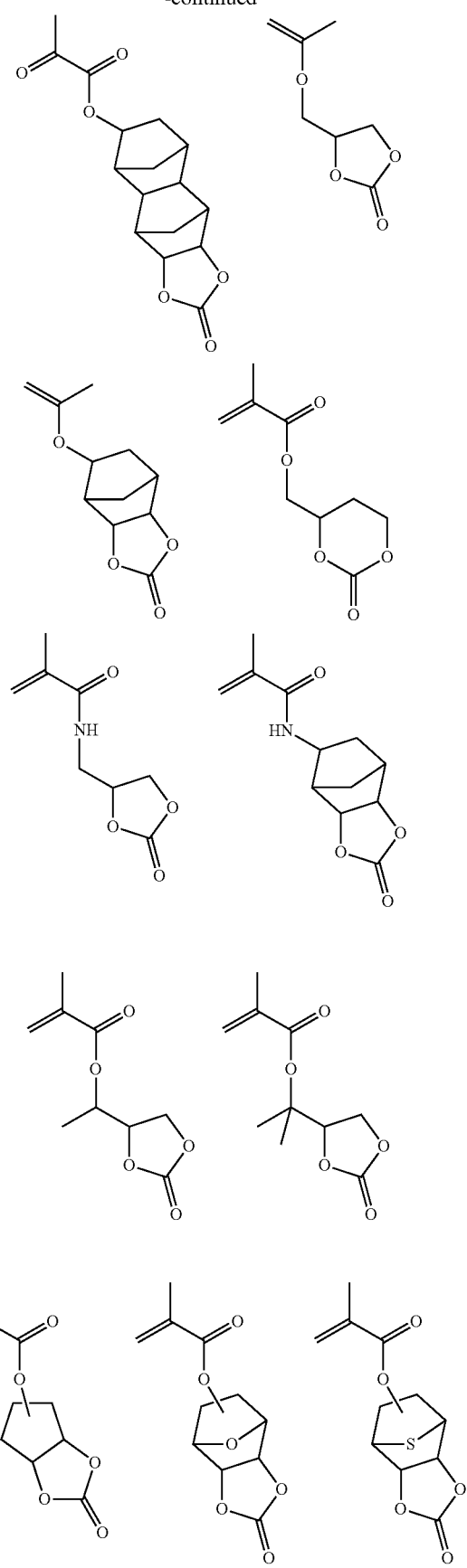

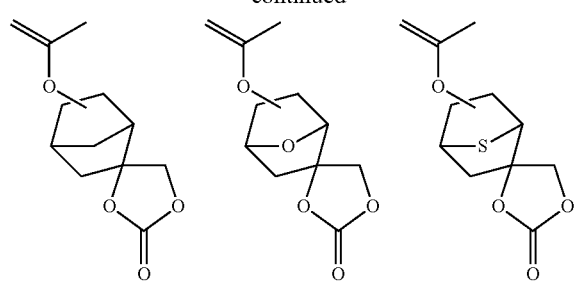
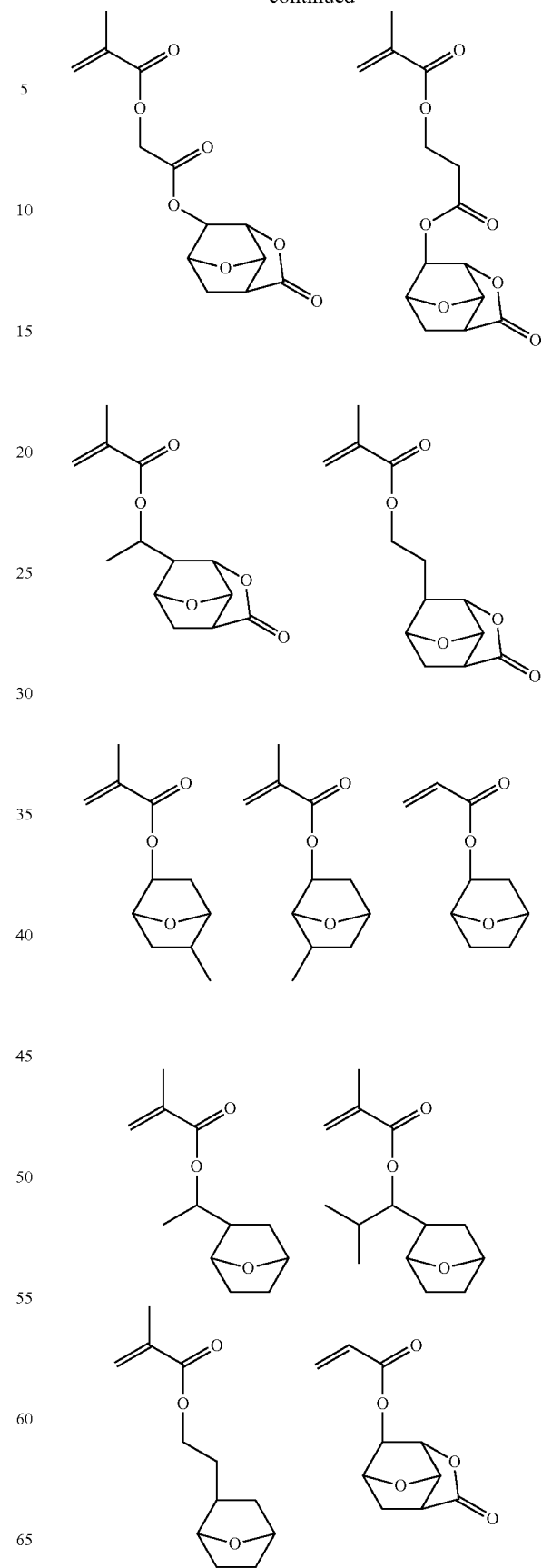

79
-continued
80
-continued
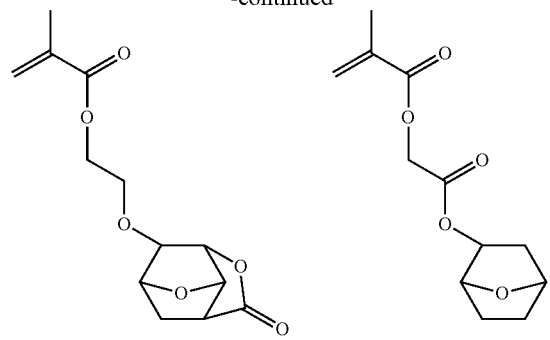
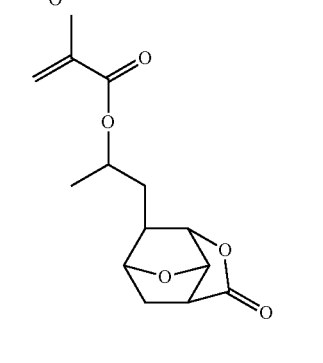
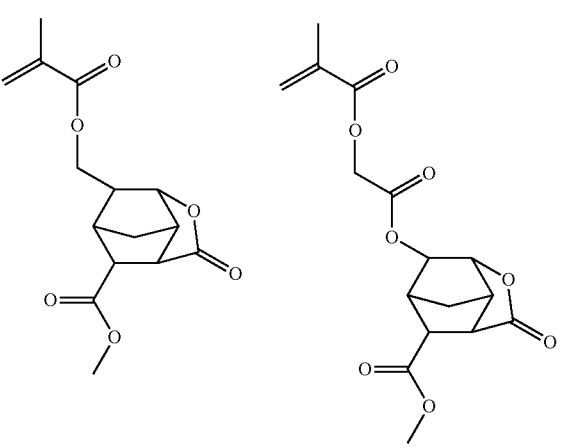
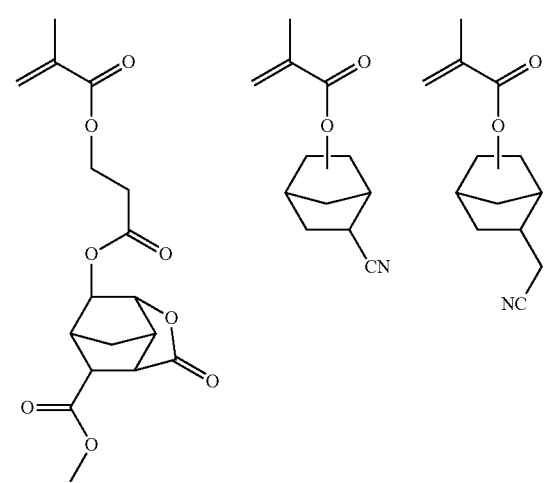
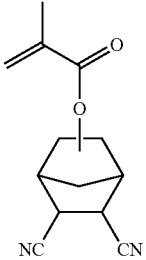
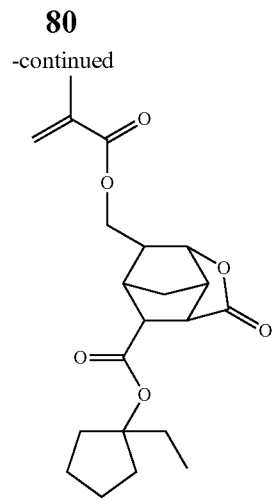

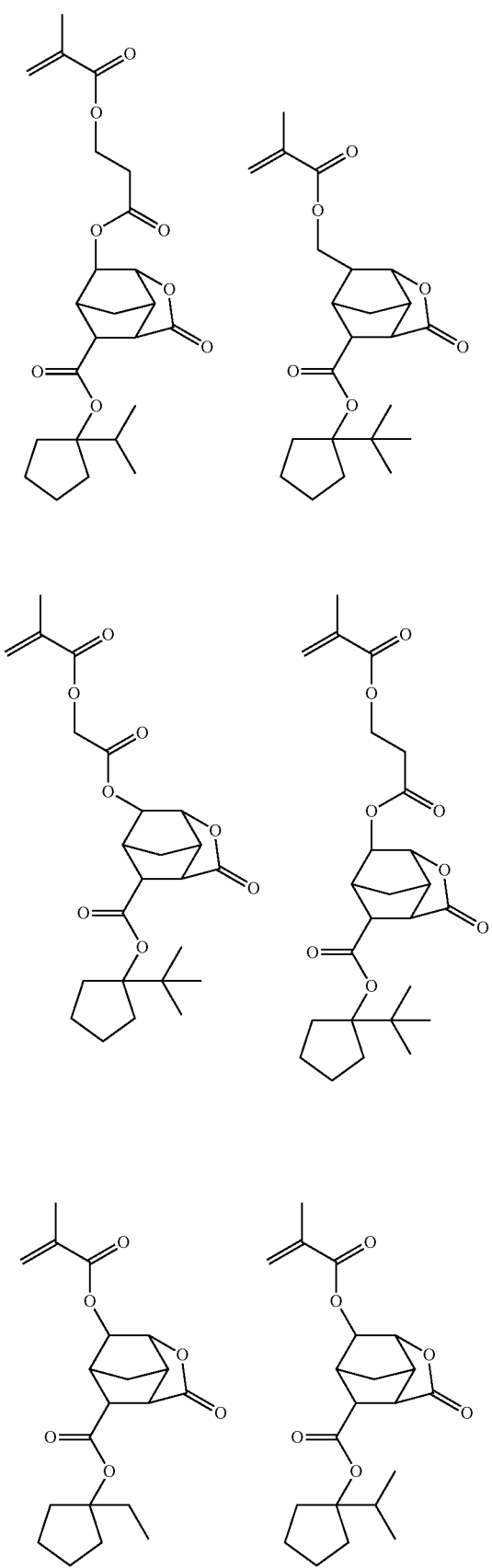
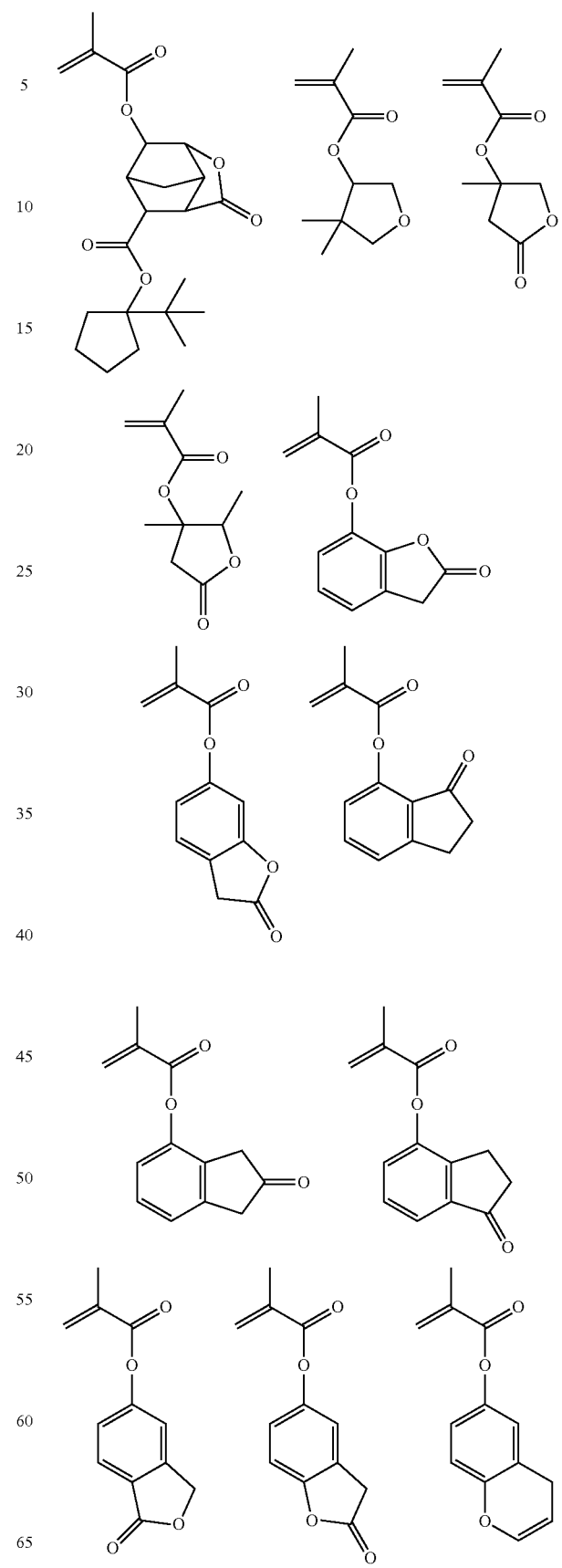

-continued
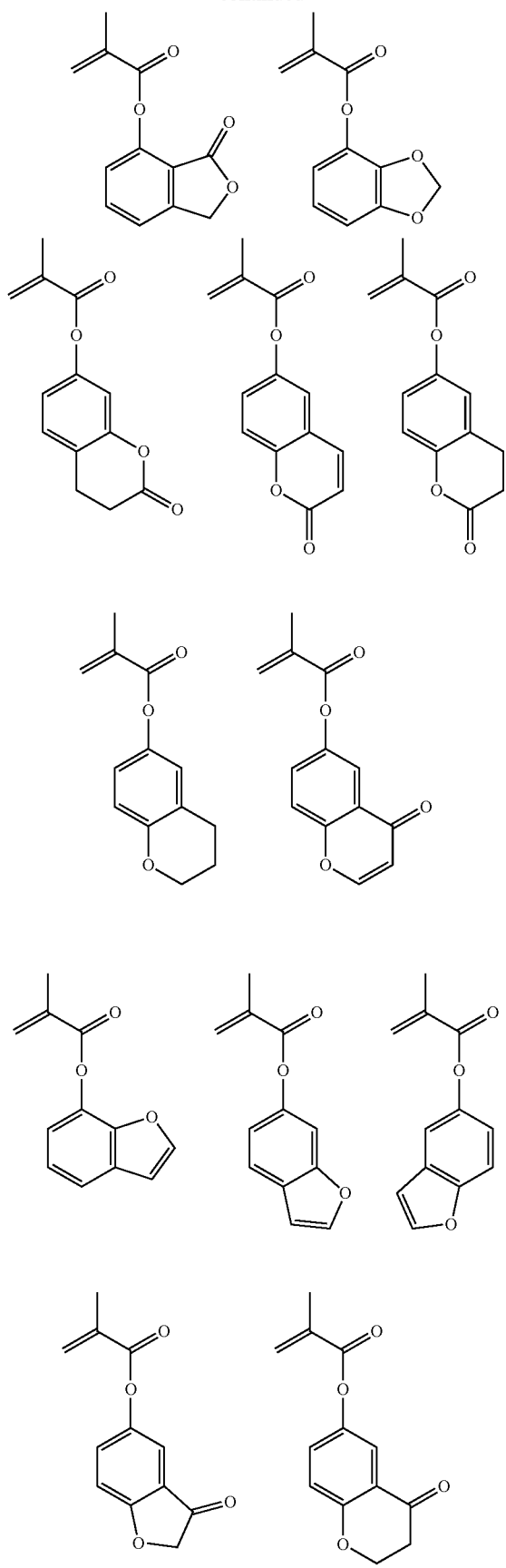
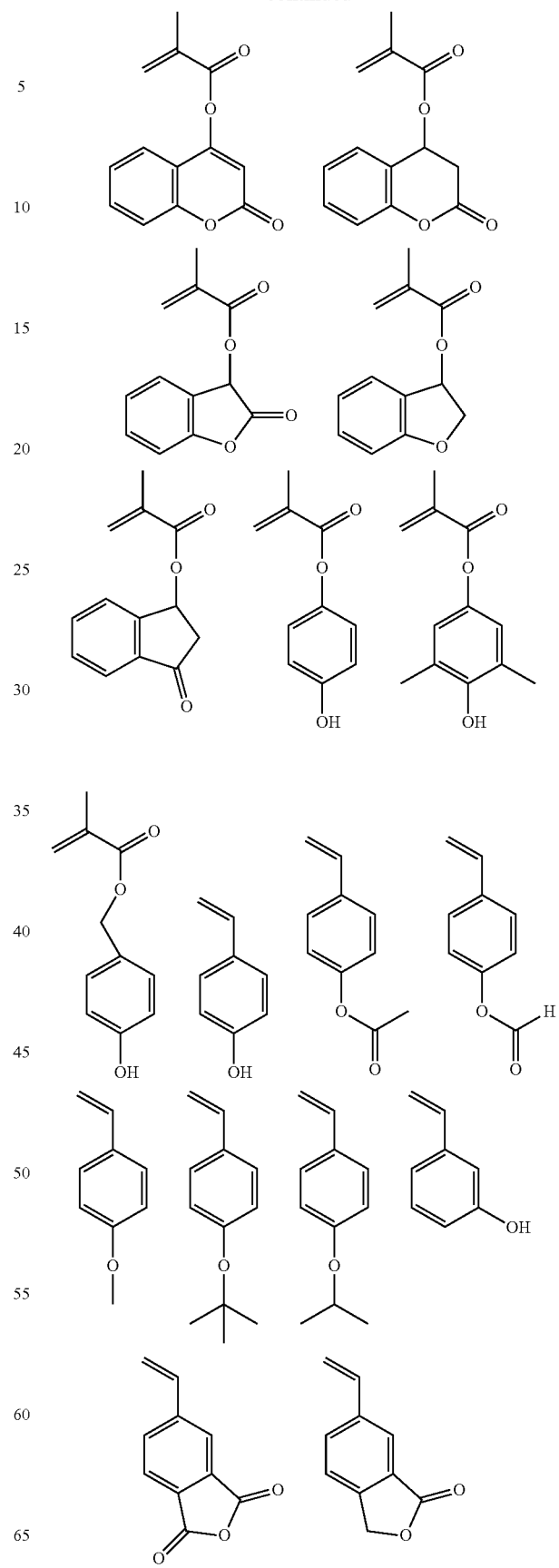

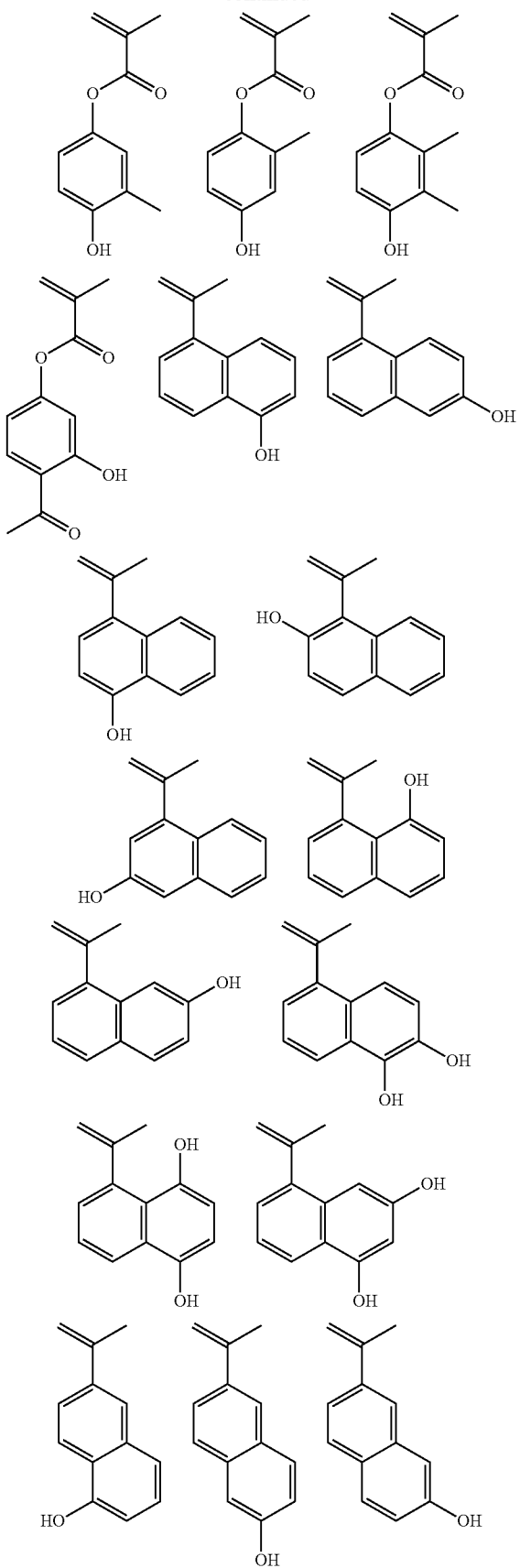
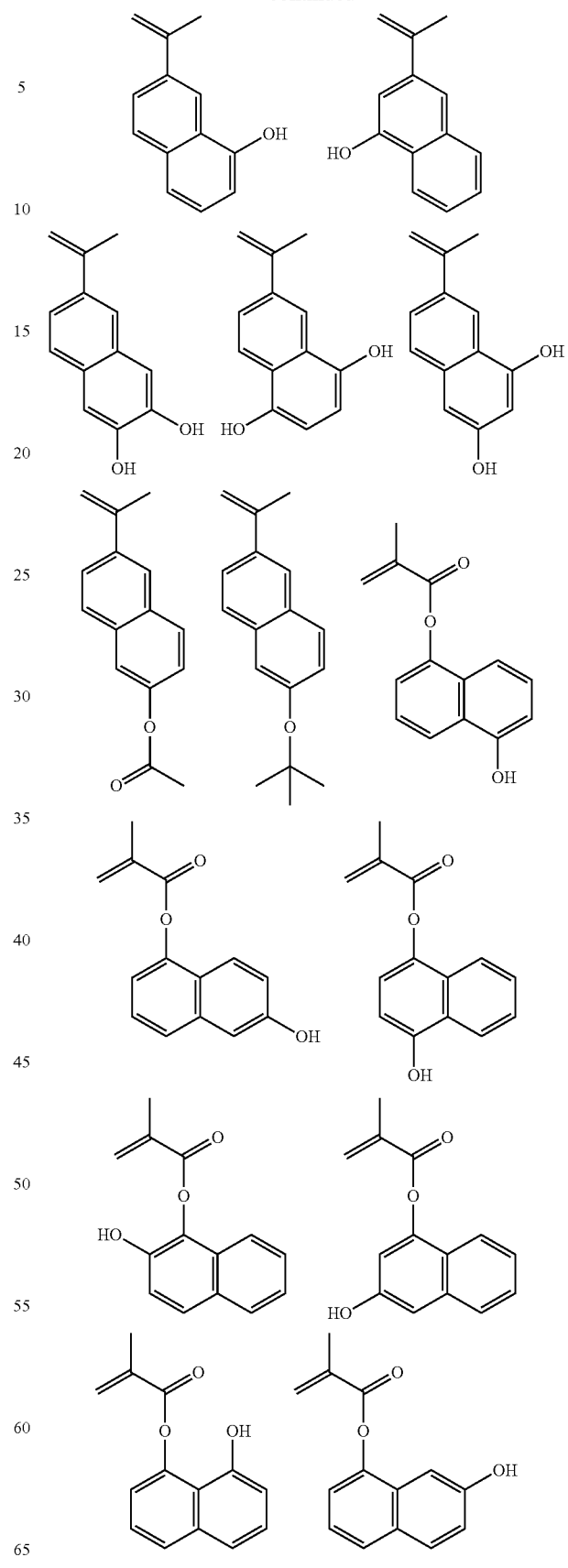

87
-continued
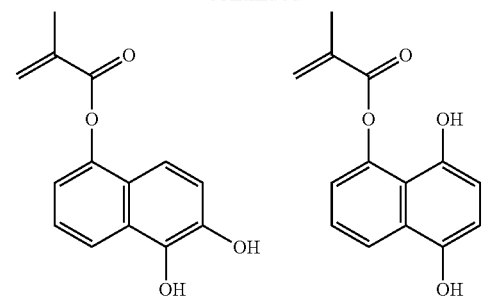
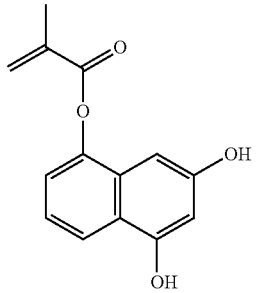 [SMILES: C=C(C)C(=O)Oc1cccc2c(O)cc(O)cc12]
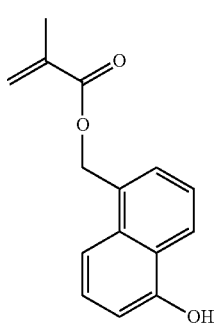
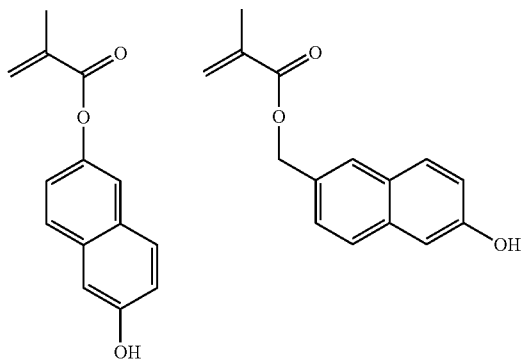
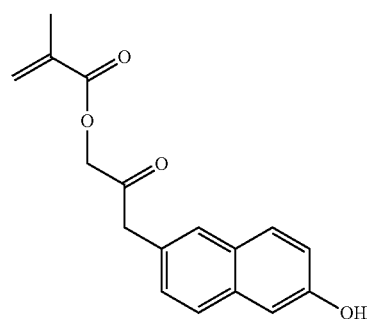
88
-continued
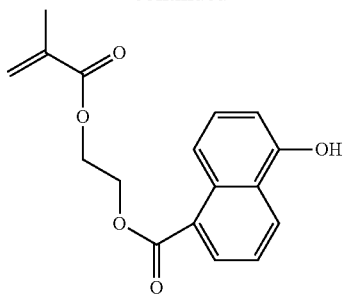
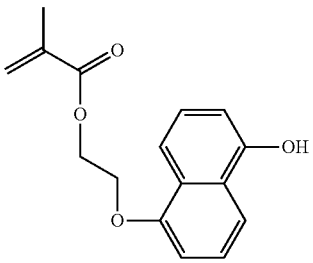
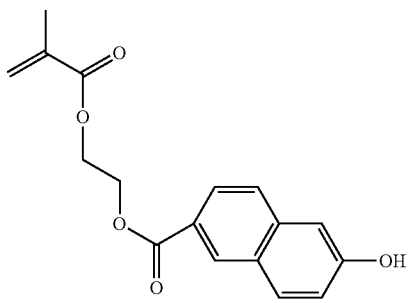
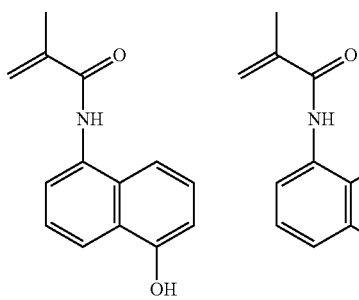
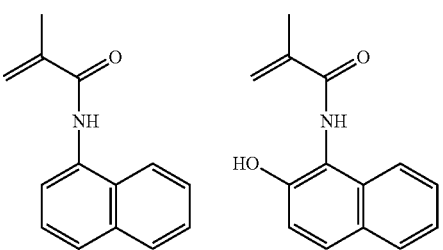
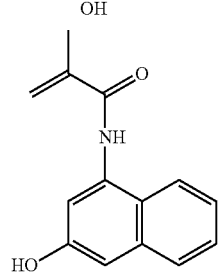

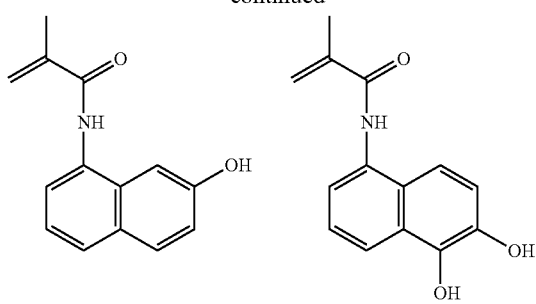
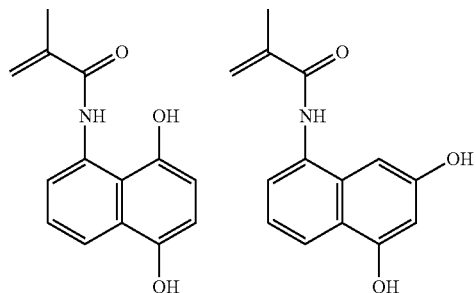
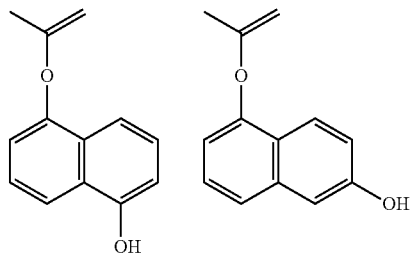
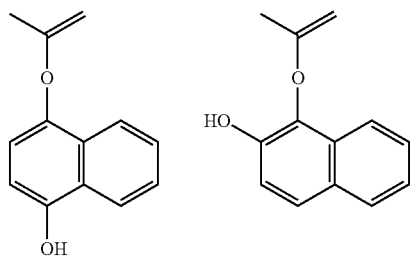
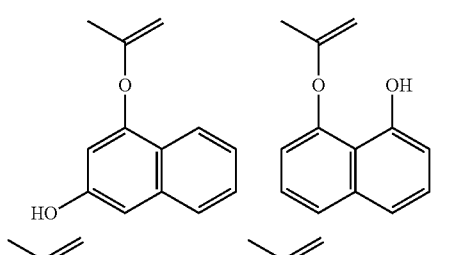
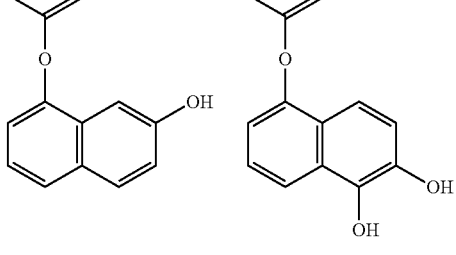
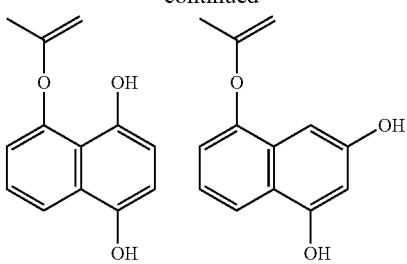
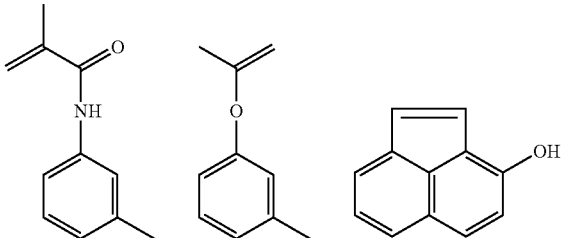
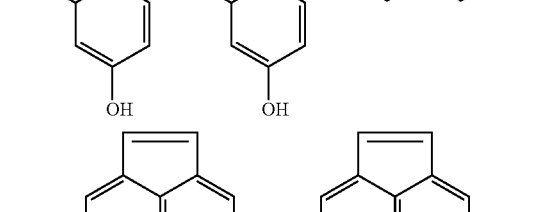
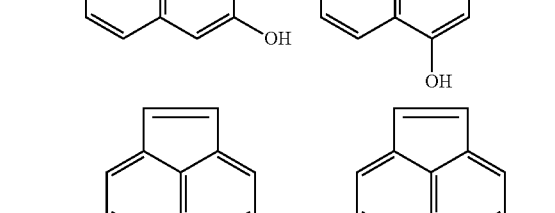
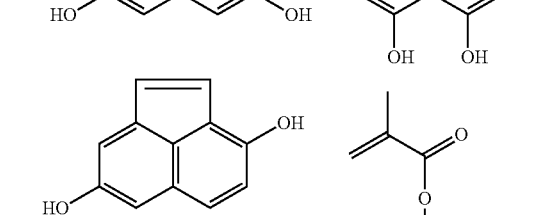
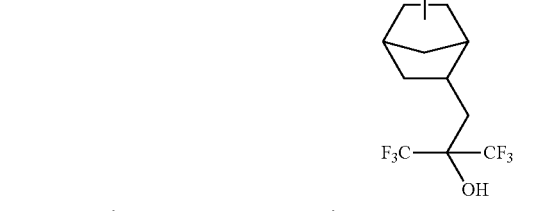
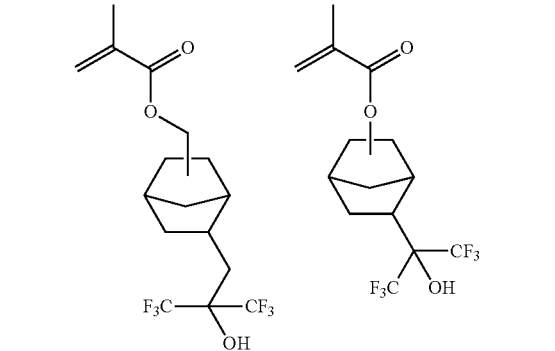

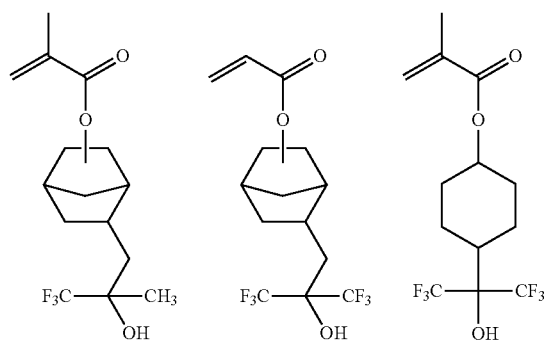
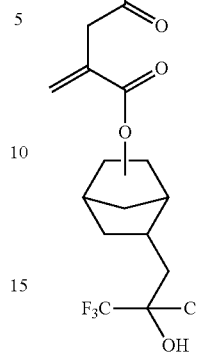
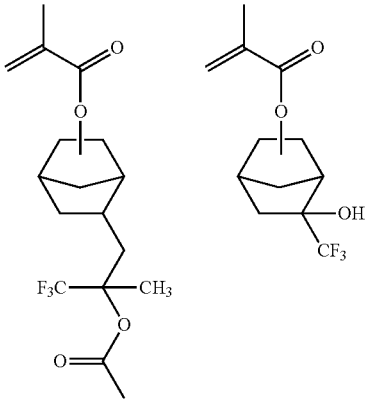
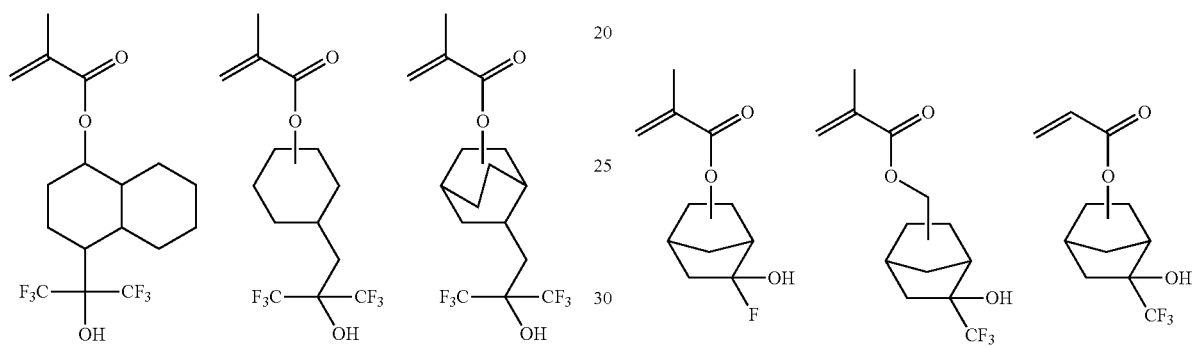
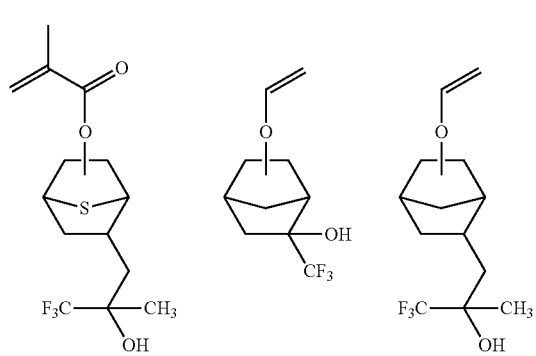
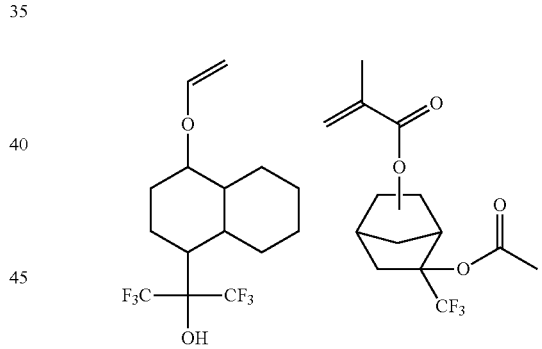
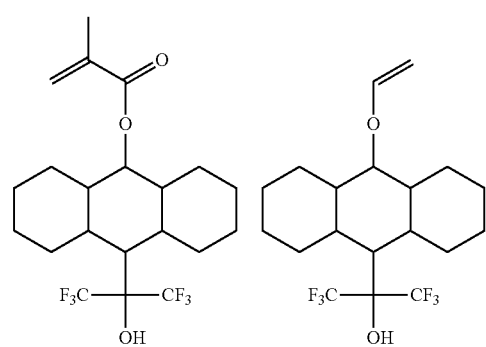
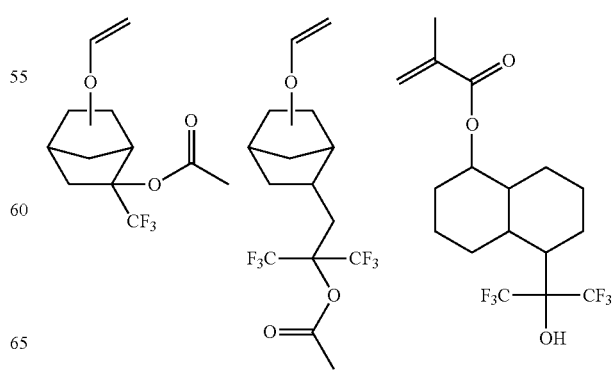

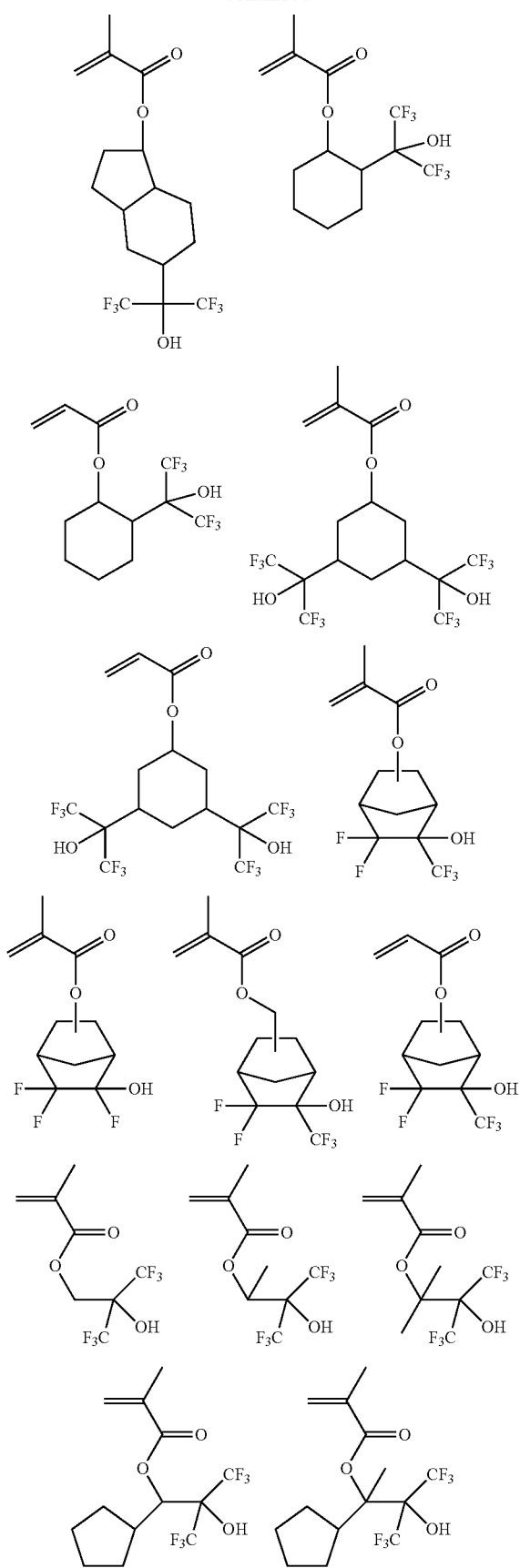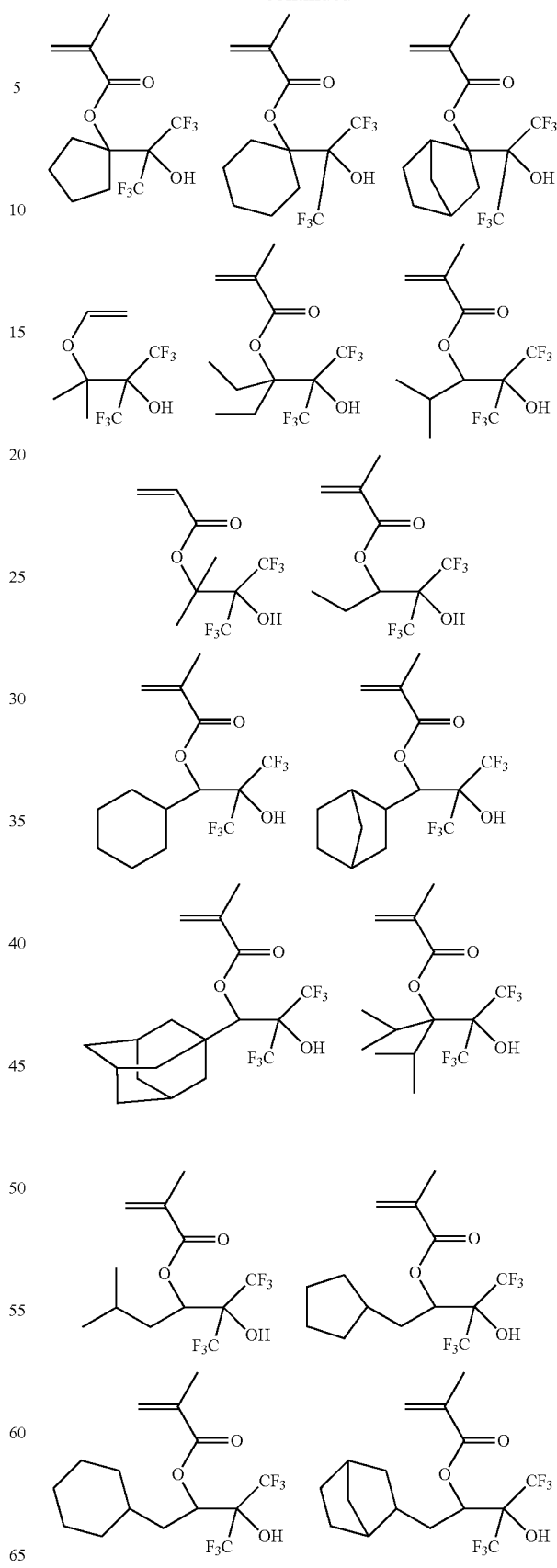

95
-continued
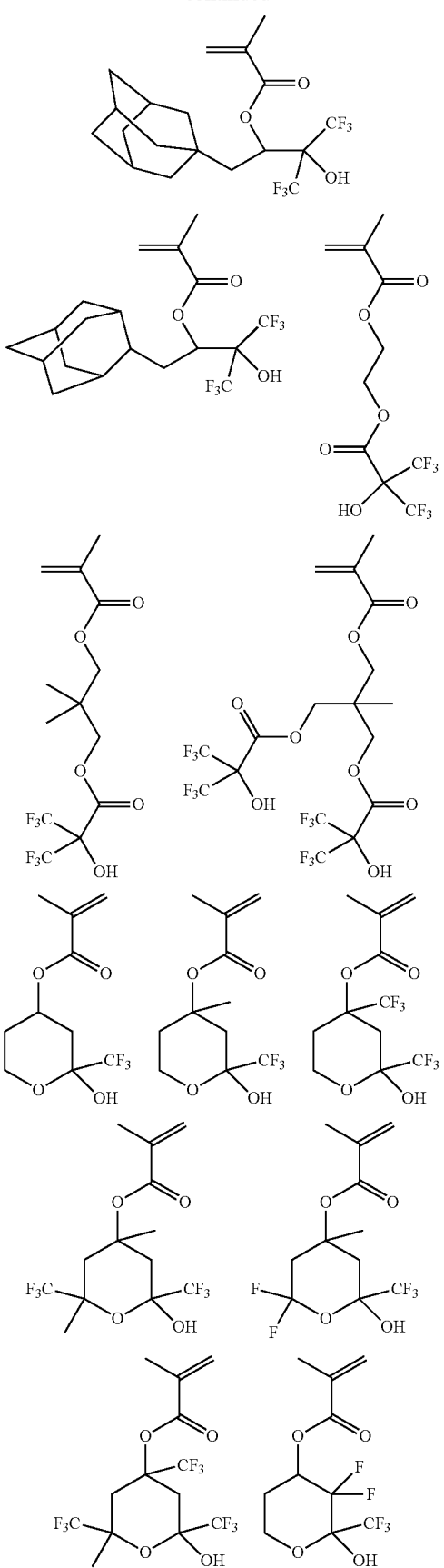
96
-continued
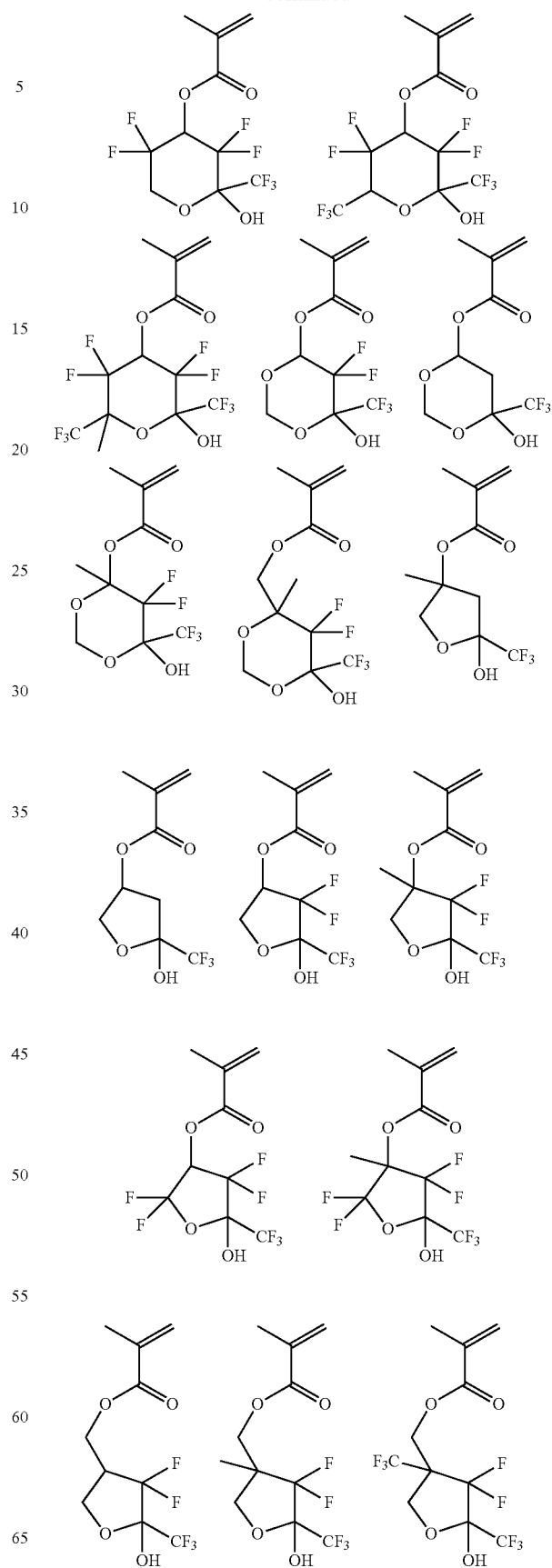

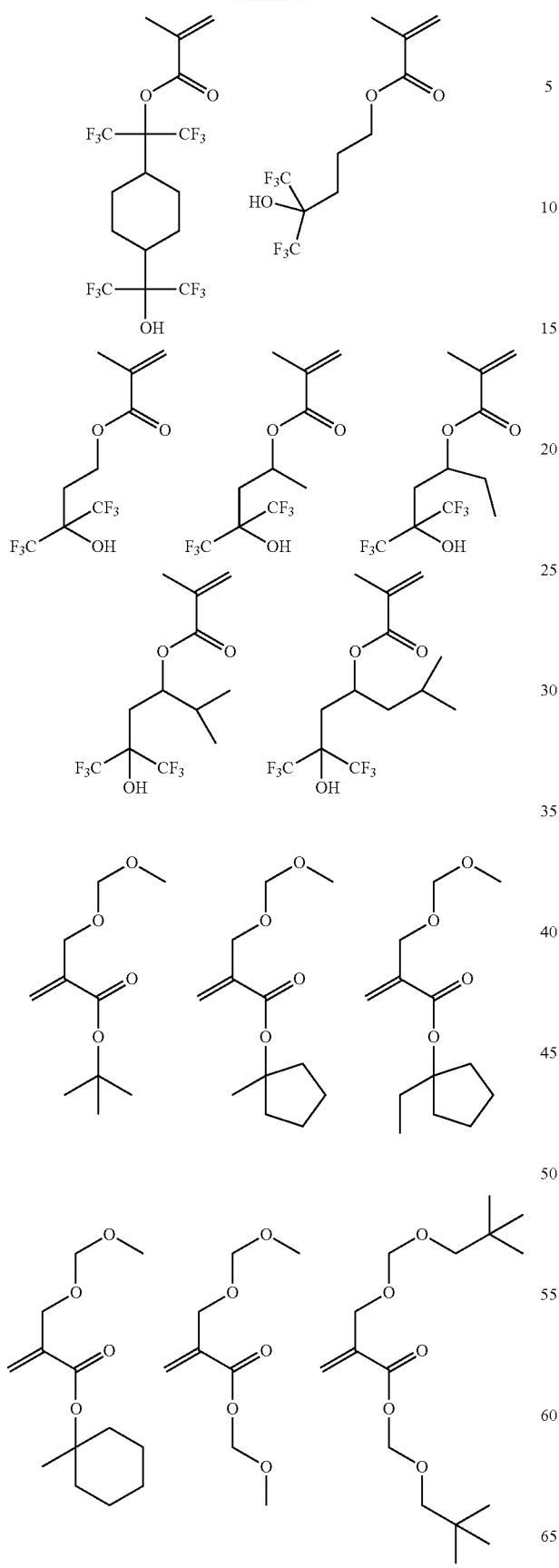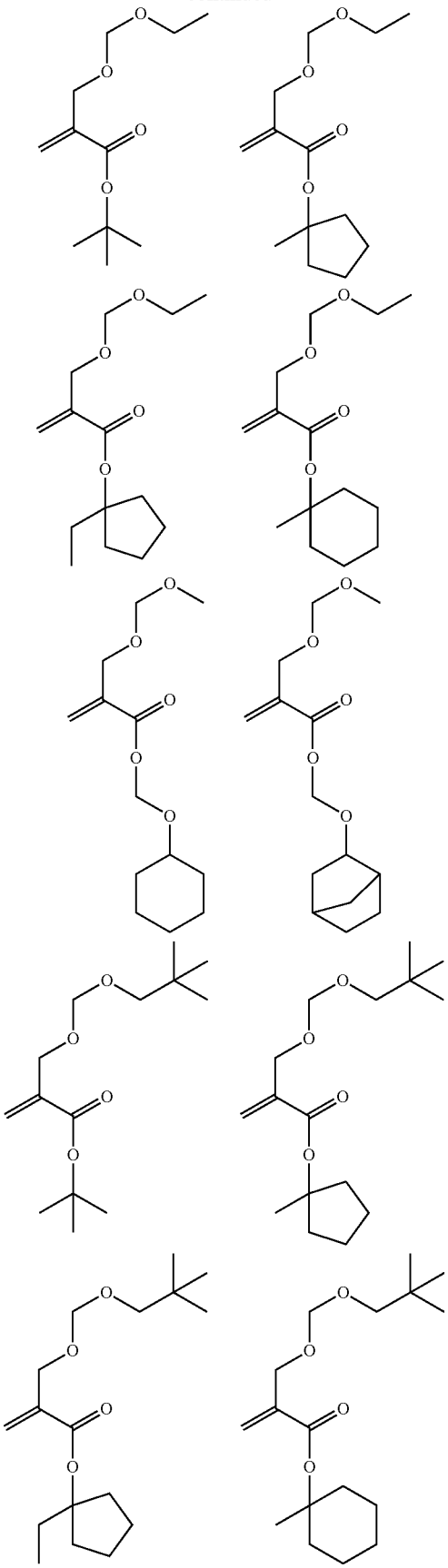

-continued

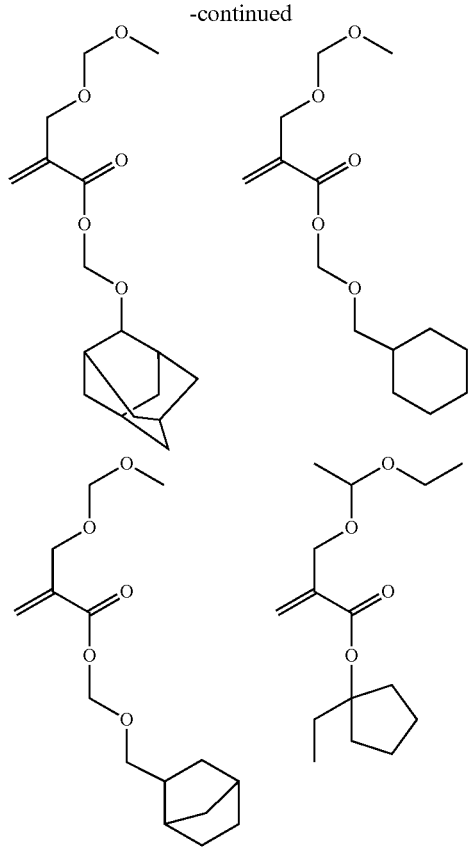

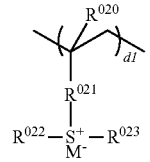

(d1)

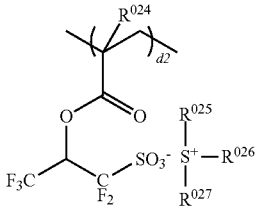

(d2)

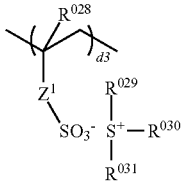

(d3)

Herein $R^{020}$, $R^{024}$, and $R^{028}$ each are hydrogen or methyl; $R^{021}$ is a single bond, phenylene, —O—$R^{033}$—, or —C(=O)—Y—$R^{033}$—, wherein Y is oxygen or NH and $R^{033}$ is a straight, branched or cyclic $C_1$-$C_6$ alkylene group, alkenylene group or phenylene group, which may contain a carbonyl (—CO—), ester (—COO—), ether (—O—), or hydroxyl moiety. $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group. $Z^1$ is a single bond, methylene, ethylene, phenylene, fluorinated phenylene, —O—$R^{032}$—, or —C(=O)—$Z^2$—$R^{032}$—, wherein $Z^2$ is oxygen or NH, and $R^{032}$ is a straight, branched or cyclic $C_1$-$C_6$ alkylene group, alkenylene group or phenylene group, which may contain a carbonyl, ester, ether or hydroxyl moiety. M is a non-nucleophilic counter ion; d1 to d4 are in the range: $0 \le d1 \le 0.3$, $0 \le d2 \le 0.3$, $0 \le d3 \le 0.3$, and $0 \le d1+d2+d3 \le 0.3$.

Besides the recurring units described above, the polymer may have further copolymerized therein additional recurring units, for example, recurring units (e) having a non-leaving hydrocarbon group as described in JP-A 2008-281980. Examples of the non-leaving hydrocarbon group other than those described in JP-A 2008-281980 include indene, acenaphthylene, and norbornadiene derivatives. Copolymerization of recurring units (e) having a non-leaving hydrocarbon group is effective for improving the dissolution of the polymer in organic solvent-based developer.

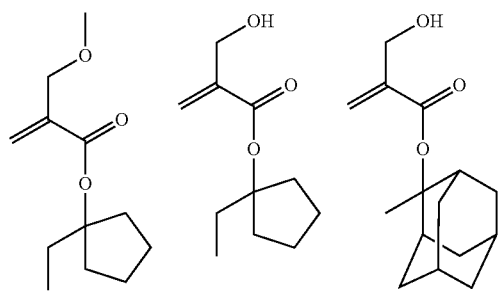

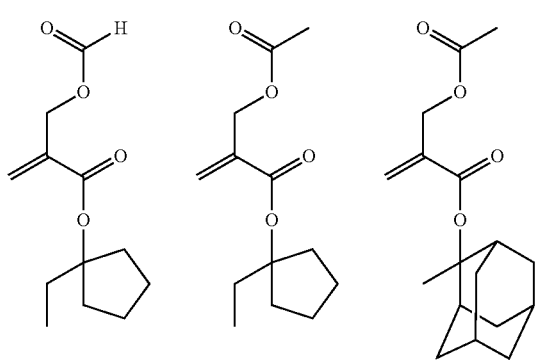

In a preferred embodiment, the polymer has further copolymerized therein recurring units of at least one type selected from sulfonium salt units (d1) to (d3) represented by the general formulae below.

It is also possible to incorporate recurring units (f) having an oxirane or oxetane ring into the polymer. Where recurring units (f) having an oxirane or oxetane ring are copolymerized in the polymer, the exposed region of resist film will be crosslinked, leading to improvements in film retention of the exposed region and etch resistance. Examples of the recurring units (f) having an oxirane or oxetane ring are given below wherein $R^{41}$ is hydrogen or methyl.

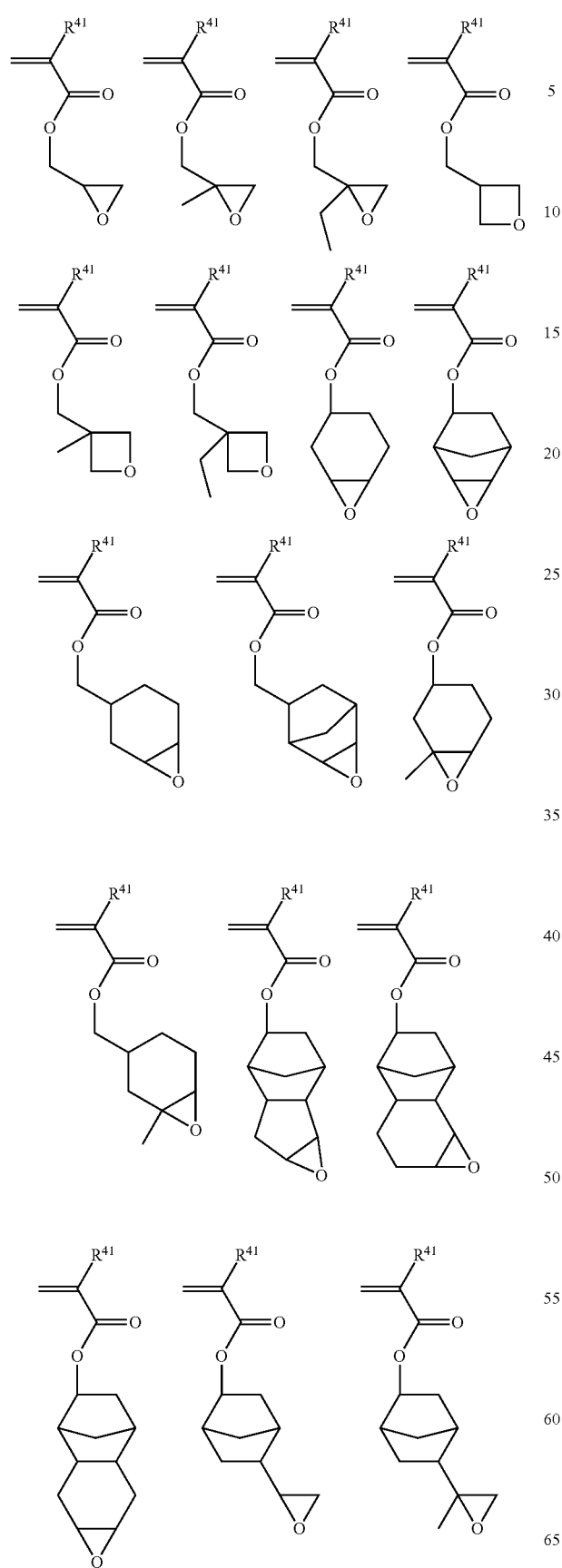
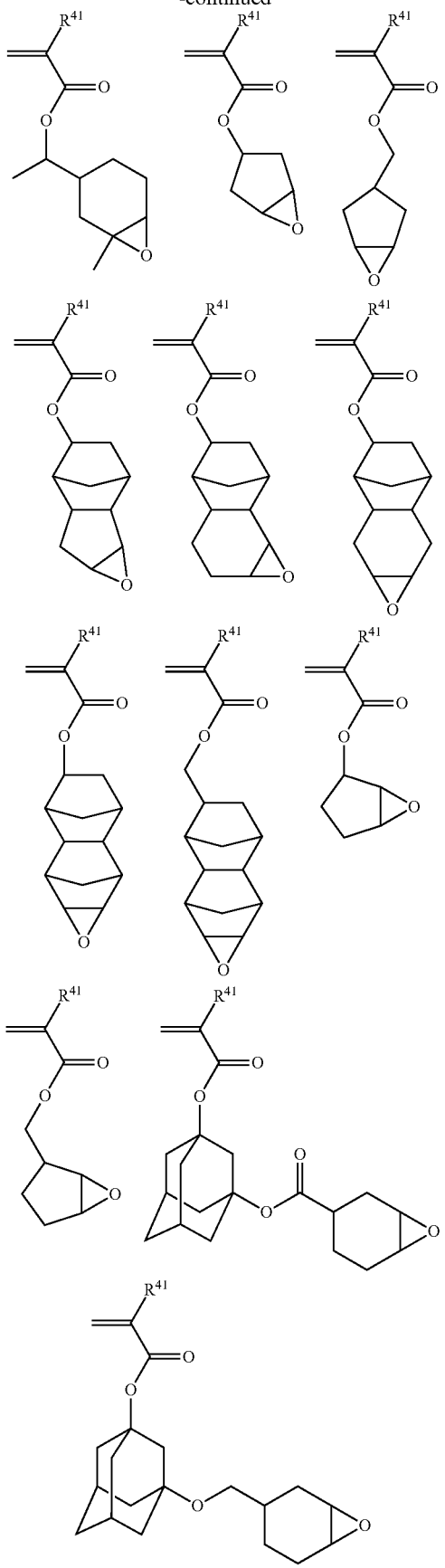

103
-continued
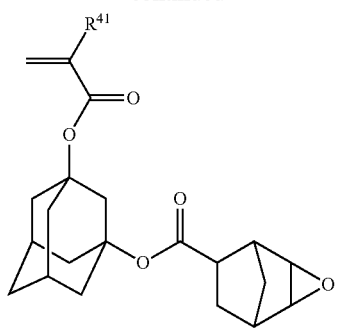
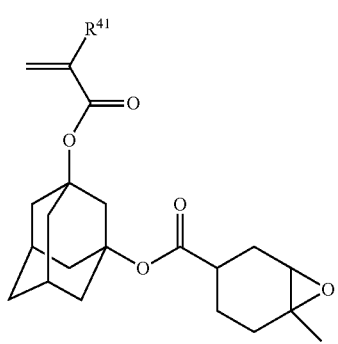
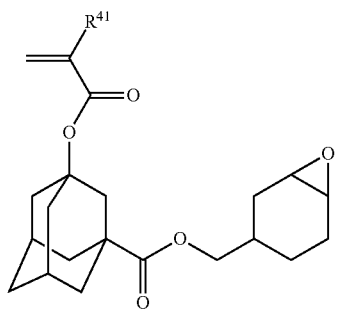
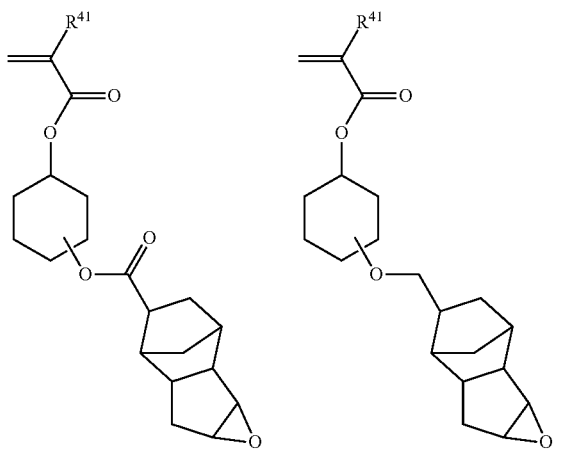
104
-continued
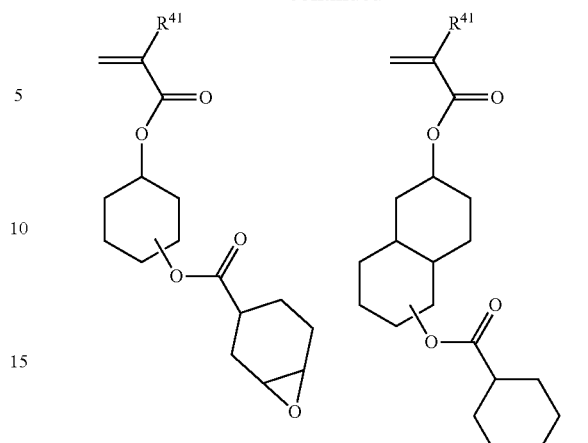
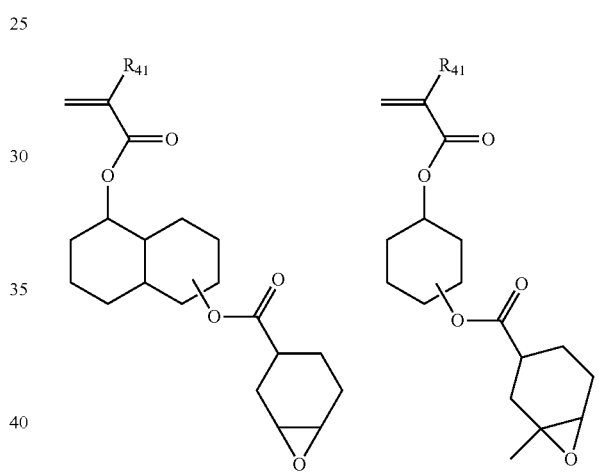
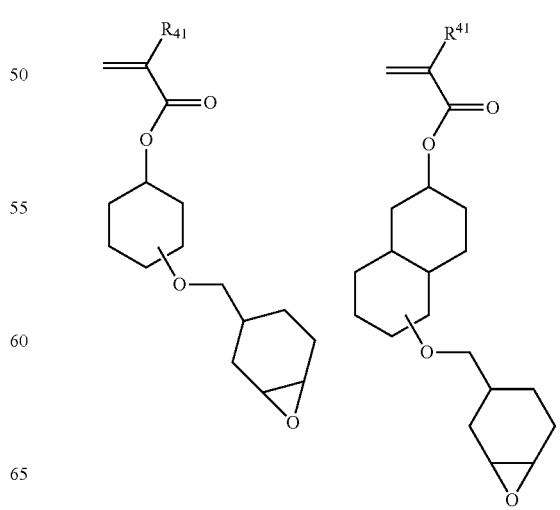

-continued

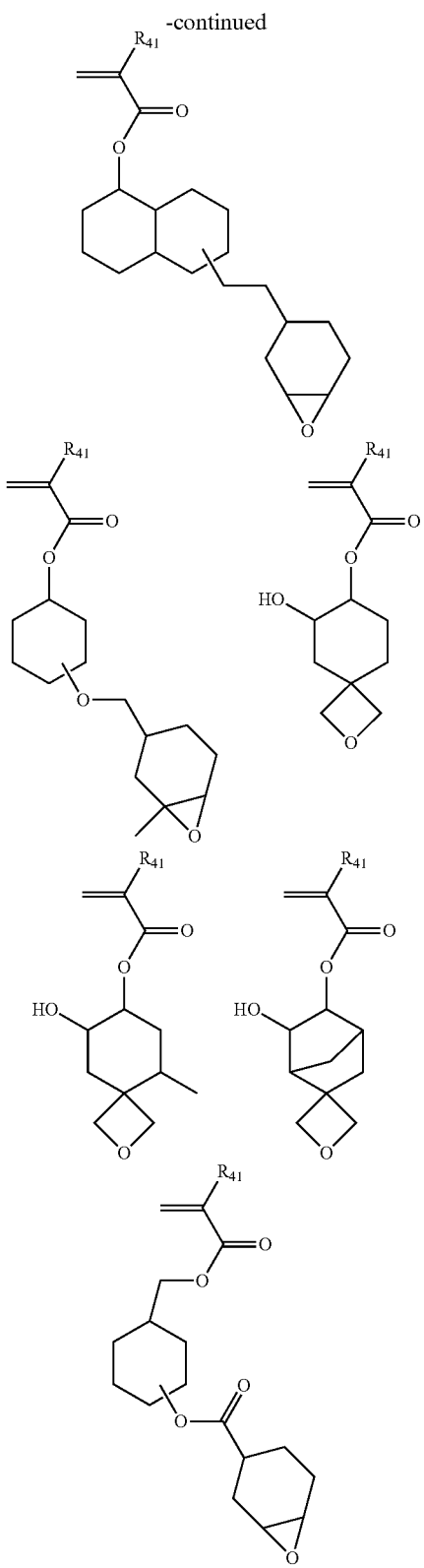

Appropriate molar fractions of individual recurring units (a1), (a2), (b1), (b2), (b3), (b4), (c), (d1), (d2), (d3), (e), and (f) incorporated in the polymer are in the range: 0<a1<1.0, 0≤a2<1.0, 0≤b1<1.0, 0≤b2<1.0, 0≤b3<1.0, 0≤b4<1.0, 0≤a2+b1+b2+b3+b4<1.0, 0<c<1.0, 0≤d1≤0.3, 0≤d2≤0.3, 0≤d3≤0.3, 0≤d1+d2+d3≤0.3, 0≤e≤0.4, and 0≤f≤0.6;

preferably 0.1≤a1≤0.9, 0≤a2≤0.9, 0.1≤a1+a2≤0.9, 0≤b1≤0.9, 0≤b2≤0.9, 0≤b3≤0.9, 0≤b4≤0.9, 0.1≤a1+a2+b1+b2+b3+b4≤0.9, 0.1≤c≤0.9, 0≤d1≤0.2, 0≤d2≤0.2, 0≤d3≤0.2, 0≤d1+d2+d3≤0.2, 0≤e≤0.3, and 0≤f≤0.5, provided that a1+a2+b1+b2+b3+b4+c+d1+d2+d3+e+f=1.

The polymer serving as the base resin in the resist composition used in the pattern forming process of the invention should preferably have a weight average molecular weight (Mw) in the range of 1,000 to 500,000, and more preferably 2,000 to 30,000, as measured by GPC versus polystyrene standards using tetrahydrofuran solvent. With too low a Mw, a film thickness loss is likely to occur upon organic solvent development. A polymer with too high a Mw may lose solubility in organic solvent and have a likelihood of footing after pattern formation.

If a polymer has a wide molecular weight distribution or dispersity (Mw/Mn), which indicates the presence of lower and higher molecular weight polymer fractions, there is a possibility that following exposure, foreign matter is left on the pattern or the pattern profile is exacerbated. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

The polymer used herein may be synthesized by any desired method, for example, by dissolving unsaturated bond-containing monomers corresponding to the respective recurring units in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomer may be kept as such, or the product may be protected or partially protected after polymerization.

For example, a polymer comprising recurring units of formula (1) may be synthesized by using a polymerizable double bond-bearing ester compound of the general formula (1a) as the monomer, and effecting polymerization thereof.

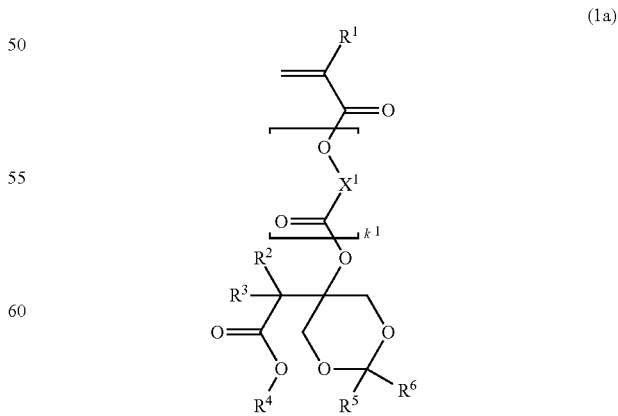

(1a)

Herein $R^1$ is hydrogen or methyl. $R^2$ and $R^3$ are each independently hydrogen, fluorine or a straight, branched or cyclic monovalent hydrocarbon group of 1 to 8 carbon atoms. $R^4$ is hydrogen or a straight, branched or cyclic monovalent hydrocarbon group of 1 to 20 carbon atoms in which a constituent —$CH_2$— may be substituted by —O— or —C(=O)—. $R^5$ and $R^6$ are each independently hydrogen or a straight, branched or cyclic monovalent hydrocarbon group of 1 to 8 carbon atoms, $R^5$ and $R^6$ may bond together to form a non-aromatic ring of 3 to 17 carbon atoms with the carbon atom to which they are attached. $X^1$ is a straight, branched or cyclic divalent hydrocarbon group of 1 to 20 carbon atoms in which a constituent —$CH_2$— may be substituted by —O— or —C(=O)—, and $k^1$ is 0 or 1.

Examples of the polymerizable monomer having formula (1a) include, but are not limited to, those illustrated on pages 18 to 21 as the recurring unit of formula (1), provided that partial structure (1aa) shown below is replaced by partial structure (1aaa) shown below. Herein $R^1$ is hydrogen or methyl.

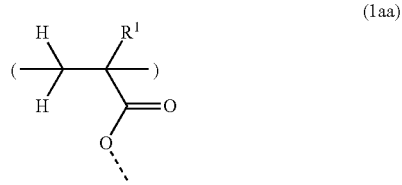
(1aa)

(1aaa)

The synthesis of the monomer having formula (1a) is not particularly limited. It may be synthesized by the optimum method selected depending on its structure. For example, the monomer may be synthesized as shown by the following scheme.

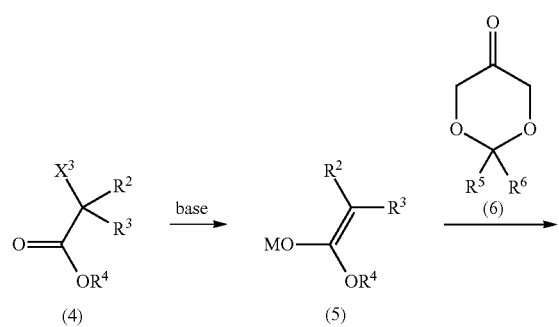

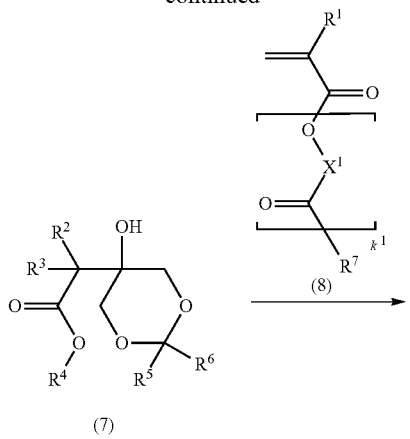
(7)

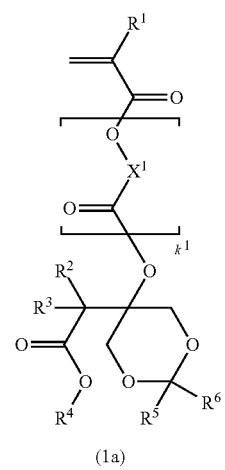
(1a)

Herein $R^1$ to $R^6$, $X^1$ and $k^1$ are as defined above. $R^7$ is halogen, hydroxyl or —$OR^8$ wherein $R^8$ is methyl, ethyl or a group of the following formula (9).

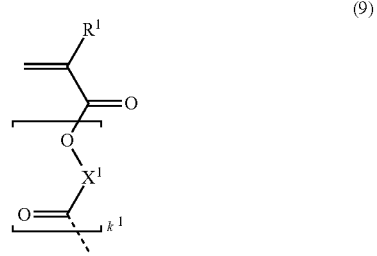
(9)

$X^3$ is hydrogen or halogen, M is Li, Na, K, MgY or ZnY, and Y is halogen.

First, a base acts on a corresponding acetate (where $X^3$ is hydrogen) or haloacetate (where $X^3$ is halogen) to form a metal enolate (5). Then nucleophilic addition reaction is effected between the metal enolate (5) and a carbonyl compound (6) to form an intermediate alcohol (7), which is in turn esterified to form the desired monomer (1a).

The bases used herein include metal amides such as sodium amide, potassium amide, lithium diisopropylamide, potassium diisopropylamide, lithium dicyclohexylamide, potassium dicyclohexylamide, lithium 2,2,6,6-tetramethylpiperidine, lithium bistrimethylsilylamide, sodium bistrimethylsilylamide, potassium bistrimethylsilylamide, lithium isopropylcyclohexylamide, and bromomagnesium diisopropylamide; alkoxides such as sodium methoxide, sodium ethoxide, lithium methoxide, lithium ethoxide, lithium tert-butoxide, and potassium tert-butoxide; inorganic hydroxides such as sodium hydroxide, lithium hydroxide, potassium hydroxide, barium hydroxide, and tetra-n-butylammonium hydroxide; inorganic carbonates such as sodium carbonate, sodium hydrogencarbonate, lithium carbonate and potassium carbonate; metal hydrides such as boranes, alkylboranes, sodium hydride, lithium hydride, potassium hydride, and calcium hydride; alkyl metal compounds such as trityl lithium, trityl sodium, trityl potassium, methyl lithium, phenyl lithium, sec-butyl lithium, tert-butyl lithium, and ethyl magnesium bromide; and metals such as lithium, sodium, potassium, magnesium, and zinc, but are not limited thereto. It is noted that reaction using haloacetate and zinc is known as Reformatsky reaction.

The intermediate, carbonyl compound (6) may be readily prepared by the method described in Synthesis, No. 12, p. 1775 (2002).

The ensuing esterification reaction may readily run by a well-known procedure. The preferred esterifying agent (8) is an acid chloride of formula (8) wherein $R^7$ is chlorine or a carboxylic anhydride of formula (8) wherein $R^7$ is —$OR^8$ and $R^8$ is a group of the following formula (9).

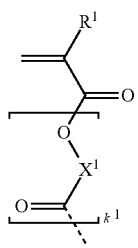

When an acid chloride, typically carboxylic acid chloride such as methacrylic acid chloride is used as the esterifying agent (8), the reaction may be conducted in a solventless system or in a solvent (e.g., methylene chloride, acetonitrile, toluene or hexane) by adding intermediate alcohol (7), acid chloride, and a base (e.g., triethylamine, pyridine or 4-dimethylaminopyridine) in sequence or at a time, and optional cooling or heating. When a carboxylic anhydride such as methacrylic anhydride is used as the esterifying agent (8), the reaction may be conducted in a solventless system or in a solvent (e.g., methylene chloride, acetonitrile, toluene or hexane) by adding intermediate alcohol (7), carboxylic anhydride, and a base (e.g., triethylamine, pyridine or 4-dimethylaminopyridine) in sequence or at a time, and optional cooling or heating.

An appropriate amount of esterifying agent (8) used is 1 to 10 moles, more preferably 1 to 5 moles per mole of intermediate alcohol (7). Less than 1 mole of esterifying agent (8) may result in a substantial drop of percent yield because the reaction may proceed to a short extent with some intermediate alcohol (7) left unreacted. More than 10 moles of esterifying agent (8) may be uneconomical because of an increase of reactant cost and a lowering of pot yield.

The reaction time is determined as appropriate by monitoring the reaction process by thin-layer chromatography (TLC) or gas chromatography (GC) because it is desirable from the yield aspect to drive the reaction to completion. Usually the reaction time is about 30 minutes to about 40 hours. The desired monomer (1a) may be recovered from the reaction mixture by ordinary aqueous work-up. If necessary, it may be purified by standard techniques like distillation, recrystallization and chromatography.

It is acceptable to use a blend of two or more inventive polymers which differ in compositional ratio, molecular weight or dispersity as the base resin in the resist composition. Also useful is a blend of an inventive polymer comprising recurring units of formula (1) and a polymer comprising recurring units having a conventional acid labile group-substituted hydroxyl or carboxyl group, for example, a polymer comprising recurring units (a2) and/or (b1) to (b4).

In some embodiments, the inventive polymer may be blended with a polymer of the conventional type wherein the exposed region of resist film is dissolved on alkaline development such as (meth)acrylate polymer, polynorbornene, cycloolefin-maleic anhydride copolymer, or ring-opening metathesis polymerization (ROMP) polymer. Also, the inventive polymer may be blended with a (meth)acrylate polymer, polynorbornene or cycloolefin-maleic anhydride copolymer having an acid labile group-substituted hydroxyl group wherein the exposed region of resist film is not dissolved by alkaline development, but negative pattern is formed by organic solvent development.

Resist Composition

The resist composition used in the pattern forming process of the invention comprises the polymer defined above as base resin, an organic solvent, and optionally, a compound capable of generating an acid in response to high-energy radiation (known as "acid generator"), basic compound, dissolution regulator, surfactant, acetylene alcohol, and other components.

The resist composition used herein may include an acid generator in order for the composition to function as a chemically amplified resist composition. Typical of the acid generator used herein is a photoacid generator (PAG) capable of generating an acid in response to actinic light or radiation. The PAG may preferably be compounded in an amount of 0.5 to 30 parts and more preferably 1 to 20 parts by weight per 100 parts by weight of the base resin. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. Exemplary PAGs are described in JP-A 2009-269953, paragraphs [0151] to [0156], and JP-A 2011-016746. The PAGs may be used alone or in admixture of two or more. Typically acid generators generate such acids as sulfonic acids, imidic acids and methide acids. Of these, sulfonic acids which are fluorinated at α-position are most commonly used. In case the acid labile group is an acetal group which is susceptible to deprotection, the sulfonic acid need not necessarily be fluorinated at α-position. In the embodiment wherein the polymer has recurring units (d1), (d2) or (d3) of acid generator copolymerized therein, the acid generator need not be separately added.

Examples of the organic solvent used herein are described in JP-A 2008-111103, paragraphs [0144] to [0145] (U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Where an acid labile group of acetal form is used, a high-boiling alcohol solvent such as diethylene glycol, propylene glycol, glycerol, 1,4-butane diol or 1,3-butane diol may be added for accelerating deprotection reaction of acetal.

Basic compounds, typically amines may be added to the resist composition. Suitable basic compounds include primary, secondary and tertiary amine compounds, specifically amine compounds having a hydroxyl, ether, ester, lactone, cyano or sulfonate group, as described in JP-A 2008-111103, paragraphs [0146] to [0164], and compounds having a carbamate group, as described in JP 3790649.

Onium salts such as sulfonium salts, iodonium salts and ammonium salts of sulfonic acids which are not fluorinated at α-position as described in US 20080153030 (JP-A 2008-158339) and similar onium salts of carboxylic acid as described in JP 3991462 may be used as the quencher. Where the acid labile group is an acetal group which is very sensitive to acid, the acid for eliminating the protective group need not necessarily be an α-position fluorinated sulfonic acid, imidic acid, or methidic acid because sometimes deprotection reaction may proceed even with an α-position non-fluorinated sulfonic acid. In this case, an onium salt of sulfonic acid cannot be used as the quencher, and instead, an onium salt of carboxylic acid is preferably used alone.

Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182].

Also a polymeric additive may be added for improving the water repellency on surface of a resist film as spin coated. This additive may be used in the topcoatless immersion lithography. These additives have a specific structure with a 1,1,1,3,3,3-hexafluoro-2-propanol residue and are described in JP-A 2007-297590, JP-A 2008-111103 and JP-A 2012-128067. The water repellency improver to be added to the resist should be soluble in the organic solvent as developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. An appropriate amount of the water repellency improver is 0.1 to 20 parts, preferably 0.5 to 10 parts by weight per 100 parts by weight of the base resin.

Notably, an appropriate amount of the organic solvent is 100 to 10,000 parts, preferably 300 to 8,000 parts by weight, and an appropriate amount of the basic compound is 0.0001 to 30 parts, preferably 0.001 to 20 parts by weight, per 100 parts by weight of the base resin. Amounts of the dissolution regulator, surfactant, and acetylene alcohol may be determined as appropriate depending on their purpose of addition.

Process

One embodiment of the invention is a pattern forming process comprising the steps of coating a resist composition onto a substrate, prebaking the resist composition to form a resist film, exposing a selected region of the resist film to high-energy radiation, baking (PEB), and developing the exposed resist film with an organic solvent developer so that the unexposed region of resist film is dissolved and the exposed region of resist film is left, thereby forming a negative tone resist pattern such as a hole or trench pattern.

FIG. 1 illustrates the pattern forming process of the invention. First, the resist composition is coated on a substrate to form a resist film thereon. Specifically, a resist film 40 of a resist composition is formed on a processable substrate 20 disposed on a substrate 10 directly or via an intermediate intervening layer 30 as shown in FIG. 1A. The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer 30 includes hard masks of $SiO_2$, SiN, SiON or p-Si, an undercoat in the form of carbon film, a silicon-containing intermediate film, and an organic antireflective coating.

Next comes exposure depicted at 50 in FIG. 1B. For the exposure, preference is given to high-energy radiation having a wavelength of 140 to 250 nm, EUV having a wavelength of 13.5 nm, and EB, and especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. The immersion lithography involves exposing the prebaked resist film to light through a projection lens, with pure water or liquid introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after prebaking for preventing any leach-out from the resist film and improving water slip on the film surface.

The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue. While the protective film must dissolve in the organic solvent developer, the polymer comprising recurring units derived from a monomer having a 1,1,1,3,3,3-hexafluoro-2-propanol residue dissolves in organic solvent developers. In particular, protective film-forming materials having 1,1,1,3,3,3-hexafluoro-2-propanol residues as described in JP-A 2007-025634 and JP-A 2008-003569 readily dissolve in organic solvent developers.

In the protective film-forming composition, an amine compound or amine salt or a polymer having copolymerized therein recurring units containing an amine compound or amine salt may be used. This component is effective for controlling diffusion of the acid generated in the exposed region of the photoresist film to the unexposed region for thereby preventing any hole opening failure. Useful protective film materials having an amine compound added thereto are described in JP-A 2008-003569, and useful protective film materials having an amino group or amine salt copolymerized are described in JP-A 2007-316448. The amine compound or amine salt may be selected from the compounds enumerated as the basic compound to be added to the resist composition. An appropriate amount of the amine compound or amine salt added is 0.01 to 10 parts, preferably 0.02 to 8 parts by weight per 100 parts by weight of the base resin.

After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film. If the acid evaporating from the exposed region during PEB deposits on the unexposed region to deprotect the protective group on the surface of the unexposed region, there is a possibility that the surface edges of holes after development are bridged to close the holes. Particularly in the case of negative development, regions surrounding the holes receive light so that acid is generated therein. There is a possibility that the holes are not opened if the acid outside the holes evaporates and deposits inside the holes during PEB. Provision of a protective film is effective for preventing evaporation of acid and for avoiding any hole opening failure. A protective film having an amine compound added thereto is more effective for preventing acid evaporation. On the other hand, a protective film to which an acid compound such as a carboxyl or sulfo group is added or which is based on a polymer having copolymerized therein monomeric units containing a carboxyl or sulfo group is undesirable because of a potential hole opening failure.

The other embodiment of the invention is a process for forming a pattern by applying a resist composition comprising a polymer comprising recurring units (a1) of formula (1), an optional acid generator, and an organic solvent onto a substrate, baking the composition to form a resist film, forming a protective film on the resist film, exposing the resist film to high-energy radiation to define exposed and unexposed regions, PEB, and applying an organic solvent to the coated substrate to form a negative pattern wherein the unexposed region of resist film and the protective film are dissolved and the exposed region of resist film is not dissolved. The protective film is preferably formed from a composition comprising a polymer bearing a 1,1,1,3,3,3-hexafluoro-2-propanol residue and an amino group or amine salt-containing compound, or a composition comprising a polymer bearing a 1,1,1,3,3,3-hexafluoro-2-propanol residue and having amino group or amine salt-containing recurring units copolymerized, the composition further comprising an alcohol solvent of at least 4 carbon atoms, an ether solvent of 8 to 12 carbon atoms, or a mixture thereof.

Examples of suitable recurring units having a 1,1,1,3,3,3-hexafluoro-2-propanol residue include those derived from hydroxyl-bearing monomers selected from among the monomers listed for units (c) on pages 55, 56 and 57. Examples of the amino group-containing compound include the amine compounds described in JP-A 2008-111103, paragraphs [0146] to [0164] as being added to photoresist compositions. Examples of the amine salt-containing compound include salts of the foregoing amine compounds with carboxylic acids or sulfonic acids.

Suitable alcohols of at least 4 carbon atoms include 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether solvents of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether.

Exposure is preferably performed in an exposure dose of about 1 to 200 mJ/cm$^2$, more preferably about 10 to 100 mJ/cm$^2$. This is followed by baking (PEB) on a hot plate at 60 to 150° C. for 1 to 5 minutes, preferably at 80 to 120° C. for 1 to 3 minutes.

Thereafter the exposed resist film is developed in a developer consisting of an organic solvent for 0.1 to 3 minutes, preferably 0.5 to 2 minutes by any conventional techniques such as dip, puddle and spray techniques. In this way, the unexposed region of resist film was dissolved away, leaving a negative resist pattern 40 on the substrate 10 as shown in FIG. 1C. The developer used herein is preferably selected from among ketones such as 2-octanone, 2-nonanone, 2-heptanone, 3-heptanone, 4-heptanone, 2-hexanone, 3-hexanone, diisobutyl ketone, methylcyclohexanone, acetophenone, and methylacetophenone, and esters such as propyl acetate, butyl acetate, isobutyl acetate, amyl acetate, butenyl acetate, isoamyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof. One or more of these solvents may be used as the developer. When a mixture of plural solvents is used, they may be mixed in any desired ratio. A surfactant may be added to the developer while it may be selected from the same list of compounds as exemplified for the surfactant to be added to the resist composition.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene. Rinsing is effective for minimizing the risks of resist pattern collapse and defect formation. However, rinsing is not essential. If rinsing is omitted, the amount of solvent used may be reduced.

A hole pattern after reversal may be shrunk by the RELACS® process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is at a temperature of 70 to 180° C., preferably 80 to 170° C., for a time of 10 to 300 seconds. The extra shrink agent is stripped and the hole pattern is shrunk.

Where a hole pattern is formed by negative tone development, exposure by double dipole illuminations of X- and Y-direction line patterns provides the highest contrast light. The contrast may be further increased by combining dipole illumination with s-polarized illumination.

When a halftone phase shift mask bearing a lattice-like shifter pattern is used, a pattern of holes may be formed at the intersections between gratings of the lattice-like shifter pattern after development, as described in JP-A 2011-170316, paragraph [0097] (US 20110177462). The preferred halftone phase shift mask bearing a lattice-like shifter pattern has a transmittance of 3 to 15%. More preferably, the phase shift mask used is a phase shift mask including a lattice-like first shifter having a line width equal to or less than a half pitch and a second shifter arrayed on the first shifter and consisting of lines whose on-wafer size is 2 to 30 nm thicker than the line width of the first shifter, whereby a pattern of holes is formed only where the thick shifter is arrayed. Also preferably, the phase shift mask used is a phase shift mask including a lattice-like first shifter having a line width equal to or less than a half pitch and a second shifter arrayed on the first shifter and consisting of dots whose on-wafer size is 2 to 100 nm thicker than the line width of the first shifter, whereby a pattern of holes is formed only where the thick shifter is arrayed.

Exposure by double dipole illuminations of X- and Y-direction lines combined with polarized illumination presents a method of forming light of the highest contrast. This method, however, has the drawback that the throughput is substantially reduced by double exposures and mask exchange therebetween. To continuously carry out two exposures while exchanging a mask, the exposure tool must be equipped with two mask stages although the existing exposure tool includes a single mask stage. Higher throughputs may be obtained by carrying out exposure of X direction lines continuously on 25 wafers in a front-opening unified pod (FOUP), exchanging the mask, and carrying out exposure continuously on the same 25 wafers, rather than exchanging a mask on every exposure of a single wafer. However, a problem arises that as the time duration until the first one of 25 wafers is exposed in the second exposure is prolonged, the environment affects the resist such that the resist after development may change its size and shape. To block the environmental impact on wafers in standby until the second exposure, it is effective that the resist film is overlaid with a protective film.

To proceed with a single mask, it is proposed in Proc. SPIE Vol. 5377, p. 255 (2004) to carry out two exposures by dipole illuminations in X and Y directions using a mask bearing a lattice-like pattern. When this method is compared with the above method using two masks, the optical contrast is somewhat reduced, but the throughput is improved by the use of a single mask. As described in the above document, the method involves forming X-direction lines in a first photoresist film by X-direction dipole illumination using a mask bearing a lattice-like pattern, insolubilizing the X-direction lines by light irradiation, coating a second photoresist film thereon, and forming Y-direction lines by Y-direction dipole illumination, thereby forming holes at the interstices between X- and Y-direction lines. Although only a single mask is needed, this method includes additional steps of insolubilizing the first photoresist pattern between the two exposures, and coating and developing the second photoresist film. Then the wafer must be removed from the exposure stage between the two exposures, giving rise to the problem of an increased alignment error. To minimize the alignment error between two exposures, two exposures must be continuously carried out without removing the wafer from the exposure stage. The addition of s-polarized illumination to dipole illumination provides a further improved contrast and is thus preferably employed. After two exposures for forming X- and Y-direction lines using a lattice-like mask are performed in an overlapping manner, negative tone development is performed whereupon a hole pattern is formed.

When it is desired to form a hole pattern via a single exposure using a lattice-like mask, a quadru-pole illumination or cross-pole illumination is used. The contrast may be improved by combining it with X-Y polarized illumination or azimuthally polarized illumination of circular polarization.

In the hole pattern forming process using the resist composition of the invention, when two exposures are involved, these exposures are carried out by changing the illumination and mask for the second exposure from those for the first exposure, whereby a fine size pattern can be formed at the highest contrast and to dimensional uniformity. The masks used in the first and second exposures bear first and second patterns of intersecting lines whereby a pattern of holes at intersections of lines is formed in the resist film after development. The first and second lines are preferably at right angles although an angle of intersection other than 90° may be employed. The first and second lines may have the same or different size and/or pitch. If a single mask bearing first lines in one area and second lines in a different area is used, it is possible to perform first and second exposures continuously. In this case, however, the maximum area available for exposure is one half. Notably, the continuous exposures lead to a minimized alignment error. Of course, the single exposure provides a smaller alignment error than the two continuous exposures.

When two exposures are performed using a single mask without reducing the exposure area, the mask pattern may be a lattice-like pattern, a dot pattern, or a combination of a dot pattern and a lattice-like pattern. The use of a lattice-like pattern contributes to the most improved light contrast, but has the drawback of a reduced resist sensitivity due to a lowering of light intensity. On the other hand, the use of a dot pattern suffers a lowering of light contrast, but provides the merit of an improved resist sensitivity.

Where holes are arrayed in horizontal and vertical directions, the above-described illumination and mask pattern are used. Where holes are arrayed at a different angle, for example, at an angle of 45°, a mask of a 45° arrayed pattern is combined with dipole illumination or cross-pole illumination.

Where two exposures are performed, a first exposure by a combination of dipole illumination with polarized illumination for enhancing the contrast of X-direction lines is followed by a second exposure by a combination of dipole illumination with polarized illumination for enhancing the contrast of Y-direction lines. Two continuous exposures with the X- and Y-direction contrasts emphasized through a single mask can be performed on a currently commercially available scanner.

The method of combining X and Y polarized illuminations with cross-pole illumination using a mask bearing a lattice-like pattern can form a hole pattern through a single exposure, despite a slight lowering of light contrast as compared with two exposures of dipole illumination. The method is estimated to attain a substantial improvement in throughput and avoids the problem of misalignment between two exposures. Using such a mask and illumination, a hole pattern of the order of 40 nm can be formed at a practically acceptable cost.

On use of a mask bearing a lattice-like pattern, light is fully shielded at intersections between gratings. A fine hole pattern may be formed by performing exposure through a mask bearing such a pattern and organic solvent development entailing positive/negative reversal.

On use of a mask bearing a dot pattern, although the contrast of an optical image is low as compared with the lattice-like pattern mask, the formation of a hole pattern is possible owing to the presence of black or light shielded spots.

It is difficult to form a fine hole pattern that holes are randomly arrayed at varying pitch and position. The super-resolution technology using off-axis illumination (such as dipole or cross-pole illumination) in combination with a phase shift mask and polarization is successful in improving the contrast of dense (or grouped) patterns, but not so the contrast of isolated patterns.

When the super-resolution technology is applied to repeating dense patterns, the pattern density bias between dense and isolated patterns, known as proximity bias, becomes a problem. As the super-resolution technology used becomes stronger, the resolution of a dense pattern is more improved, but the resolution of an isolated pattern remains unchanged. Then the proximity bias is exaggerated. In particular, an increase of proximity bias in a hole pattern resulting from further miniaturization poses a serious problem. One common approach taken to suppress the proximity bias is by biasing the size of a mask pattern. Since the proximity bias varies with properties of a photoresist composition, specifically dissolution contrast and acid diffusion, the proximity bias of a mask varies with the type of photoresist composition. For a particular type of photoresist composition, a mask having a different proximity bias must be used. This adds to the burden of mask manufacturing. Then the pack and unpack (PAU) method is proposed in Proc. SPIE Vol. 5753, p 171 (2005), which involves strong super-resolution illumination of a first positive resist to resolve a dense hole pattern, coating the first positive resist pattern with a negative resist film material in alcohol solvent which does not dissolve the first positive resist pattern, exposure and development of an unnecessary hole portion to close the corresponding holes, thereby forming both a dense pattern and an isolated pattern. One problem of the PAU method is misalignment between first and second exposures, as the authors point out in the report. The hole pattern which is not closed by the second development experiences two developments and thus undergoes a size change, which is another problem.

To form a random pitch hole pattern by organic solvent development entailing positive/negative reversal, a mask is used in which a lattice-like pattern is arrayed over the entire surface and the width of gratings is thickened only where holes are to be formed as described in JP-A 2011-170316, paragraph [0102].

Also useful is a mask in which a lattice-like pattern is arrayed over the entire surface and thick dots are disposed only where holes are to be formed.

On use of a mask bearing no lattice-like pattern arrayed, holes are difficult to form, or even if holes are formed, a variation of mask size is largely reflected by a variation of hole size because the optical image has a low contrast.

EXAMPLE

Examples of the invention are given below by way of illustration and not by way of limitation. The abbreviation "pbw" is parts by weight. For all polymers, Mw and Mn are determined by GPC versus polystyrene standards using tetrahydrofuran solvent.

Polymerizable monomers of formula (1a) were synthesized in accordance with the formulation shown below.

Synthesis Example 1-1

Synthesis of Monomer 1

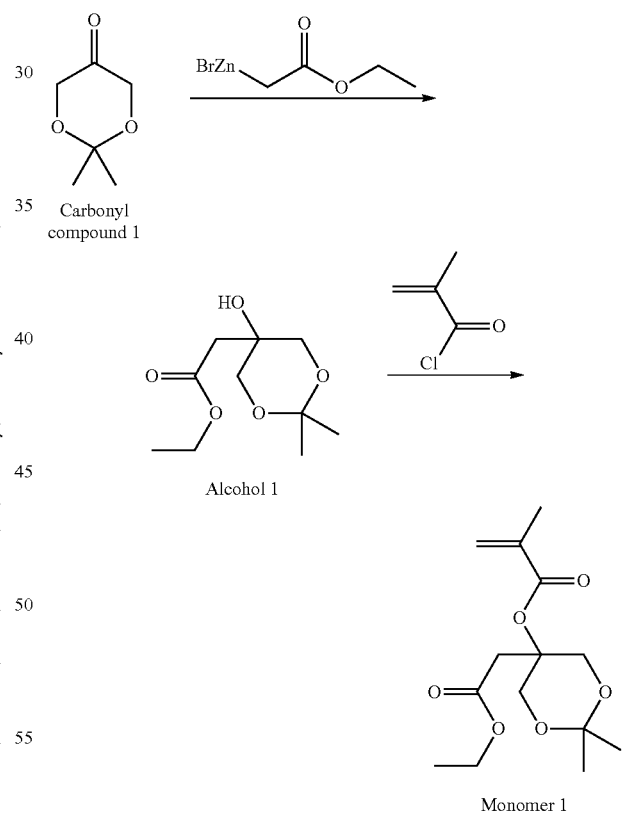

Synthesis Example 1-1-1

Synthesis of Alcohol 1

A solution of 91.1 g Carbonyl compound 1 in 280 ml toluene was added dropwise to a Reformatsky reagent, which had been prepared from 77.8 g of zinc powder, 175.3 g of ethyl bromoacetate, and 490 ml of tetrahydrofuran (THF), at a temperature below 30° C. The reaction solution was stirred at room temperature for 1 hour, after which it was ice cooled. A saturated aqueous solution of ammonium chloride was added dropwise thereto to quench the reaction. This was followed by standard aqueous workup. The solvent was evaporated off. The product was purified by vacuum distillation, obtaining 134.4 g (yield 88%) of Alcohol 1 as oily matter.

b.p.: 75-77° C./20 Pa

IR (D-ATR): ν=3490, 2990, 2941, 2876, 1731, 1450, 1373, 1331, 1250, 1199, 1155, 1100, 1072, 1030, 986, 937, 832, 814, 732 cm$^{-1}$ $^1$H-NMR (600 MHz in DMSO-d$_6$): δ=4.99 (1H, s), 4.03 (2H, q), 3.72 (2H, d), 3.54 (2H, d), 2.47 (2H, d), 1.32 (3H, s), 1.29 (3H, s), 1.17 (3H, t) ppm Synthesis Example 1-1-2

Synthesis of Monomer 1

In 150 ml of acetonitrile were dissolved 132.1 g of Alcohol 1 obtained above, 91.8 g of triethylamine, and 3.7 g of 4-(dimethylamino)pyridine. At 40-50° C., 82.2 g of methacrylic acid chloride was added dropwise to the solution, which was stirred for 5 hours at 50° C. A sodium hydrogencarbonate aqueous solution was added thereto to quench the reaction. This was followed by standard aqueous workup, solvent evaporation, and purification by distillation, obtaining 159.5 g (yield 92%) of Monomer 1.

b.p.: 84° C./12 Pa

IR (D-ATR): ν=2990, 2941, 2876, 1733, 1718, 1637, 1451, 1373, 1330, 1300, 1226, 1201, 1162, 1098, 1072, 1032, 939, 866, 832, 815 cm$^{-1}$ $^1$H-NMR (600 MHz in DMSO-d$_6$): δ=6.00 (1H, s), 5.66 (1H, m), 4.03 (2H, d), 4.01 (2H, q), 3.96 (2H, d), 2.94 (2H, s), 1.83 (3H, s), 1.35 (3H, s), 1.30 (3H, s), 1.12 (3H, t) ppm Synthesis Example 1-2

Synthesis of Monomer 2

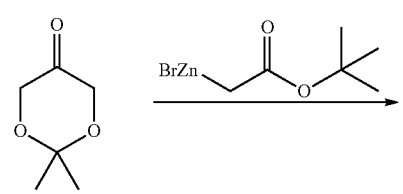
Carbonyl compound 1

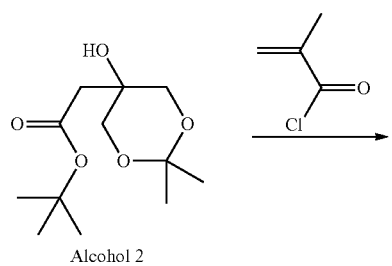
Alcohol 2

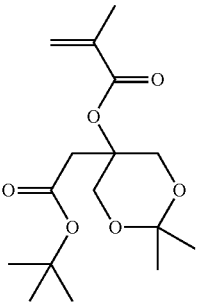
Monomer 2

Synthesis Example 1-2-1

Synthesis of Alcohol 2

The procedure of Synthesis Example 1-1-1 was repeated aside from using a Reformatsky reagent which had been prepared from t-butyl bromoacetate instead of ethyl bromoacetate. Alcohol 2 was obtained in a yield of 94%.

IR (D-ATR): ν=3470, 2980, 2938, 2877, 1727, 1455, 1394, 1371, 1349, 1251, 1220, 1198, 1156, 1100, 1072, 1041, 988, 938, 833 cm$^{-1}$ $^1$H-NMR (600 MHz in DMSO-d$_6$): δ=4.91 (1H, s), 3.72 (2H, d), 3.53 (2H, d), 2.35 (2H, s), 1.39 (9H, s), 1.32 (3H, s), 1.28 (3H, s) ppm Synthesis Example 1-2-2

Synthesis of Monomer 2

The procedure of Synthesis Example 1-1-2 was repeated aside from using Alcohol 2 instead of Alcohol 1. Monomer 2 was obtained in a yield of 94%.

b.p.: 89-91° C./13 Pa

IR (D-ATR): ν=2983, 2938, 2880, 1723, 1637, 1454, 1371, 1331, 1300, 1228, 1163, 1099, 1074, 1041, 1009, 941, 866, 834 cm$^{-1}$ $^1$H-NMR (600 MHz in DMSO-d$_6$): δ=6.02 (1H, s), 5.68 (1H, m), 4.02 (2H, d), 3.93 (2H, d), 2.84 (2H, s), 1.85 (3H, s), 1.35 (3H, s), 1.34 (9H, s), 1.29 (3H, s) ppm Synthesis Example 1-3

Synthesis of Monomer 3

The procedure of Synthesis Examples 1-1-1 and 1-1-2 was repeated aside from using a Reformatsky reagent which had been prepared from t-butyl bromoacetate in lieu of ethyl bromoacetate, instead of the above Reformatsky reagent, Alcohol 2 instead of Alcohol 1, and acrylic acid chloride instead of methacrylic acid chloride. Monomer 3 was obtained in a two-step yield of 89%.

Synthesis Example 1-4

Synthesis of Monomer 4

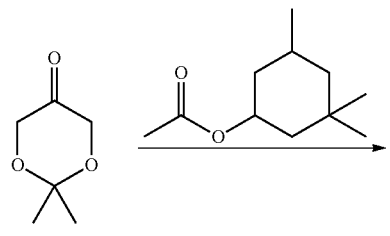

Carbonyl compound 1

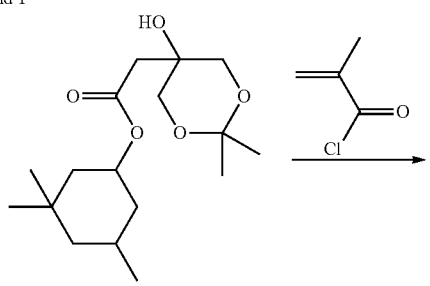

Alcohol 3

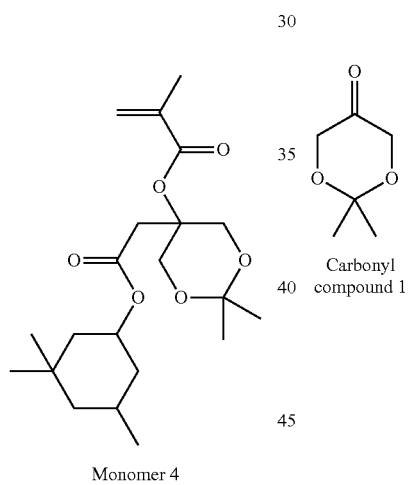

Monomer 4

Synthesis Example 1-4-1

Synthesis of Alcohol 3

Lithium enolate was prepared by reacting 28.4 g lithium bis(trimethylsilyl)amide with 28.5 g of 3,3,5-trimethylcyclohexyl acetate in 80 ml of THF at −60° C. Subsequently, 17.3 g of Carbonyl compound 1 was gradually added to the solution, which was warmed up to −20° C. over 1 hour. Stirring was continued at the temperature for 1 hour for reaction to take place, after which a saturated ammonium chloride aqueous solution was added dropwise to quench the reaction. This was followed by standard aqueous workup and solvent evaporation, obtaining 35.8 g of crude Alcohol 3 as oily matter.

IR (D-ATR): ν=3473, 2992, 2952, 2903, 2870, 1727, 1461, 1407, 1372, 1332, 1249, 1228, 1199, 1172, 1154, 1117, 1100, 1073, 1042, 994, 968, 936, 833 cm$^{-1}$ $^1$H-NMR (600 MHz in DMSO-d$_6$): δ=4.95 (1H, s), 4.78 (1H, m), 3.72 (2H, dd), 3.53 (2H, d), 2.42 (2H, s), 1.87 (1H, m), 1.58-1.69 (2H, m), 1.26-1.33 (7H, m), 1.05 (1H, t), 0.90 (6H, d), 0.86 (3H, d), 0.82 (1H, q), 0.76 (1H, t) ppm Synthesis Example 1-4-2

Synthesis of Monomer 4

The procedure of Synthesis Example 1-1-2 was repeated aside from using Alcohol 3 instead of Alcohol 1. Monomer 4 was obtained in a two-step yield of 84%.

b.p.: 128-130° C./11 Pa

IR (D-ATR): ν=2992, 2953, 2869, 1731, 1637, 1461, 1374, 1330, 1299, 1226, 1201, 1163, 1101, 1076, 1044, 993, 968, 940, 833 cm$^{-1}$ $^1$H-NMR (600 MHz in DMSO-d$_6$): δ=6.00 (1H, s), 5.67 (1H, m), 4.72-4.79 (1H, m), 4.02 (4H, dd), 2.91 (2H, s), 1.78-1.86 (4H, m), 1.58-1.67 (1H, m), 1.52-1.57 (1H, m), 1.35 (3H, s), 1.29 (3H, s), 1.26 (1H, m), 1.00 (1H, t), 0.88 (6H, d), 0.84 (3H, d), 0.77 (1H, t), 0.73 (1H, t) ppm Synthesis Example 1-5

Synthesis of Monomer 5

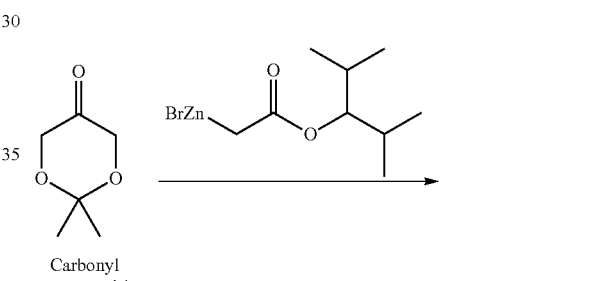

Carbonyl compound 1

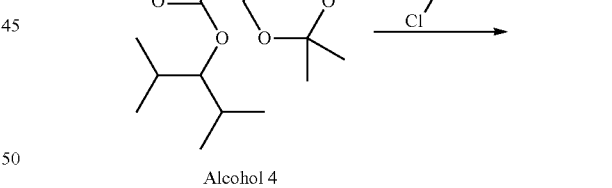

Alcohol 4

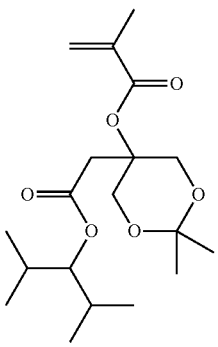

Monomer 5

Synthesis Example 1-5-1

Synthesis of Alcohol 4

The procedure of Synthesis Example 1-1-1 was repeated aside from using a Reformatsky reagent which had been prepared from 2,4-dimethylpentan-3-yl bromoacetate instead of ethyl bromoacetate. Alcohol 4 was obtained in a yield of 89%.

IR (D-ATR): ν=3492, 2966, 2940, 2877, 1728, 1466, 1372, 1332, 1247, 1199, 1173, 1155, 1098, 1072, 1042, 1000, 969, 937, 833 cm$^{-1}$ $^1$H-NMR (600 MHz in DMSO-d$_6$): δ=4.97 (1H, s), 4.49 (1H, t), 3.75 (2H, d), 3.56 (2H, d), 2.52 (2H, s), 1.79-1.87 (2H, m), 1.33 (3H, s), 1.29 (3H, s), 0.79-0.84 (12H, m) ppm Synthesis Example 1-5-2

Synthesis of Monomer 5

The procedure of Synthesis Example 1-1-2 was repeated aside from using Alcohol 4 instead of Alcohol 1. Monomer 5 was obtained in a yield of 90%.

b.p.: 108-110° C./13 Pa

IR (D-ATR): ν=2966, 2938, 2877, 1731, 1717, 1637, 1453, 1373, 1331, 1301, 1253, 1204, 1165, 1130, 1098, 1072, 1004, 968, 938, 866, 833 cm$^{-1}$ $^1$H-NMR (600 MHz in DMSO-d$_6$): δ=6.00 (1H, s), 5.66 (1H, m), 4.46 (1H, t), 4.07 (2H, d), 3.96 (2H, d), 3.07 (2H, s), 1.77-1.84 (5H, m), 1.37 (3H, s), 1.29 (3H, s), 0.78 (6H, d), 0.75 (6H, d) ppm Synthesis Example 1-6

Synthesis of Monomer 6

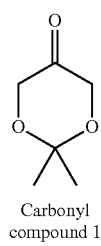
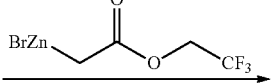
Carbonyl compound 1

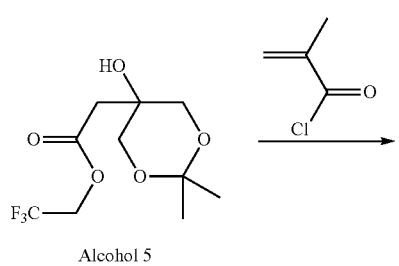
Alcohol 5

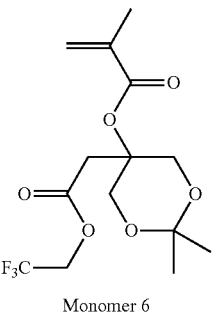
Monomer 6

The procedure of Synthesis Examples 1-1-1 and 1-1-2 was repeated aside from using a Reformatsky reagent which had been prepared from 2,2,2-trifluoroethyl bromoacetate in lieu of ethyl bromoacetate, instead of the above Reformatsky reagent, and Alcohol 5 instead of Alcohol 1. Monomer 6 was obtained in a two-step yield of 76%.

Synthesis Example 1-7

Synthesis of Monomer 7

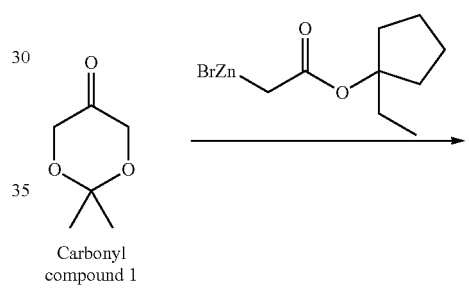
Carbonyl compound 1

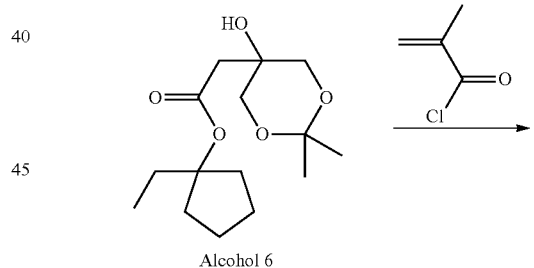
Alcohol 6

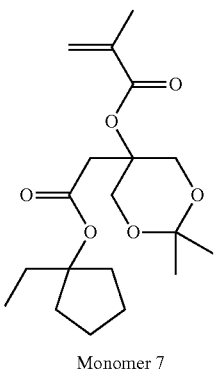
Monomer 7

The procedure of Synthesis Examples 1-1-1 and 1-1-2 was repeated aside from using a Reformatsky reagent which had been prepared from 1-ethylcyclopentyl bromoacetate in lieu of ethyl bromoacetate, instead of the above Reformatsky reagent, and Alcohol 6 instead of Alcohol 1. Monomer 7 was obtained in a two-step yield of 88%.

b.p.: 122-125° C./13 Pa

IR (D-ATR): ν=2969, 2940, 2878, 1724, 1637, 1452, 1374, 1332, 1300, 1265, 1226, 1164, 1100, 1071, 1043, 1009, 952, 866, 834 cm$^{-1}$ $^1$H-NMR (600 MHz in DMSO-d$_6$): δ=6.01 (1H, m), 5.67 (1H, m), 4.04 (2H, d), 3.93 (2H, d), 2.91 (2H, s), 1.82-1.97 (7H, m), 1.49-1.61 (6H, m), 1.35 (3H, s), 1.29 (3H, s), 0.77 (3H, t) ppm Synthesis Example 1-8

Synthesis of Monomer 8

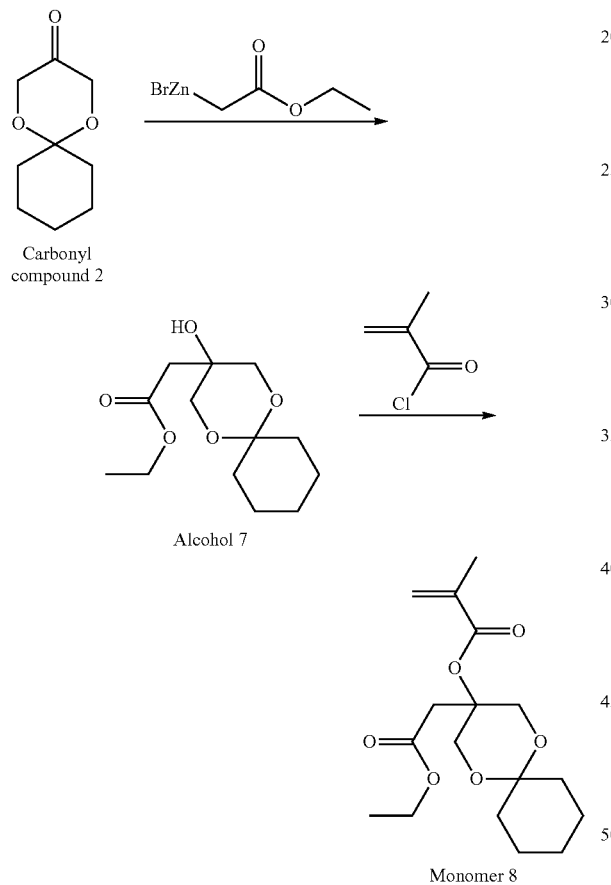

Synthesis Example 1-8-1

Synthesis of Alcohol 7

The procedure of Synthesis Example 1-1-1 was repeated aside from using Carbonyl compound 2 instead of Carbonyl compound 1. Alcohol 7 was obtained in a yield of 92%.

IR (D-ATR): ν=3488, 2937, 2862, 1732, 1464, 1447, 1404, 1369, 1331, 1270, 1239, 1199, 1176, 1158, 1107, 1093, 1072, 1042, 986, 944, 916, 847, 825, 694, 605, 567 cm$^{-1}$ $^1$H-NMR (600 MHz in DMSO-d$_6$): δ=1.17 (3H, t), 1.34 (2H, m), 1.41 (4H, m), 1.61 (2H, m), 1.69 (2H, m), 2.47 (2H, s), 3.55 (2H, d), 3.73 (2H, d), 4.03 (2H, q), 4.97 (1H, s) ppm Synthesis Example 1-8-2

Synthesis of Monomer 8

The procedure of Synthesis Example 1-1-2 was repeated aside from using Alcohol 7 instead of Alcohol 1. Monomer 8 was obtained in a yield of 91%.

b.p.: 110° C./13 Pa

IR (D-ATR): ν=2980, 2937, 2862, 1734, 1720, 1637, 1448, 1368, 1331, 1302, 1285, 1253, 1219, 1159, 1114, 1072, 1030, 939, 919, 847, 824, 692, 653, 567 cm$^{-1}$ $^1$H-NMR (600 MHz in DMSO-d$_6$): δ=1.12 (3H, t), 1.34 (2H, m), 1.43 (4H, m), 1.60 (2H, m), 1.73 (2H, m), 1.83 (3H, s), 3.97 (2H, d), 4.01 (2H, q), 4.04 (2H, d), 5.66 (1H, m), 5.99 (1H, s) ppm Synthesis Example 1-9

Synthesis of Monomer 9

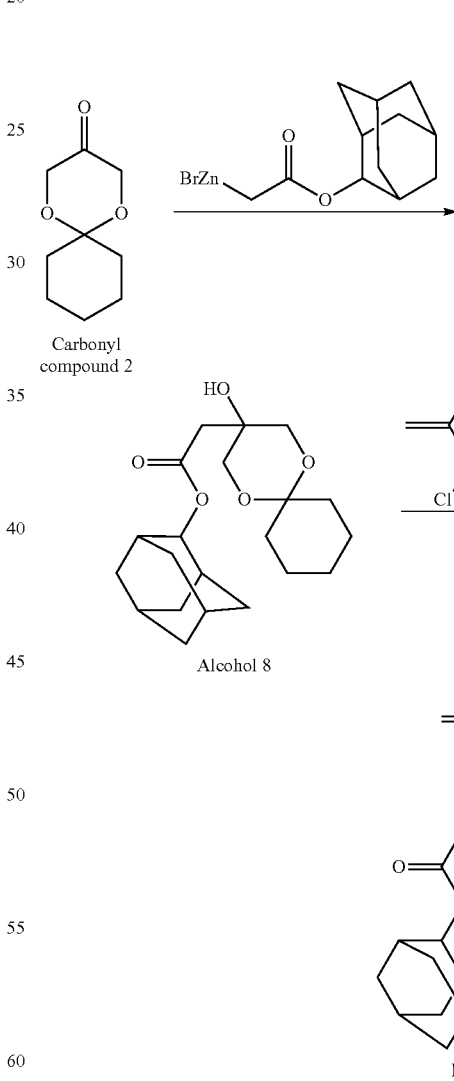

The procedure of Synthesis Examples 1-1-1 and 1-1-2 was repeated aside from using Carbonyl compound 2 instead of Carbonyl compound 1, a Reformatsky reagent which had been prepared from 2-adamantyl bromoacetate in lieu of ethyl bromoacetate, instead of the above Reformatsky reagent, and Alcohol 8 instead of Alcohol 1. Monomer 9 was obtained in a two-step yield of 84%.

Synthesis Example 1-10

Synthesis of Monomer 10

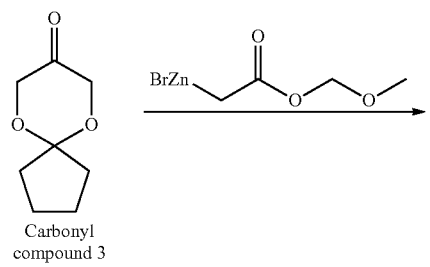

Carbonyl compound 3

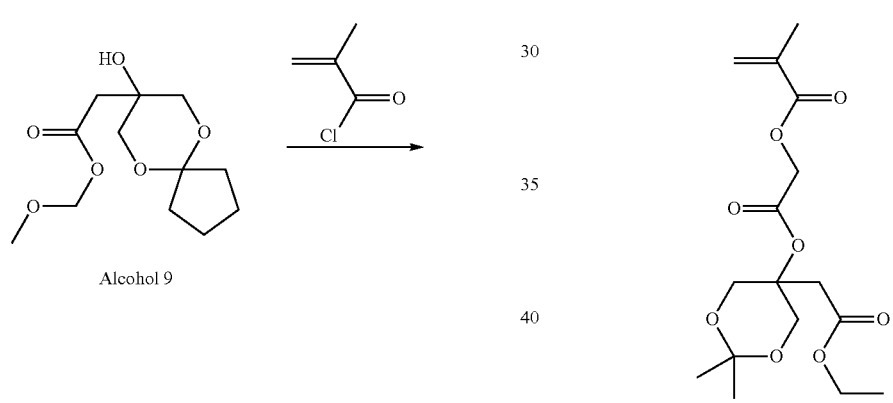

Alcohol 9

Monomer 10

The procedure of Synthesis Examples 1-1-1 and 1-1-2 was repeated aside from using Carbonyl compound 3 instead of Carbonyl compound 1, a Reformatsky reagent which had been prepared from methoxymethyl bromoacetate in lieu of ethyl bromoacetate, instead of the above Reformatsky reagent, and Alcohol 9 instead of Alcohol 1. Monomer 10 was obtained in a two-step yield of 73%.

Synthesis Example 1-11

Synthesis of Monomer 11

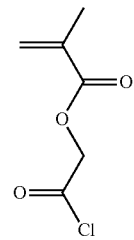

Esterifying agent 1

Monomer 11

The procedure of Synthesis Examples 1-1-1 and 1-1-2 was repeated aside from using Esterifying agent 1 instead of methacrylic acid chloride. Monomer 11 was obtained in a two-step yield of 81%.

Synthesis Example 1-12

Synthesis of Monomer 12

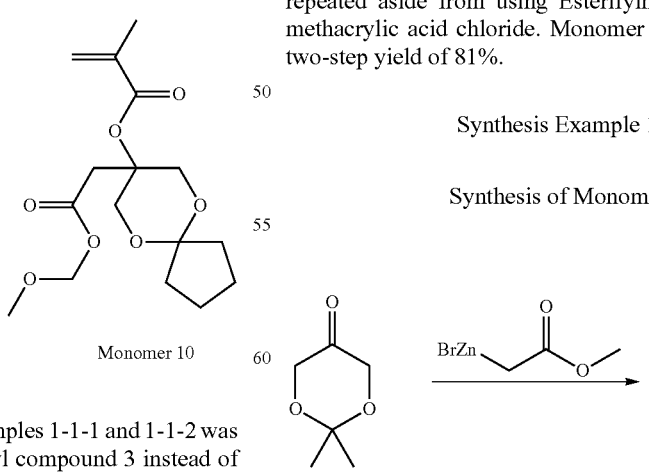

Carbonyl compound 1

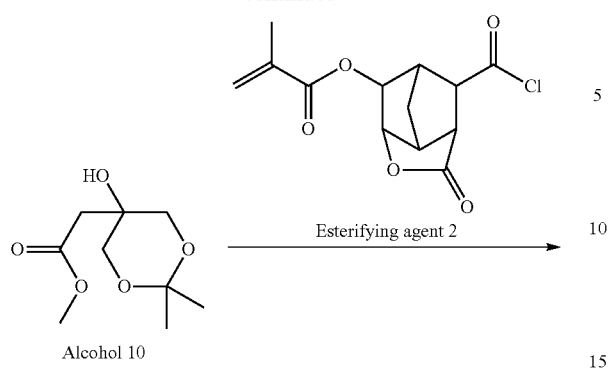

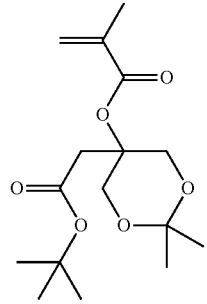

Monomer 2

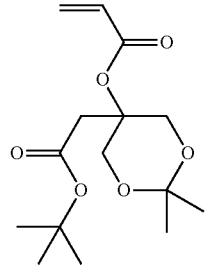

Monomer 3

Monomer 4

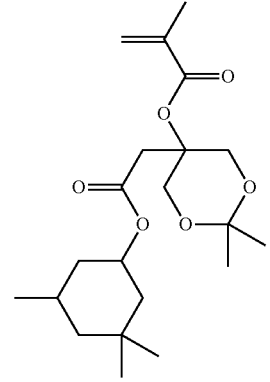

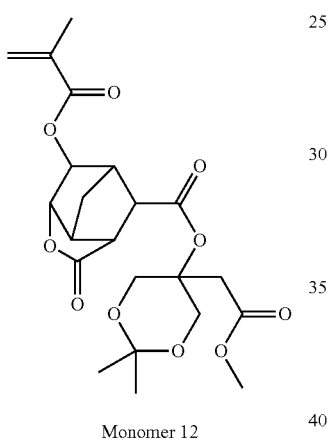

Monomer 12

The procedure of Synthesis Examples 1-1-1 and 1-1-2 was repeated aside from using a Reformatsky reagent which had been prepared from methyl bromoacetate in lieu of ethyl bromoacetate, instead of the above Reformatsky reagent, Alcohol 10 instead of Alcohol 1, and Esterifying agent 2 instead of methacrylic acid chloride. Monomer 12 was obtained in a two-step yield of 68%.

Monomers 1 to 12 obtained in Synthesis Examples have the structural formulae shown below.

Monomer 5

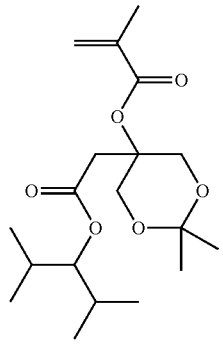

Monomer 1

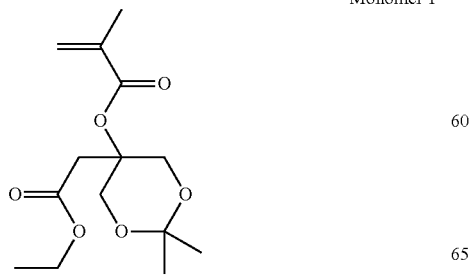

Monomer 6

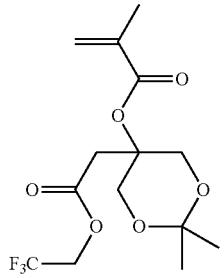

Monomer 7

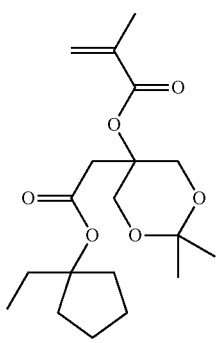

Monomer 8

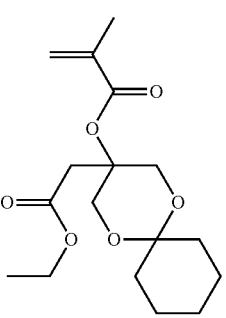

Monomer 9

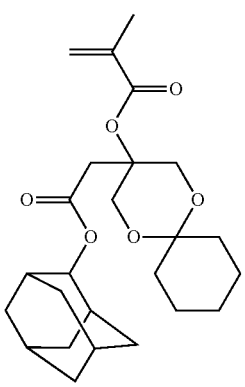

Monomer 10

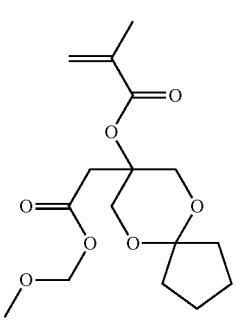

Monomer 11

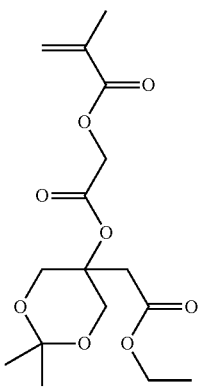

Monomer 12

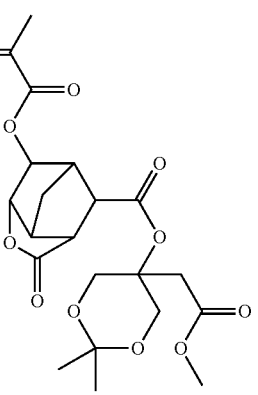

Synthesis Example 2-1

Synthesis of Polymers

Various polymers (Resist Polymers 1 to 8 and Reference Polymers 1, 2) for use in resist compositions were synthesized by combining suitable monomers, effecting copolymerization reaction in methyl ethyl ketone solvent, pouring into methanol for crystallization, repeatedly washing with hexane, isolation, and drying. The polymers were analyzed by $^1$H-NMR to determine their composition and by GPC to determine their Mw and dispersity Mw/Mn.

Resist Polymer 1
Mw = 8,100
Mw/Mn = 1.82
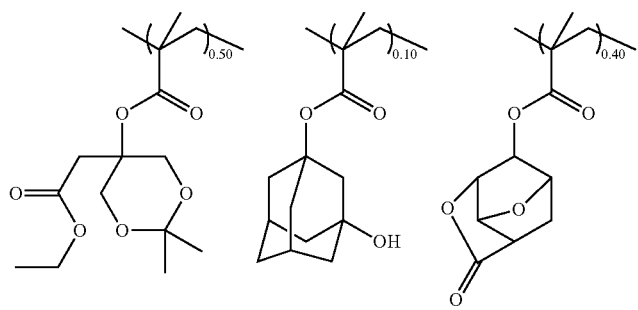
Resist Polymer 1
Resist Polymer 2
Mw = 7,200
Mw/Mn = 1.70
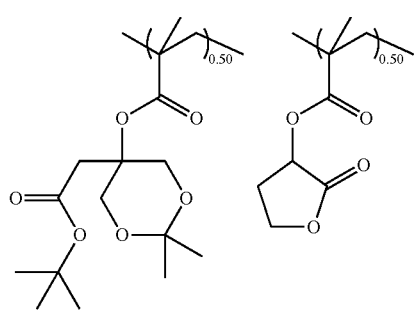
Resist Polymer 2
Resist Polymer 3
Mw = 8,500
Mw/Mn = 1.88
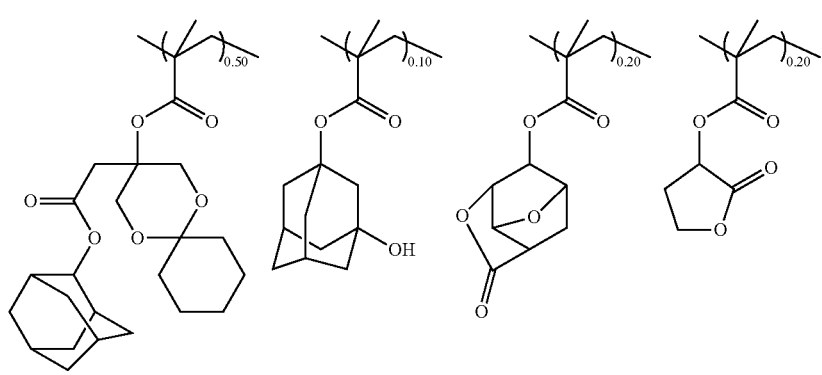
Resist Polymer 3
Resist Polymer 4
Mw = 8,100
Mw/Mn = 1.81
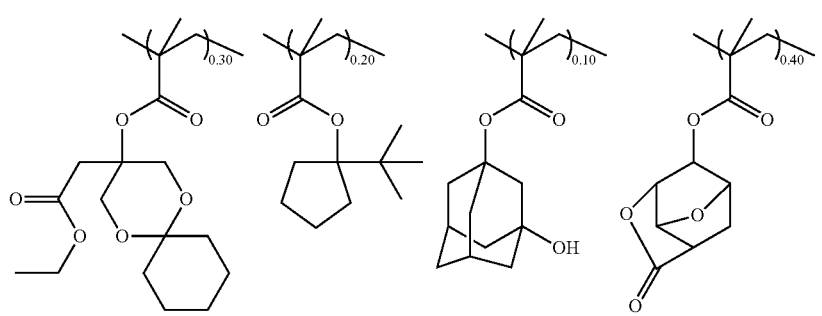
Resist Polymer 4

-continued
Resist Polymer 5
Mw = 8,700
Mw/Mn = 1.84
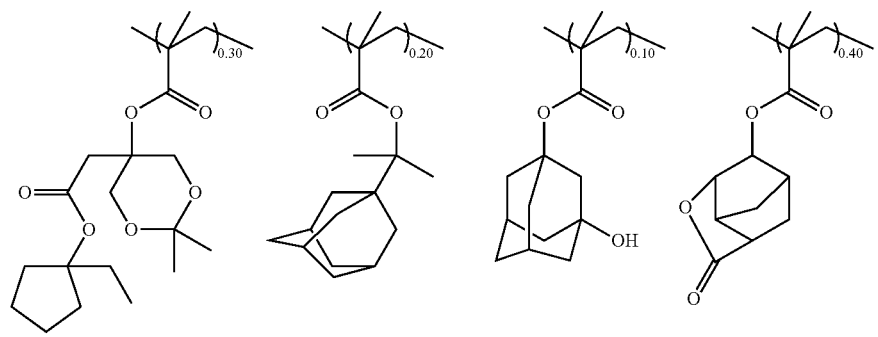
Resist Polymer 5
Resist Polymer 6
Mw = 8,800
Mw/Mn = 1.82
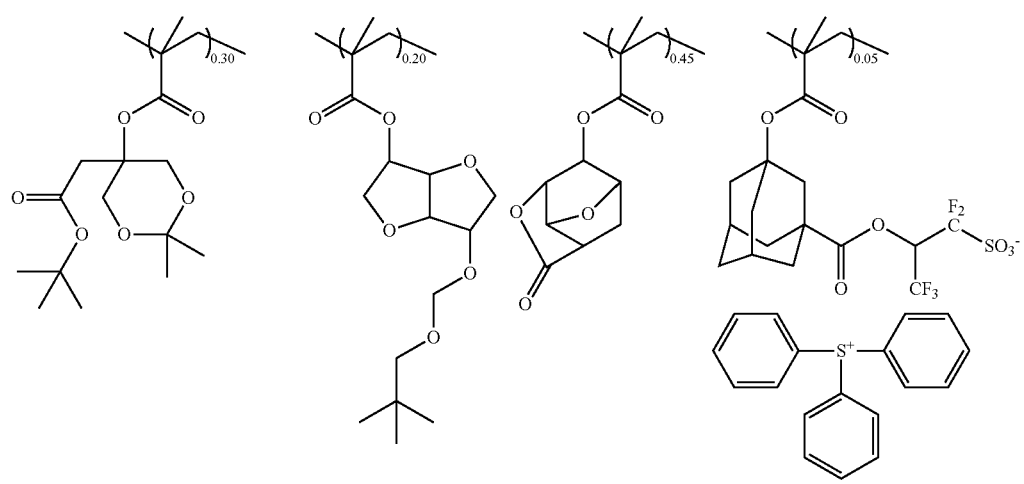
Resist Polymer 6
Resist Polymer 7
Mw = 8,000
Mw/Mn = 1.83
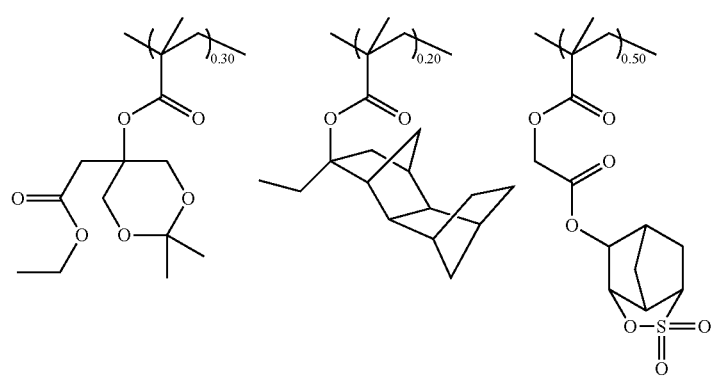
Resist Polymer 7

-continued
Resist Polymer 8
Mw = 8,000
Mw/Mn = 1.78
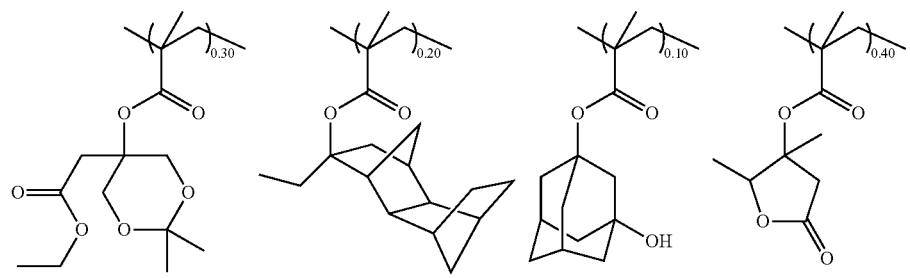
Resist Polymer 8
Reference Polymer 1
Mw = 7,300
Mw/Mn = 1.72
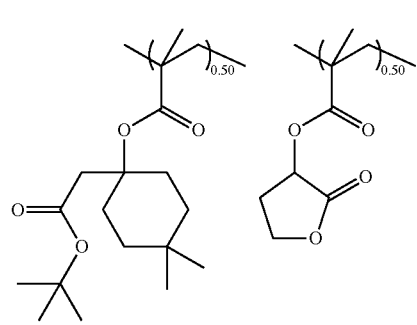
Reference Polymer 1
Reference Polymer 2
Mw = 7,100
Mw/Mn = 1.75
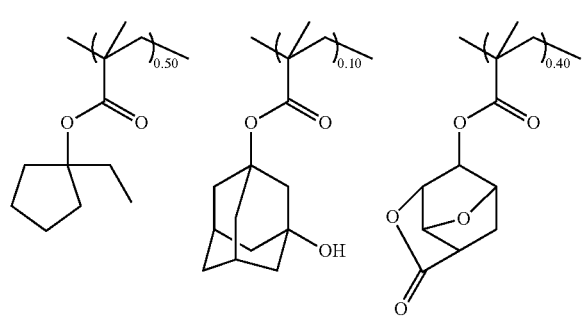
Reference Polymer 2

Examples and Comparative Examples

Preparation of resist composition

A resist composition in solution form was prepared by dissolving a polymer (Resist Polymer or Reference Polymer) and components in solvents in accordance with the formulation of Table 1 and filtering through a Teflon® filter with a pore size of 0.2 μm. The components used herein are identified below.

Acid generator: PAG1 and PAG2 of the following structural formulae

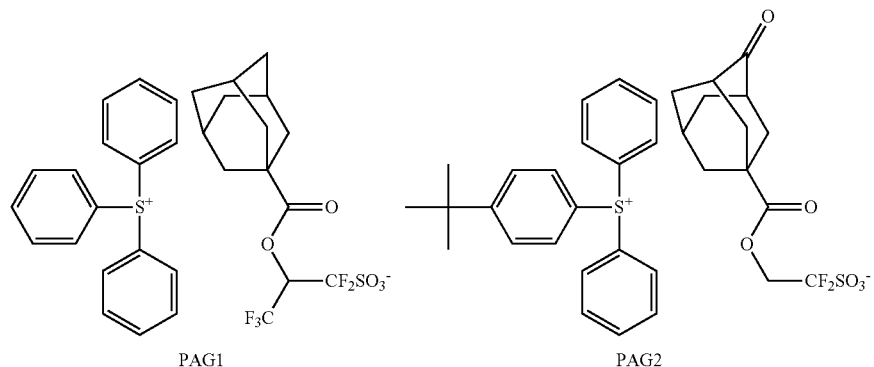

PAG1          PAG2

Water-repellent Polymer 1
Mw = 8,700
Mw/Mn = 1.92

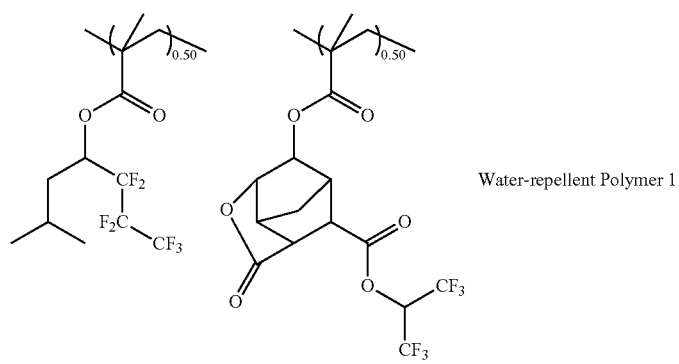

Water-repellent Polymer 1

Quenchers 1 to 4 of the following structural formulae

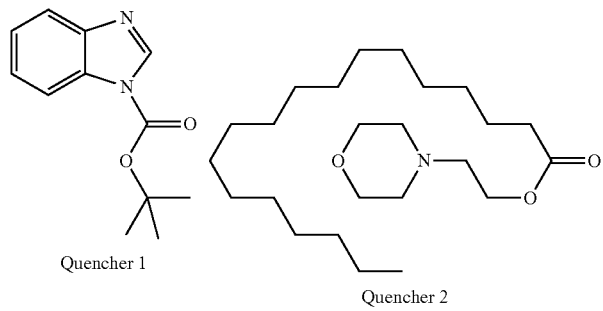

Quencher 1

Quencher 2

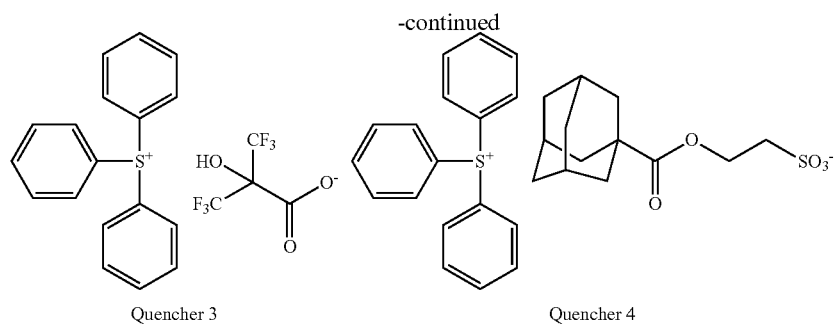

Quencher 3        Quencher 4

Organic Solvent:
PGMEA (proplyene glycol monomethyl ether acetate)
CyH (cyclohexanone)

TABLE 1

|  | Polymer (pbw) | Acid generator (pbw) | Basic compound (pbw) | Additive (pbw) | Organic solvent (pbw) |
|---|---|---|---|---|---|
| Resist 1 | Resist Polymer 1 (100) | PAG1 (5.0) | Quencher 1 (2.00) | — | PGMEA (2,000) CyH (500) |
| Resist 2 | Resist Polymer 1 (100) | PAG1 (5.0) | Quencher 2 (2.00) | Water-repellent Polymer 1 (3) | PGMEA (2,000) CyH (500) |
| Resist 3 | Resist Polymer 1 (100) | PAG1 (4.0) | Quencher 3 (4.00) | Water-repellent Polymer 1 (3) | PGMEA (2,000) CyH (500) |
| Resist 4 | Resist Polymer 1 (100) | PAG1 (4.0) | Quencher 4 (4.00) | Water-repellent Polymer 1 (3) | PGMEA (2,000) CyH (500) |
| Resist 5 | Resist Polymer 2 (100) | PAG1 (5.0) | Quencher 1 (2.00) | Water-repellent Polymer 1 (3) | PGMEA (2,000) CyH (500) |
| Resist 6 | Resist Polymer 3 (100) | PAG1 (5.0) | Quencher 1 (2.00) | Water-repellent Polymer 1 (3) | PGMEA (2,000) CyH (500) |
| Resist 7 | Resist Polymer 4 (100) | PAG1 (5.0) | Quencher 1 (2.00) | Water-repellent Polymer 1 (3) | PGMEA (2,000) CyH (500) |
| Resist 8 | Resist Polymer 5 (100) | PAG1 (5.0) | Quencher 1 (2.00) | Water-repellent Polymer 1 (3) | PGMEA (2,000) CyH (500) |
| Resist 9 | Resist Polymer 6 (100) | — | Quencher 1 (2.00) | Water-repellent Polymer 1 (3) | PGMEA (2,000) CyH (500) |
| Resist 10 | Resist Polymer 7 (100) | PAG1 (5.0) | Quencher 1 (2.00) | Water-repellent Polymer 1 (3) | PGMEA (2,000) CyH (500) |
| Resist 11 | Resist Polymer 8 (100) | PAG1 (5.0) | Quencher 1 (2.00) | Water-repellent Polymer 1 (3) | PGMEA (2,000) CyH (500) |
| Resist 12 | Resist Polymer 2 (60) Reference Polymer 2 (40) | PAG1 (5.0) | Quencher 1 (2.00) | Water-repellent Polymer 1 (3) | PGMEA (2,000) CyH (500) |
| Resist 13 | Resist Polymer 2 (100) | PAG2 (5.0) | Quencher 1 (2.00) | Water-repellent Polymer 1 (3) | PGMEA (2,000) CyH (500) |
| Comparative Resist 1 | Reference Polymer 1 (100) | PAG1 (5.0) | Quencher 1 (2.00) | Water-repellent Polymer 1 (3) | PGMEA (2,000) CyH (500) |
| Comparative Resist 2 | Reference Polymer 2 (100) | PAG1 (5.0) | Quencher 1 (2.00) | Water-repellent Polymer 1 (3) | PGMEA (2,000) CyH (500) |

ArF Lithography Patterning Test

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition in Table 1 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, cross-pole opening 20 deg., azimuthally polarized illumination), exposure was performed in a varying dose through a 6% halftone phase shift mask bearing a lattice-like pattern with a pitch of 90 nm and a line width of 30 nm (on-wafer size). After the exposure, the wafer was baked (PEB) at the temperature shown in Table 2 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid, yielding a negative pattern.

A hole pattern resulted from image reversal by solvent development. By observation under a top-down scanning electron microscope (TDSEM) CG-4000 (Hitachi High-Technologies Corp.), the size of 50 holes was measured, from which a size variation 3σ was determined. The cross-sectional profile of the hole pattern was observed under electron microscope S-4300 (Hitachi High-Technologies Corp.). The results are shown in Table 2.

after development was measured. A dissolution rate (nm/sec) was computed from a difference between the film thickness after PEB and the film thickness after development.

The results are shown in Table 3.

TABLE 3

| | Resist | PEB temperature (° C.) | PEB shrinkage (%) | Dissolution rate (nm/sec) |
|---|---|---|---|---|
| Example 2-1 | Resist 2 | 95 | 10 | 0.11 |
| Example 2-2 | Resist 5 | 90 | 12 | 0.12 |
| Example 2-3 | Resist 9 | 85 | 14 | 0.14 |
| Comparative Example 2-1 | Comparative Resist 2 | 95 | 24 | 0.35 |

A lower PEB shrinkage or lower dissolution rate is preferable in that a film thickness necessary for dry etching is retained, or the initial film thickness can be reduced, which is advantageous in terms of resolution. It is evident from Table

TABLE 2

| | | Resist | PEB temp. (° C.) | Dose (mJ/cm$^2$) | Developer | Pattern profile | Hole size variation 3σ (nm) |
|---|---|---|---|---|---|---|---|
| Example | 1-1 | Resist 1 | 95 | 23 | n-butyl acetate | perpendicular | 2.6 |
| | 1-2 | Resist 2 | 95 | 29 | n-butyl acetate | perpendicular | 2.6 |
| | 1-3 | Resist 3 | 95 | 27 | n-butyl acetate | perpendicular | 2.3 |
| | 1-4 | Resist 4 | 95 | 25 | n-butyl acetate | perpendicular | 2.3 |
| | 1-5 | Resist 5 | 90 | 26 | n-butyl acetate | perpendicular | 2.2 |
| | 1-6 | Resist 6 | 95 | 27 | n-butyl acetate | perpendicular | 2.6 |
| | 1-7 | Resist 7 | 90 | 27 | n-butyl acetate | perpendicular | 2.5 |
| | 1-8 | Resist 8 | 90 | 22 | n-butyl acetate | perpendicular | 2.4 |
| | 1-9 | Resist 9 | 85 | 23 | n-butyl acetate | perpendicular | 2.5 |
| | 1-10 | Resist 10 | 90 | 28 | n-butyl acetate | perpendicular | 2.7 |
| | 1-11 | Resist 11 | 85 | 27 | n-butyl acetate | perpendicular | 2.7 |
| | 1-12 | Resist 12 | 90 | 30 | n-butyl acetate | perpendicular | 2.9 |
| | 1-13 | Resist 13 | 90 | 29 | n-butyl acetate | perpendicular | 2.1 |
| | 1-14 | Resist 5 | 90 | 29 | 2-heptanone | perpendicular | 2.3 |
| | 1-15 | Resist 5 | 90 | 31 | methyl benzoate | perpendicular | 2.3 |
| | 1-16 | Resist 5 | 90 | 33 | ethyl benzoate | perpendicular | 2.2 |
| Comparative Example | 1-1 | Comparative Resist 1 | 100 | 36 | n-butyl acetate | inversely tapered | 5.9 |
| | 1-2 | Comparative Resist 2 | 95 | 39 | n-butyl acetate | inversely tapered | 3.7 |

It is evident that the resist compositions within the scope of the invention form patterns having dimensional uniformity and a perpendicular profile after organic solvent development.

Etch Resistance Test

On a silicon wafer which had been surface treated in hexamethyldisilazane (HMDS) gas phase at 90° C. for 60 seconds, each of the resist solutions in Table 3 was spin-coated and baked (PAB) on a hot plate at 100° C. for 60 seconds, forming a resist film of 100 nm thick. Using an ArF excimer laser scanner (NSR-307E by Nikon Corp., NA 0.85), the entire surface of the wafer was subjected to open-frame exposure. The exposure was in a dose of 50 mJ/cm$^2$ so that the PAG might generate sufficient acid to induce deprotection reaction. This was followed by bake (PEB) at 120° C. for 60 seconds for converting the base resin in the resist film to the deprotected state. The portion where the base resin is deprotected corresponds to the insoluble region in negative tone development. A reduction of resist film thickness by exposure and PEB was determined and divided by the initial film thickness, with the result being reported as PEB shrinkage (%).

Further, the resist film was developed for 30 seconds using butyl acetate as developer. The thickness of the resist film 3 that the resist compositions within the scope of the invention show a low PEB shrinkage and low dissolution rate.

EB Lithography Patterning Test

Using a coater/developer system Clean Track Mark 5 (Tokyo Electron Ltd.), the resist composition of Table 4 was spin coated onto a silicon substrate (diameter 6 inches, vapor primed with hexamethyldisilazane (HMDS)) and pre-baked on a hot plate at 110° C. for 60 seconds to form a resist film of 100 nm thick. Using a system HL-800D (Hitachi Ltd.) at a HV voltage of 50 kV, the resist film was exposed imagewise to EB in a vacuum chamber.

Using Clean Track Mark 5, immediately after the imagewise exposure, the resist film was baked (PEB) on a hot plate at the temperature shown in Table 4 for 60 seconds and puddle developed in the developer shown in Table 4 for 30 seconds. The substrate was rinsed with diisoamyl ether, spin dried, and baked at 100° C. for 20 seconds to evaporate off the rinse liquid, yielding a negative pattern.

Sensitivity is the exposure dose (μC/cm$^2$) that provides a 1:1 resolution of a 100-nm line-and-space pattern. Resolution is a minimum size at the exposure dose. The 100-nm L/S pattern was measured for line width roughness (LWR) under SEM. The results are shown in Table 4.

TABLE 4

| Resist | | PEB temp. (° C.) | Developer | Exposure dose (μC/cm²) | LWR (nm) |
|---|---|---|---|---|---|
| Example 3-1 | Resist 2 | 95 | n-butyl acetate | 58 | 4.9 |
| Example 3-2 | Resist 2 | 95 | methyl benzoate | 61 | 4.8 |
| Example 3-3 | Resist 2 | 95 | ethyl benzoate | 63 | 5.1 |
| Comparative Example 3-1 | Comparative Resist 2 | 95 | n-butyl acetate | 57 | 8.4 |

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2013-081847 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of applying a resist composition comprising a polymer adapted to form a lactone ring under the action of an acid so that the polymer may reduce its solubility in an organic solvent, and an optional acid generator onto a substrate, prebaking the composition to form a resist film, exposing the resist film to high-energy radiation, baking, and developing the exposed film in an organic solvent-based developer to form a negative pattern wherein the unexposed region of resist film is dissolved away and the exposed region of resist film is not dissolved, said polymer comprising recurring units (a1) of the general formula (1):

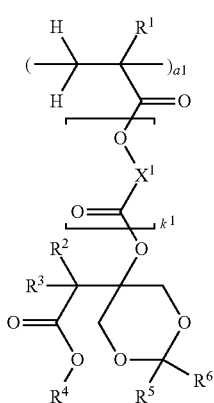

(1)

wherein $R^1$ is hydrogen or methyl, $R^2$ and $R^3$ are each independently hydrogen, fluorine or a straight, branched or cyclic monovalent hydrocarbon group of 1 to 8 carbon atoms, $R^4$ is hydrogen or a straight, branched or cyclic monovalent hydrocarbon group of 1 to 20 carbon atoms in which a constituent —$CH_2$— may be substituted by —O— or —C(=O)—, $R^5$ and $R^6$ are each independently hydrogen or a straight, branched or cyclic monovalent hydrocarbon group of 1 to 8 carbon atoms, $R^5$ and $R^6$ may bond together to form a non-aromatic ring of 3 to 17 carbon atoms with the carbon atom to which they are attached, $X^1$ is a straight, branched or cyclic divalent hydrocarbon group of 1 to 20 carbon atoms in which a constituent —$CH_2$— may be substituted by —O— or —C(=O)—, and $k^1$ is 0 or 1.

2. The process of claim 1 wherein said polymer further comprises recurring units (a2) of the general formula (2) and recurring units of at least one type selected from recurring units (b1) to (b4) represented by the general formula (3):

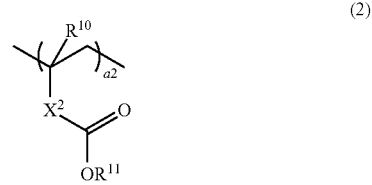

(2)

wherein $R^{10}$ is hydrogen or methyl, $R^{11}$ is an acid labile group, $X^2$ is a single bond, phenylene, naphthylene, or —C(=O)—O—$R^{12}$—, $R^{12}$ is a straight, branched or cyclic $C_1$-$C_{10}$ alkylene group which may have an ether moiety, ester moiety, lactone ring or hydroxyl moiety, or phenylene or naphthylene group, and $0 \leq a2 < 1.0$,

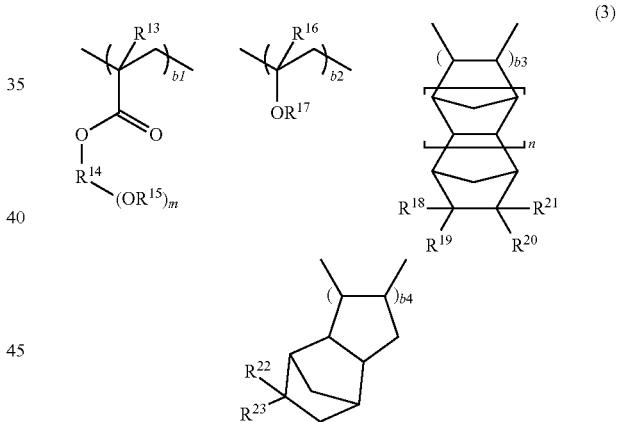

(3)

wherein $R^{13}$ and $R^{16}$ each are hydrogen or methyl, $R^{14}$ is a straight, branched or cyclic, di- to pentavalent aliphatic hydrocarbon group of 1 to 16 carbon atoms which may have an ether or ester moiety, $R^{15}$ and $R^{17}$ each are an acid labile group, $R^{18}$ to $R^{21}$ and $R^{22}$ to $R^{25}$ are each independently hydrogen, cyano, a straight, branched or cyclic $C_1$-$C_6$ alkyl group, alkoxycarbonyl, or a group having an ether moiety or lactone ring, at least one of $R^{18}$ to $R^{21}$ and $R^{22}$ to $R^{25}$ has a hydroxyl group substituted with an acid labile group, m is an integer of 1 to 4, n is 0 or 1, b1, b2, b3 and b4 are numbers in the range: $0 \leq b1 < 1.0$, $0 \leq b2 < 1.0$, $0 \leq b3 < 1.0$, $0 \leq b4 < 1.0$, $0 \leq b1+b2+b3+b4 < 1.0$, and $0 < a2+b1+b2+b3+b4 < 1.0$.

3. The process of claim 1 wherein said polymer further comprises recurring units (c) derived from a monomer having an adhesive group selected from the group consisting of hydroxyl other than formulae (1) and (3), cyano, carbonyl, ester, ether, lactone ring, carboxyl, carboxylic anhydride, sulfonic acid ester, disulfone, and carbonate.

4. The process of claim 1 wherein said polymer further comprises recurring units (d1), (d2) or (d3) represented by the following general formula:

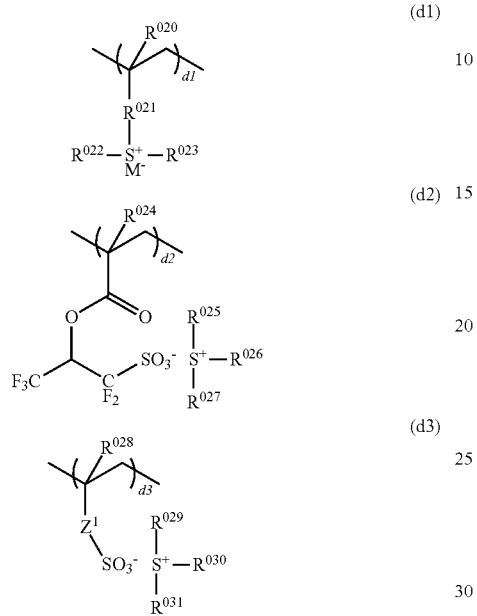

wherein $R^{020}$, $R^{024}$, and $R^{028}$ each are hydrogen or methyl; $R^{021}$ is a single bond, phenylene, —O—$R^{033}$—, or —C(=O)—Y—$R^{033}$—, wherein Y is oxygen or NH and $R^{033}$ is a straight, branched or cyclic $C_1$-$C_6$ alkylene group, alkenylene group or phenylene group, which may contain a carbonyl (—CO—), ester (—COO—), ether (—O—), or hydroxyl moiety; $R^{022}$, $R^{023}$, $R^{024}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group; $Z^1$ is a single bond, methylene, ethylene, phenylene, fluorinated phenylene, —O—$R^{032}$—, or —C(=O)—$Z^2$—$R^{032}$—, wherein $Z^2$ is oxygen or NH, and $R^{032}$ is a straight, branched or cyclic $C_1$-$C_6$ alkylene group, alkenylene group or phenylene group, which may contain a carbonyl, ester, ether or hydroxyl moiety; M is a non-nucleophilic counter ion; $0 \leq d1 \leq 0.3$, $0 \leq d2 \leq 0.3$, $0 \leq d3 \leq 0.3$, $0 < d1+d2+d3 \leq 0.3$.

5. The process of claim 1 wherein the developer comprises at least one organic solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

6. The process of claim 1 wherein the step of exposing the resist film to high-energy radiation includes KrF excimer laser lithography of 248 nm wavelength, ArF excimer laser lithography of 193 nm wavelength, EUV lithography of 13.5 nm wavelength or EB lithography.

7. The process of claim 1 comprising the steps of applying a resist composition comprising a polymer comprising recurring units of formula (1), an optional acid generator, and an organic solvent onto a substrate, prebaking the composition to form a resist film, forming a protective film thereon, exposing the resist film to high-energy radiation, baking, and developing the exposed film in an organic solvent-based developer to form a negative pattern wherein the unexposed region of resist film and the protective film are dissolved away and the exposed region of resist film is not dissolved.

8. A negative pattern-forming resist composition comprising a polymer, an optional acid generator, and an organic solvent,
said polymer comprising recurring units (a1) of the general formula (1):

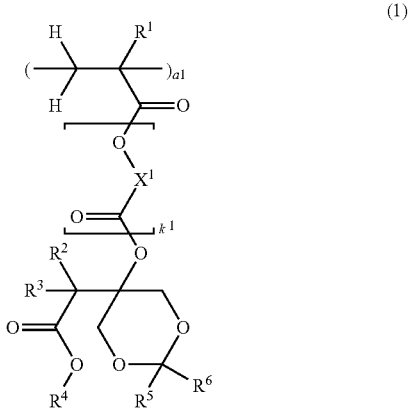

wherein $R^1$ is hydrogen or methyl, $R^2$ and $R^3$ are each independently hydrogen, fluorine or a straight, branched or cyclic monovalent hydrocarbon group of 1 to 8 carbon atoms, $R^4$ is hydrogen or a straight, branched or cyclic monovalent hydrocarbon group of 1 to 20 carbon atoms in which a constituent —$CH_2$— may be substituted by —O— or —C(=O)—, $R^5$ and $R^6$ are each independently hydrogen or a straight, branched or cyclic monovalent hydrocarbon group of 1 to 8 carbon atoms, $R^5$ and $R^6$ may bond together to form a non-aromatic ring of 3 to 17 carbon atoms with the carbon atom to which they are attached, $X^1$ is a straight, branched or cyclic divalent hydrocarbon group of 1 to 20 carbon atoms in which a constituent —$CH_2$— may be substituted by —O— or —C(=O)—, and $k^1$ is 0 or 1, and
said polymer being dissolvable in a developer selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

9. The resist composition of claim 8 wherein said polymer further comprises recurring units (a2) of the general formula (2) and recurring units of at least one type selected from recurring units (b1) to (b4) represented by the general formula (3):

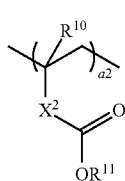

(2)

wherein $R^{10}$ is hydrogen or methyl, $R^{11}$ is an acid labile group, $X^3$ is a single bond, phenylene, naphthylene, or —C(=O)—O—$R^{12}$—, $R^{12}$ is a straight, branched or cyclic $C_1$-$C_{10}$ alkylene group which may have an ether moiety, ester moiety, lactone ring or hydroxyl moiety, or phenylene or naphthylene group, and $0 \le a2 < 1.0$,

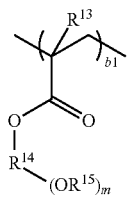 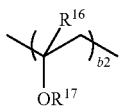 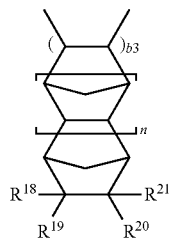

(3)

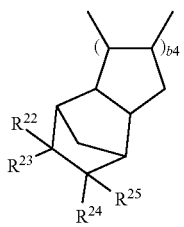

wherein $R^{13}$ and $R^{16}$ each are hydrogen or methyl, $R^{14}$ is a straight, branched or cyclic, di- to pentavalent aliphatic hydrocarbon group of 1 to 16 carbon atoms which may have an ether or ester moiety, $R^{15}$ and $R^{17}$ each are an acid labile group, $R^{18}$ to $R^{21}$ and $R^{22}$ to $R^{25}$ are each independently hydrogen, cyano, a straight, branched or cyclic $C_1$-$C_6$ alkyl group, alkoxycarbonyl, or a group having an ether moiety or lactone ring, at least one of $R^{18}$ to $R^{21}$ and $R^{22}$ to $R^{25}$ has a hydroxyl group substituted with an acid labile group, m is an integer of 1 to 4, n is 0 or 1, b1, b2, b3 and b4 are numbers in the range: $0 \le b1 < 1.0$, $0 \le b2 < 1.0$, $0 \le b3 < 1.0$, $0 \le b4 < 1.0$, $0 \le b1+b2+b3+b4 < 1.0$, and $0 < a2+b1+b2+b3+b4 < 1.0$.

10. The resist composition of claim 8 wherein said polymer further comprises recurring units (c) derived from a monomer having an adhesive group selected from the group consisting of hydroxyl other than formulae (1) and (3), cyano, carbonyl, ester, ether, lactone ring, carboxyl, carboxylic anhydride, sulfonic acid ester, disulfone, and carbonate.

11. The resist composition of claim 8 wherein said polymer further comprises recurring units (d1), (d2) or (d3) represented by the following general formula:

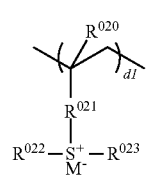

(d1)

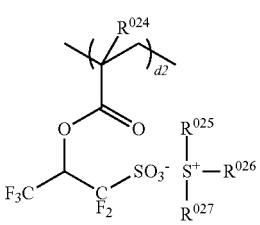

(d2)

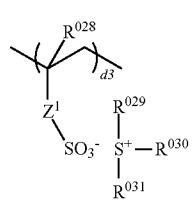

(d3)

wherein $R^{020}$, $R^{024}$, and $R^{028}$ each are hydrogen or methyl; $R^{021}$ is a single bond, phenylene, —O—$R^{033}$—, or —C(=O)—Y—$R^{033}$—, wherein Y is oxygen or NH and $R^{033}$ is a straight, branched or cyclic $C_1$-$C_6$ alkylene group, alkenylene group or phenylene group, which may contain a carbonyl (—CO—), ester (—COO—), ether (—O—), or hydroxyl moiety; $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group; $Z^1$ is a single bond, methylene, ethylene, phenylene, fluorinated phenylene, —O—$R^{032}$—, or —C(=O)—$Z^2$—$R^{032}$—, wherein $Z^2$ is oxygen or NH, and $R^{032}$ is a straight, branched or cyclic $C_1$-$C_6$ alkylene group, alkenylene group or phenylene group, which may contain a carbonyl, ester, ether or hydroxyl moiety; M is a non-nucleophilic counter ion; $0 \le d1 \le 0.3$, $0 \le d2 \le 0.3$, $0 \le d3 \le 0.3$, $0 < d1+d2+d3 \le 0.3$.

12. A polymer comprising recurring units (a1) of the general formula (1) and having a weight average molecular weight of 1,000 to 100,000,

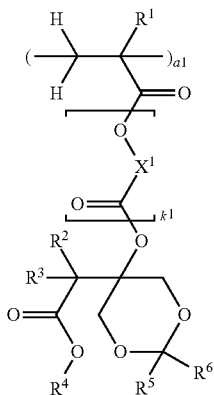

(1)

wherein $R^1$ is hydrogen or methyl, $R^2$ and $R^3$ are each independently hydrogen, fluorine or a straight, branched or cyclic monovalent hydrocarbon group of 1 to 8 carbon atoms, $R^4$ is hydrogen or a straight, branched or cyclic monovalent hydrocarbon group of 1 to 20 carbon atoms in which a constituent —$CH_2$— may be substituted by —O— or —C(=O)—, $R^5$ and $R^6$ are each independently hydrogen or a straight, branched or cyclic monovalent hydrocarbon group of 1 to 8 carbon atoms, $R^5$ and $R^6$ may bond together to form a non-aromatic ring of 3 to 17 carbon atoms with the carbon atom to which they are attached, $X^1$ is a straight, branched or cyclic divalent hydrocarbon group of 1 to 20 carbon atoms in which a constituent —$CH_2$— may be substituted by —O— or —C(=O)—, and $k^1$ is 0 or 1.

13. A monomer having the general formula (1a):

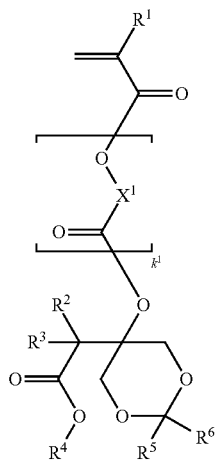

(1a)

wherein $R^1$ is hydrogen or methyl, $R^2$ and $R^3$ are each independently hydrogen, fluorine or a straight, branched or cyclic monovalent hydrocarbon group of 1 to 8 carbon atoms, $R^4$ is hydrogen or a straight, branched or cyclic monovalent hydrocarbon group of 1 to 20 carbon atoms in which a constituent —$CH_2$— may be substituted by —O— or —C(=O)—, $R^5$ and $R^6$ are each independently hydrogen or a straight, branched or cyclic monovalent hydrocarbon group of 1 to 8 carbon atoms, $R^5$ and $R^6$ may bond together to form a non-aromatic ring of 3 to 17 carbon atoms with the carbon atom to which they are attached, $X^1$ is a straight, branched or cyclic divalent hydrocarbon group of 1 to 20 carbon atoms in which a constituent —$CH_2$— may be substituted by —O— or —C(=O)—, and $k^1$ is 0 or 1.

* * * * *